United States Patent [19]

Rauskolb

[11] Patent Number: 4,746,995

[45] Date of Patent: May 24, 1988

[54] DISK CERTIFIER

[76] Inventor: Ruediger F. Rauskolb, 3766 Cass Way, Palo Alto, Calif. 94306

[21] Appl. No.: 853,194

[22] Filed: Apr. 17, 1986

[51] Int. Cl.[4] ...................... G11B 27/36; G01R 33/12

[52] U.S. Cl. ....................................... 360/31; 324/212

[58] Field of Search .................... 360/31, 53; 324/210, 324/212

[56] References Cited

U.S. PATENT DOCUMENTS 3,686,682 8/1972 Behr et al. ............................ 360/53

*Primary Examiner*—Vincent P. Canney
*Attorney, Agent, or Firm*—Joseph H. Smith

[57] ABSTRACT

A completely automated apparatus for disk certification which has a very high volume production per unit area of square footage required. Volumes of 108 million disks per year require only 1200 square feet of facility, about 3% of the space required for the prior art certification systems. The apparatus uses standard unmodified disk drives and is completely integrated with a conveyor and pickup system for automatic loading and unloading of diskettes. A method of sequencing operations on a disk is disclosed whereby all tracks of disk are written to provide a first test signal. Then all tracks are read after all tracks are written to provide a first read signal. Calculations are performed on the first read signal to obtain a calculated signal and the calculated signal is compared with a known standard. By writing an entire disk before reading the entire disk, rather than writing and reading on a track by track basis, operations on several disk drives can be sequenced to be performed simultaneously while using the same measurement electronics as would be required for one drive.

4 Claims, 64 Drawing Sheets

START-UP SEQUENCE OF A FIVE-DRIVE TEST SYSTEM

CENTRAL MODULE 200

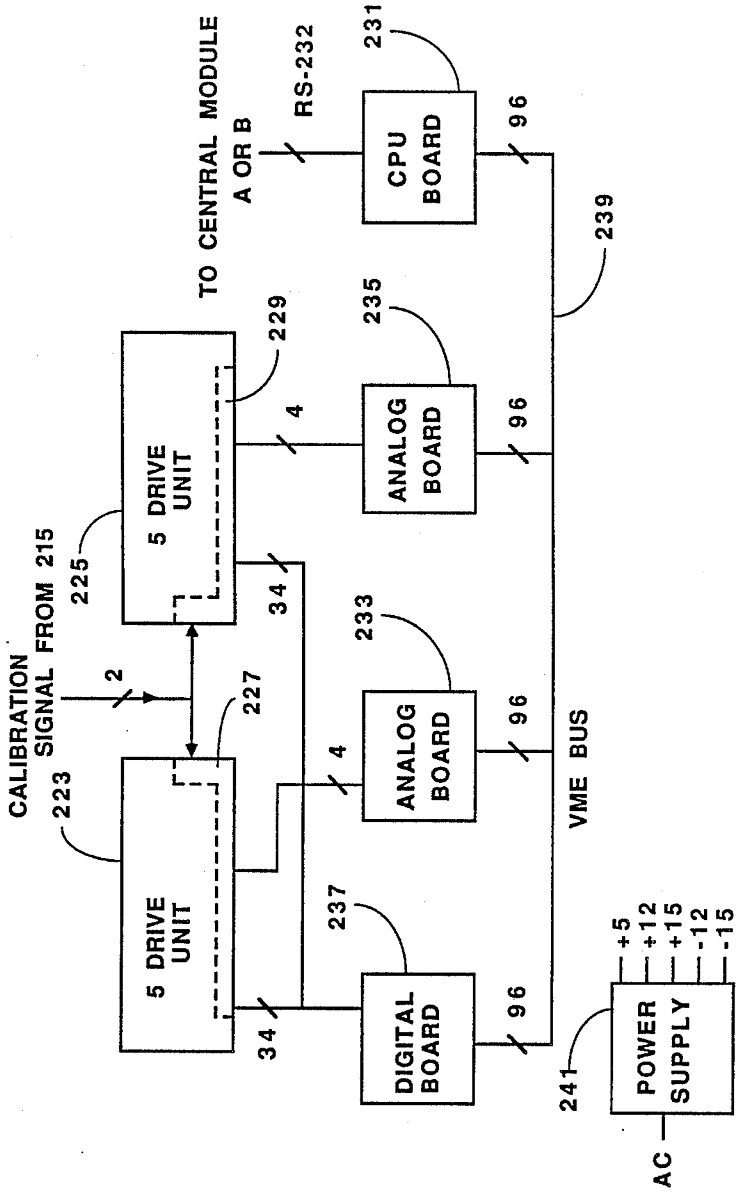
Fig. 11 (10 - Drive Module)

Fig. 12A MOTION CONTROL MODULE 201
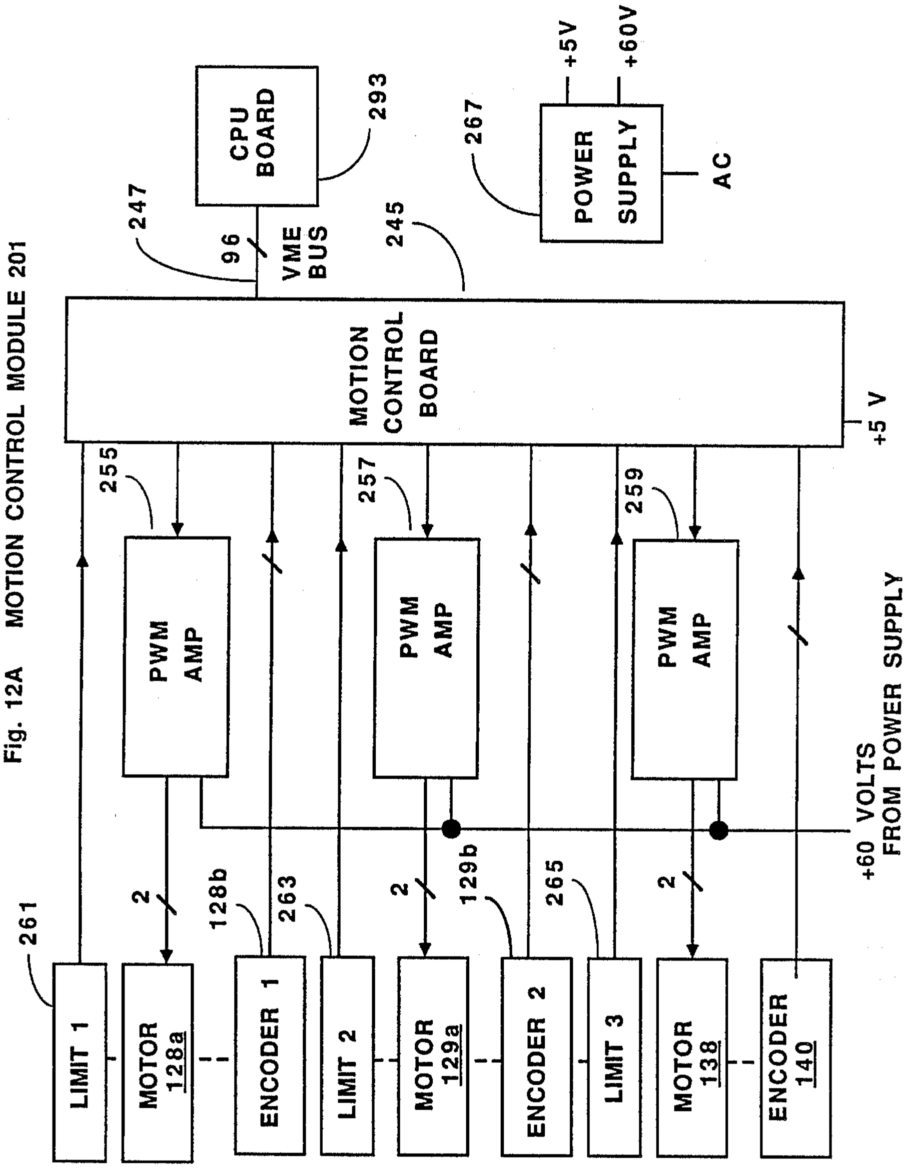

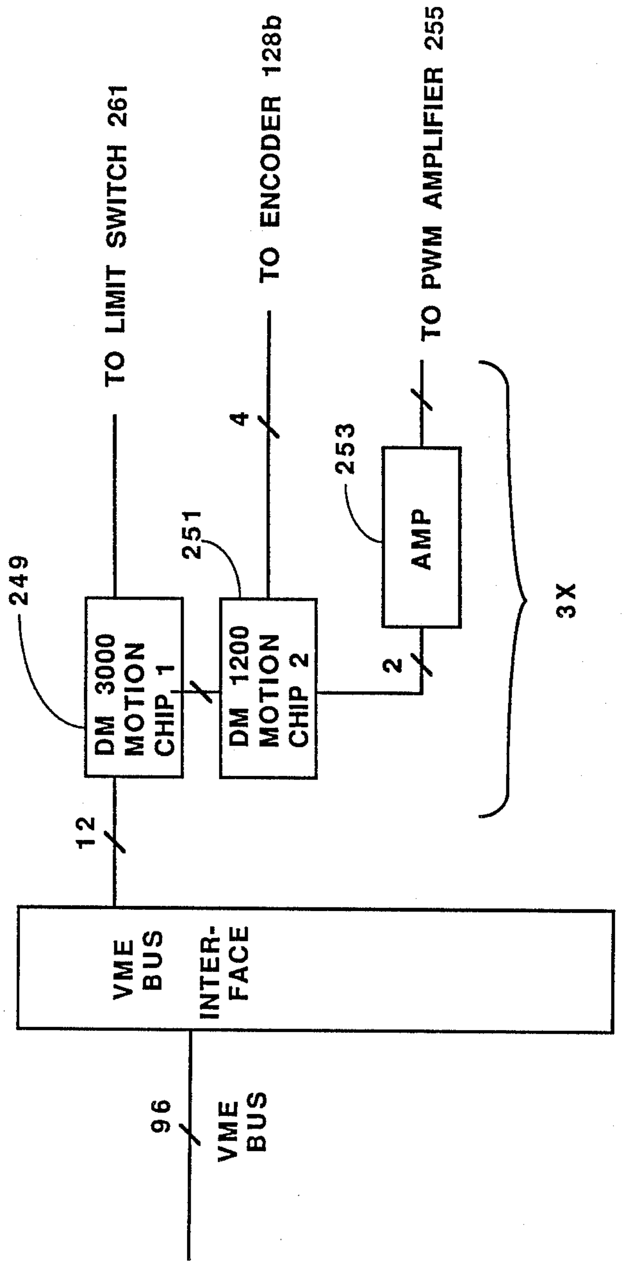
Fig. 12B MOTION CONTROL BOARD

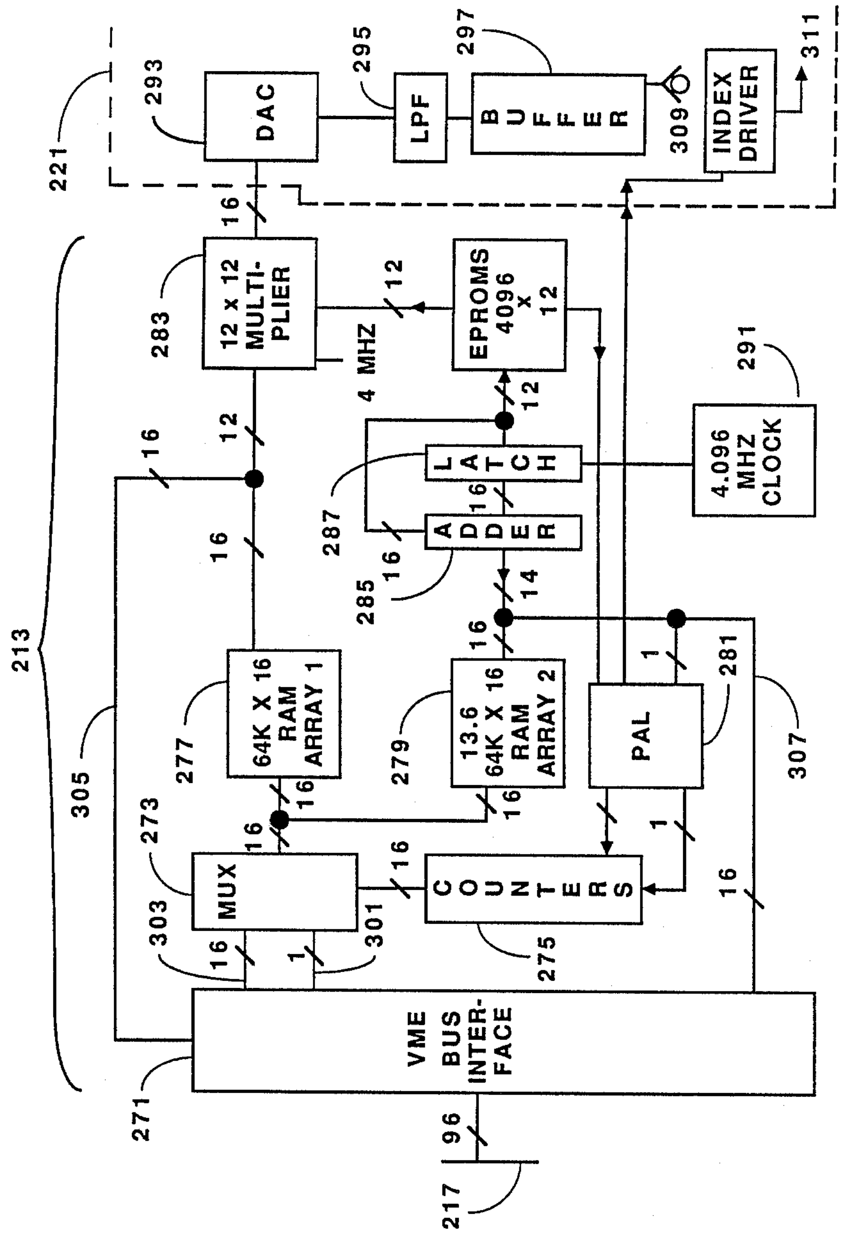
Fig. 13.0

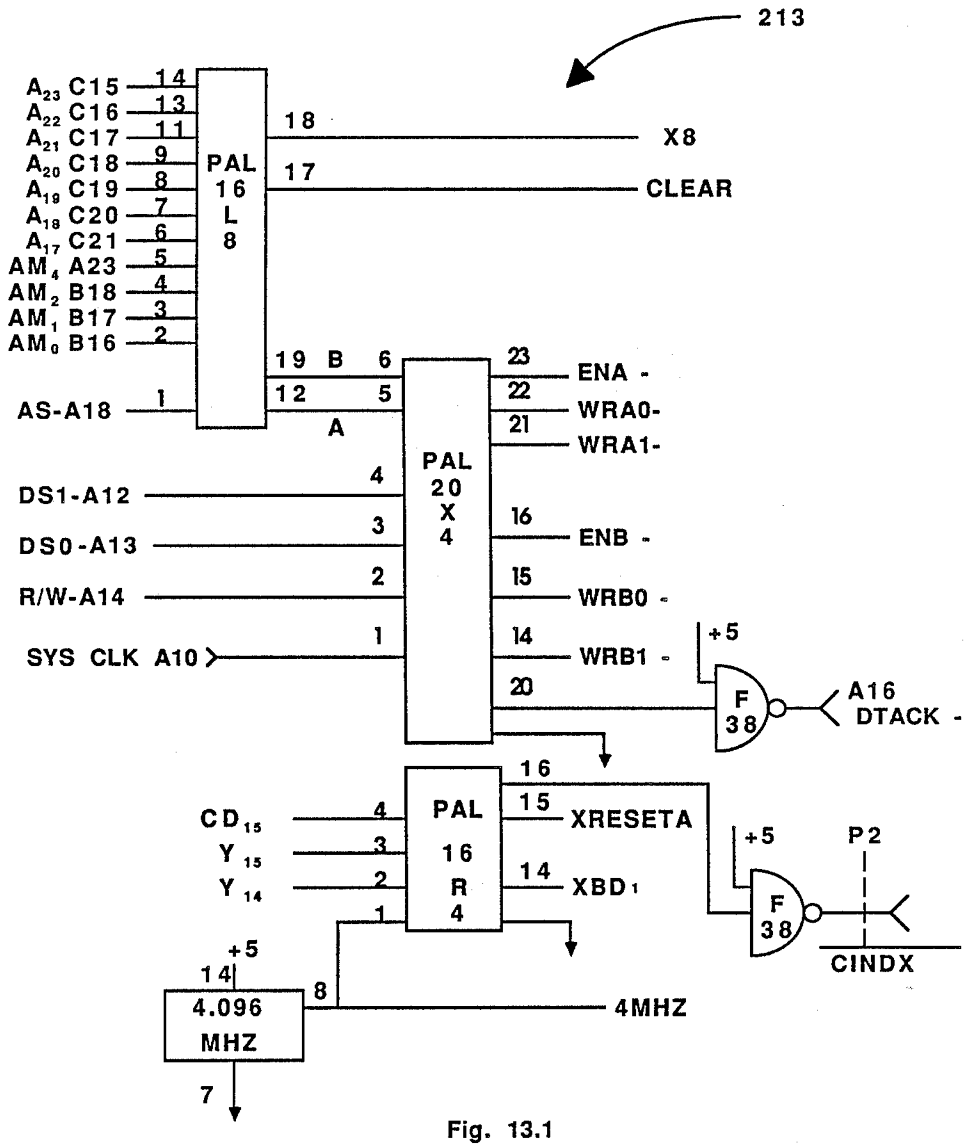
Fig. 13.1

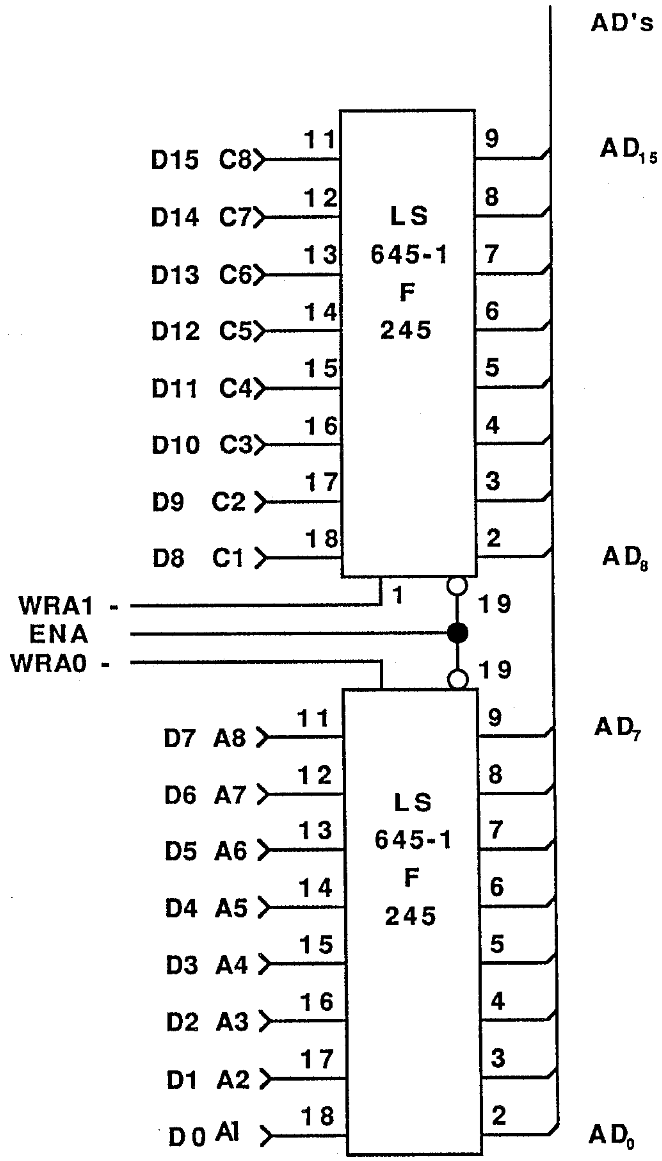
Fig. 13.2

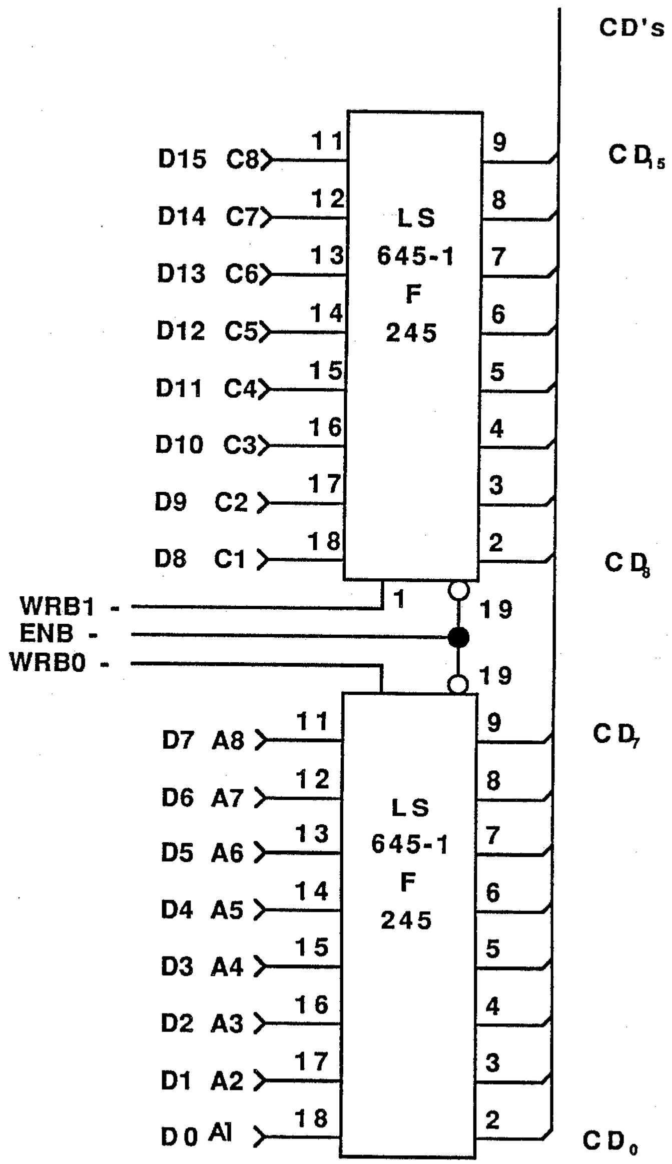
Fig. 13.3

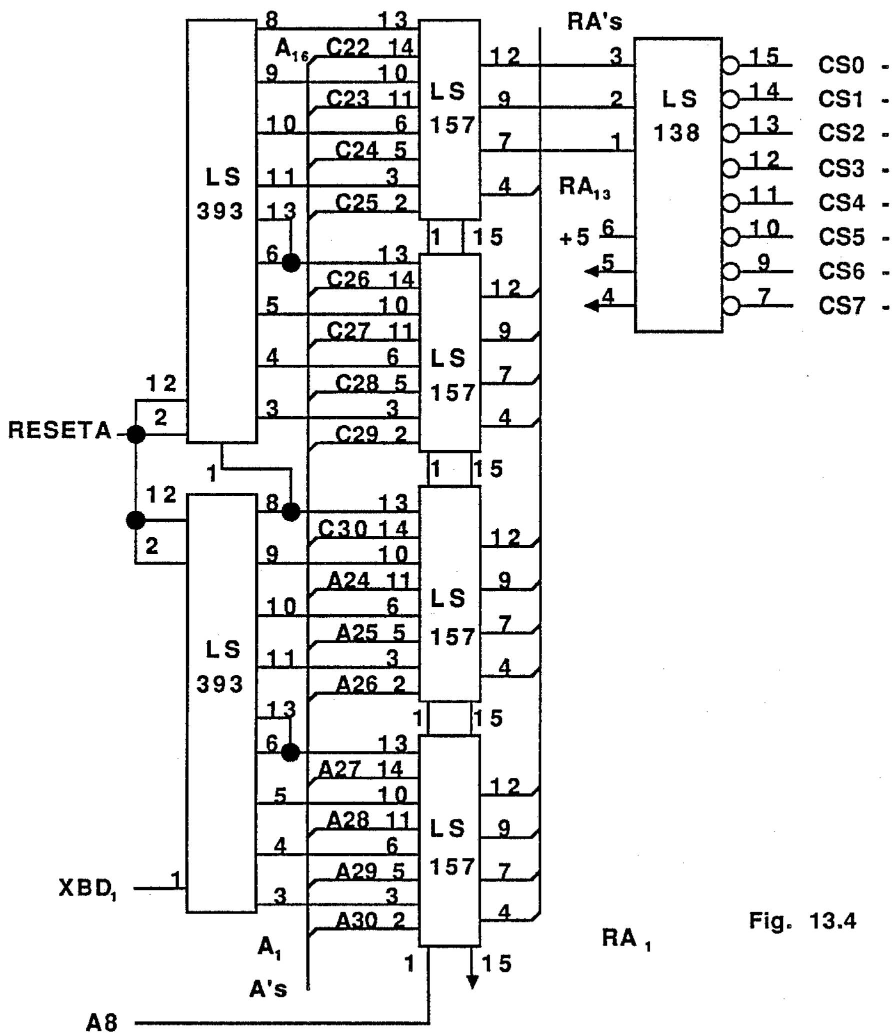
Fig. 13.4

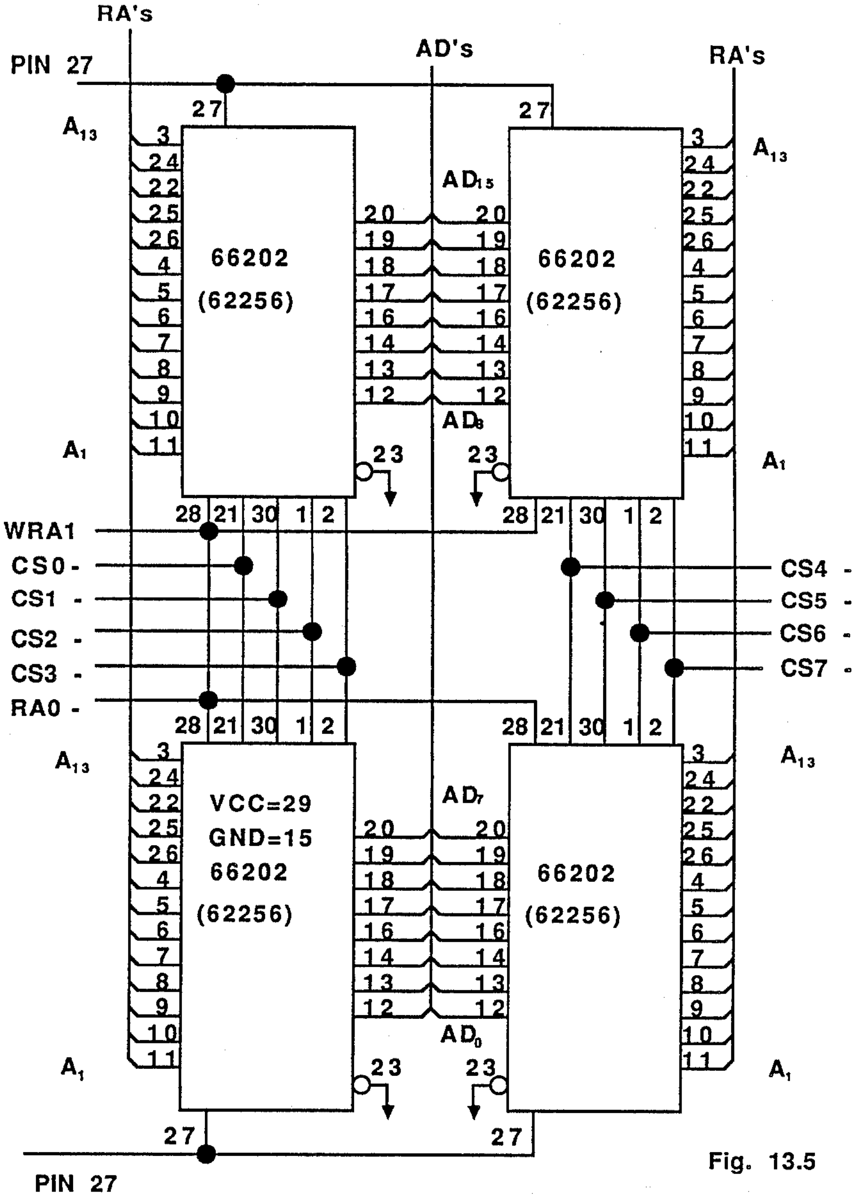
Fig. 13.5

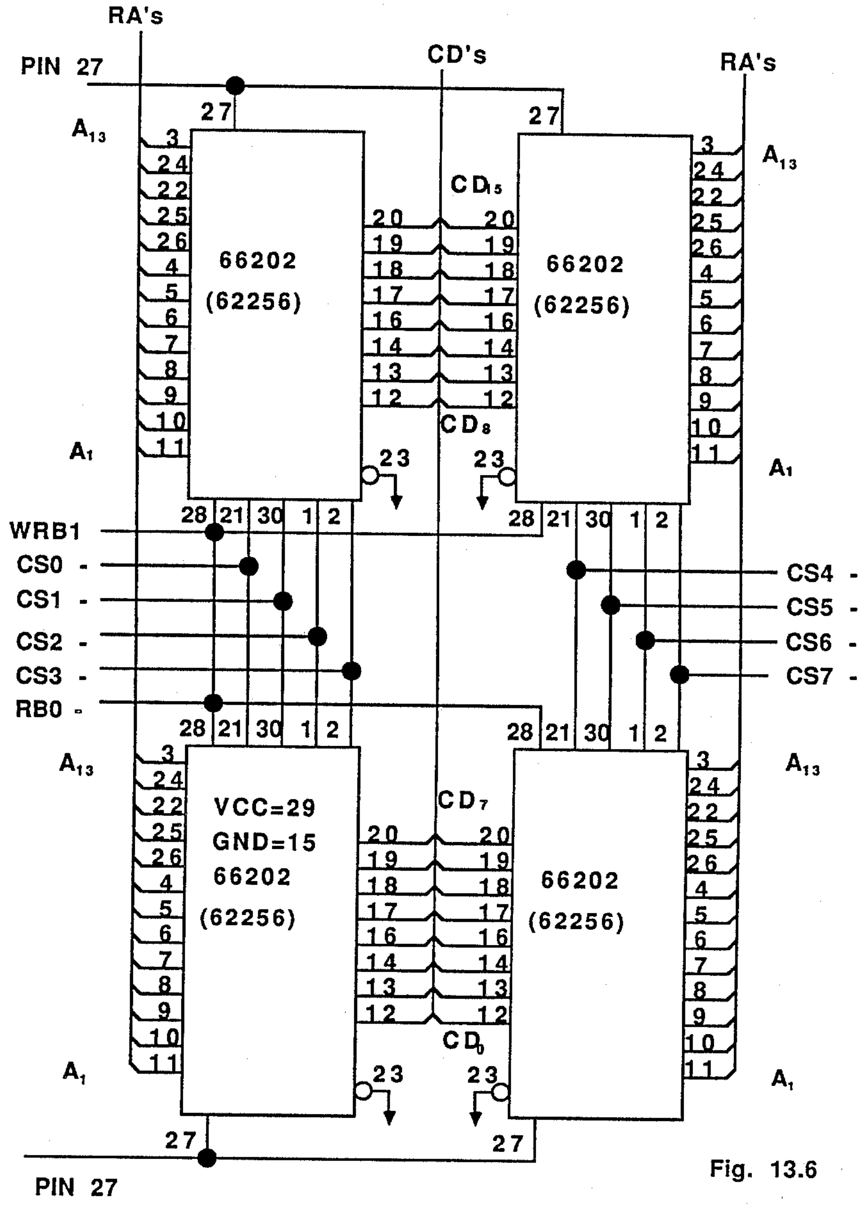
Fig. 13.6

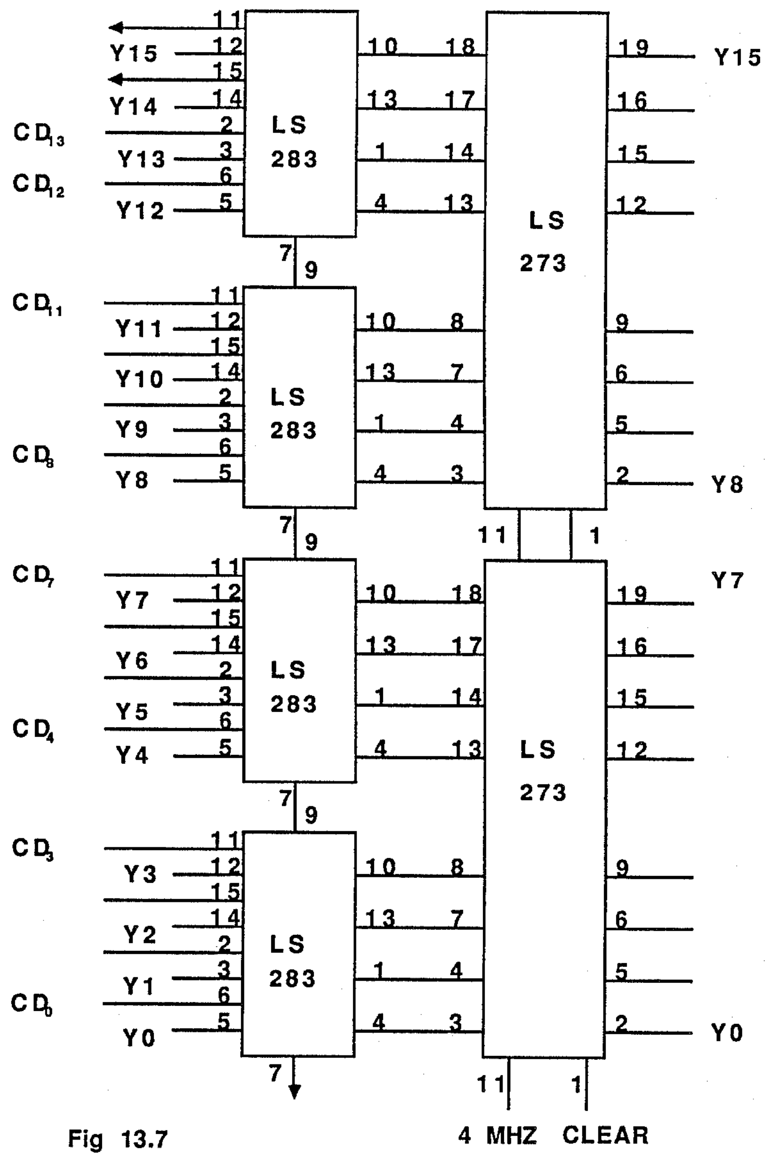
Fig 13.7

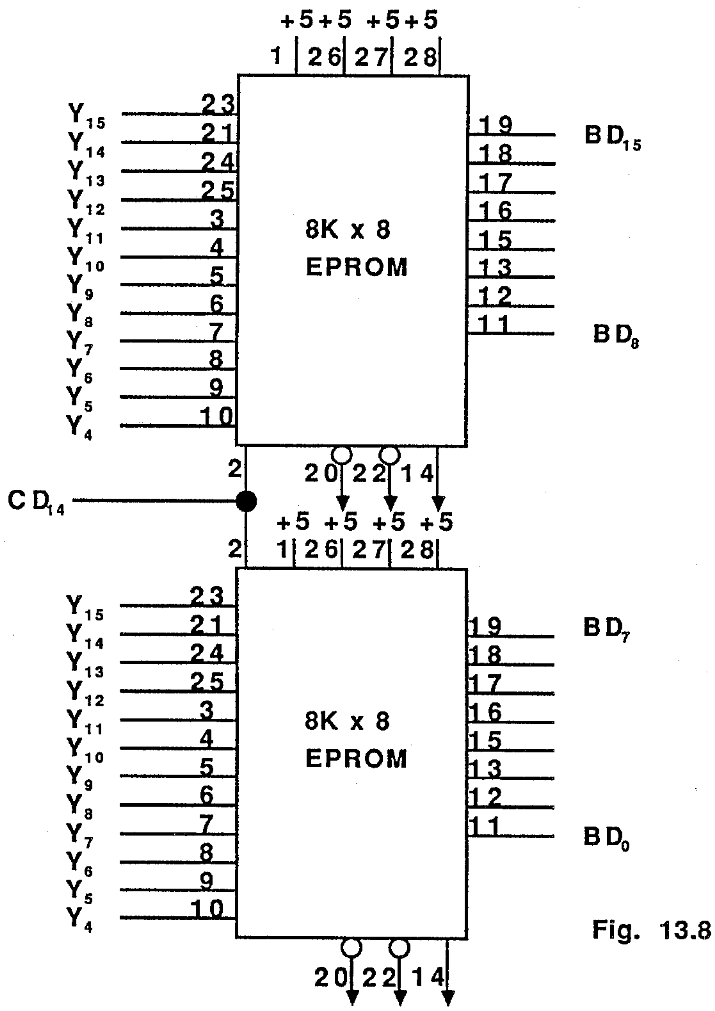
Fig. 13.8

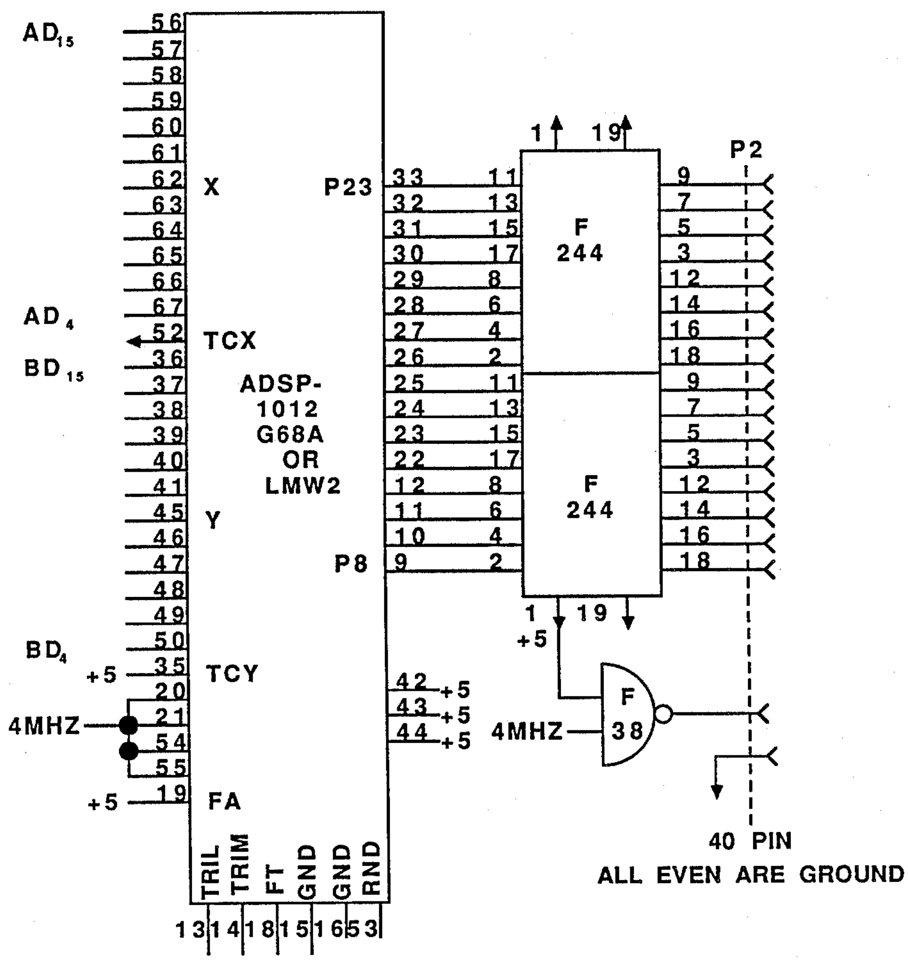
Fig 13.9

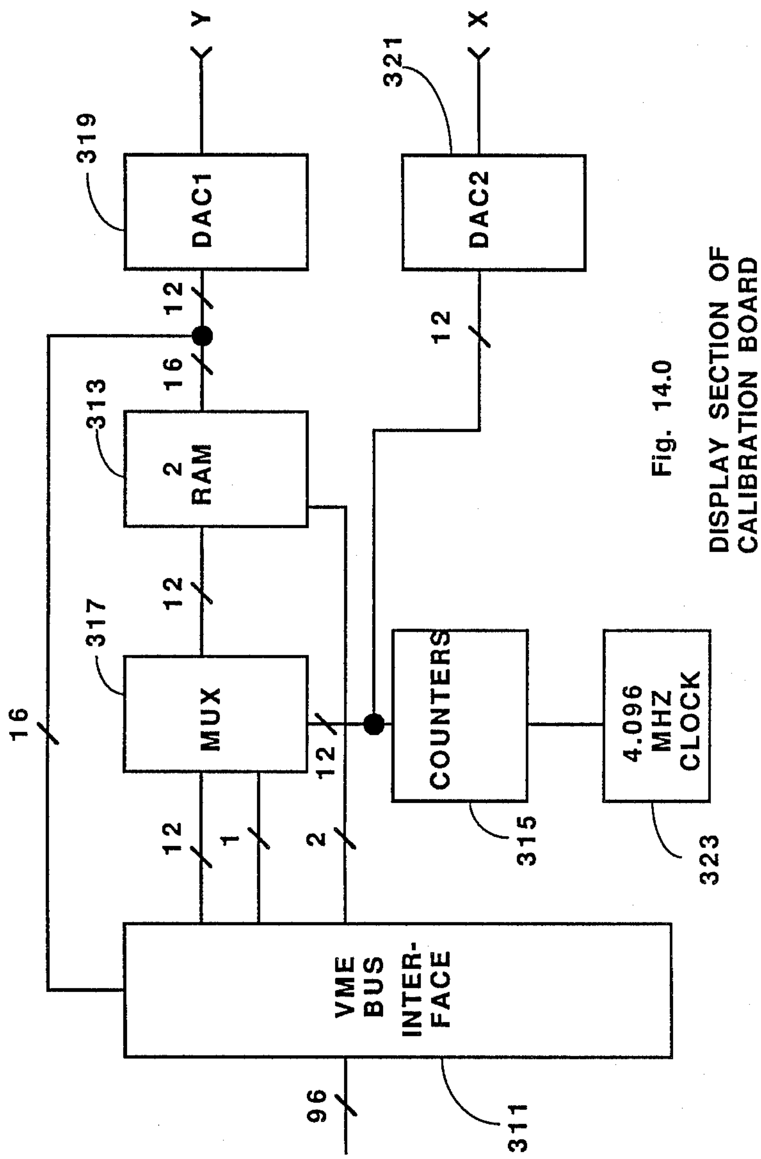
Fig. 14.0
DISPLAY SECTION OF
CALIBRATION BOARD

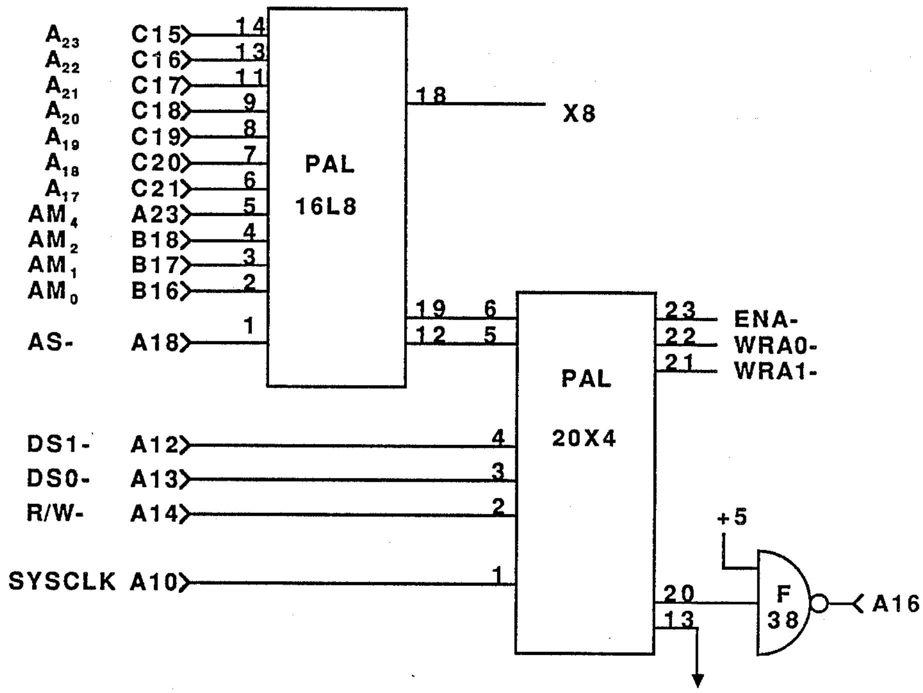
CALIBRATION BOARD 215
Fig. 14.1

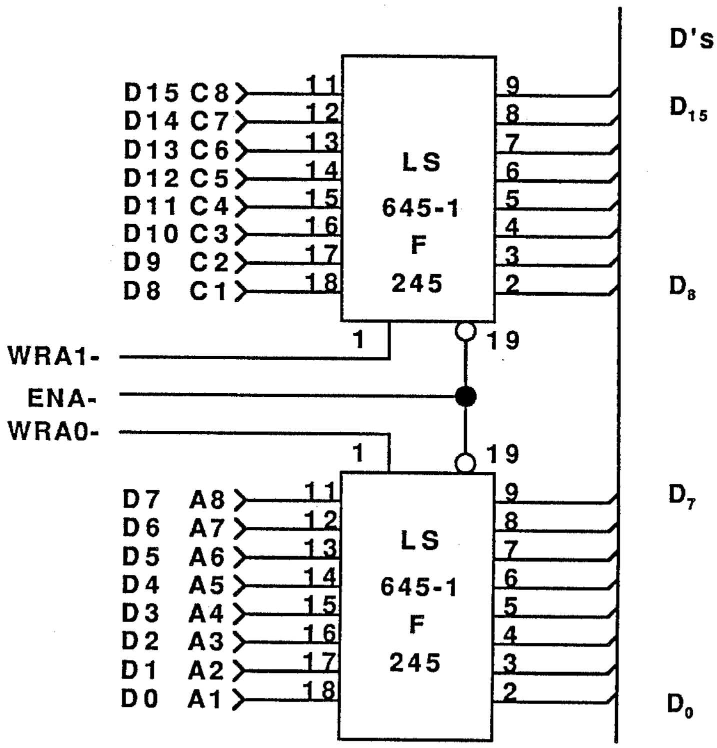
Fig. 14.2

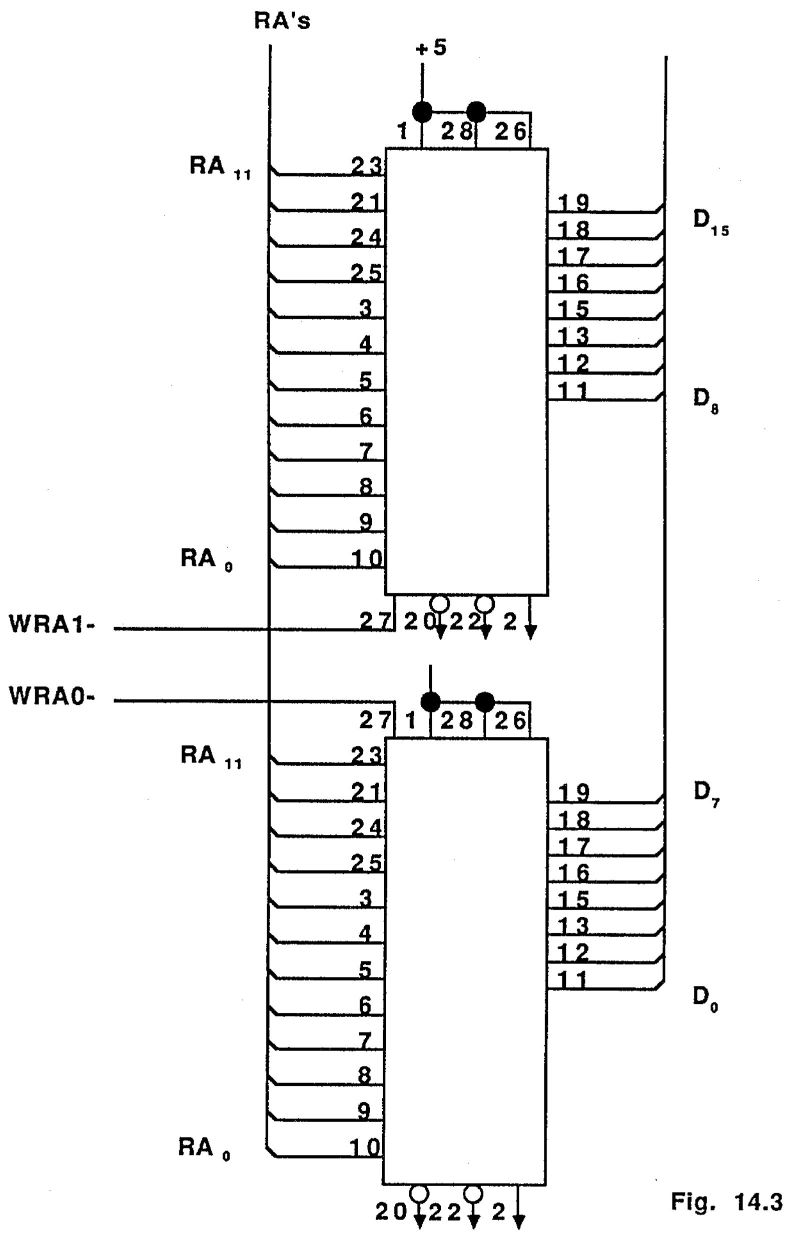
Fig. 14.3

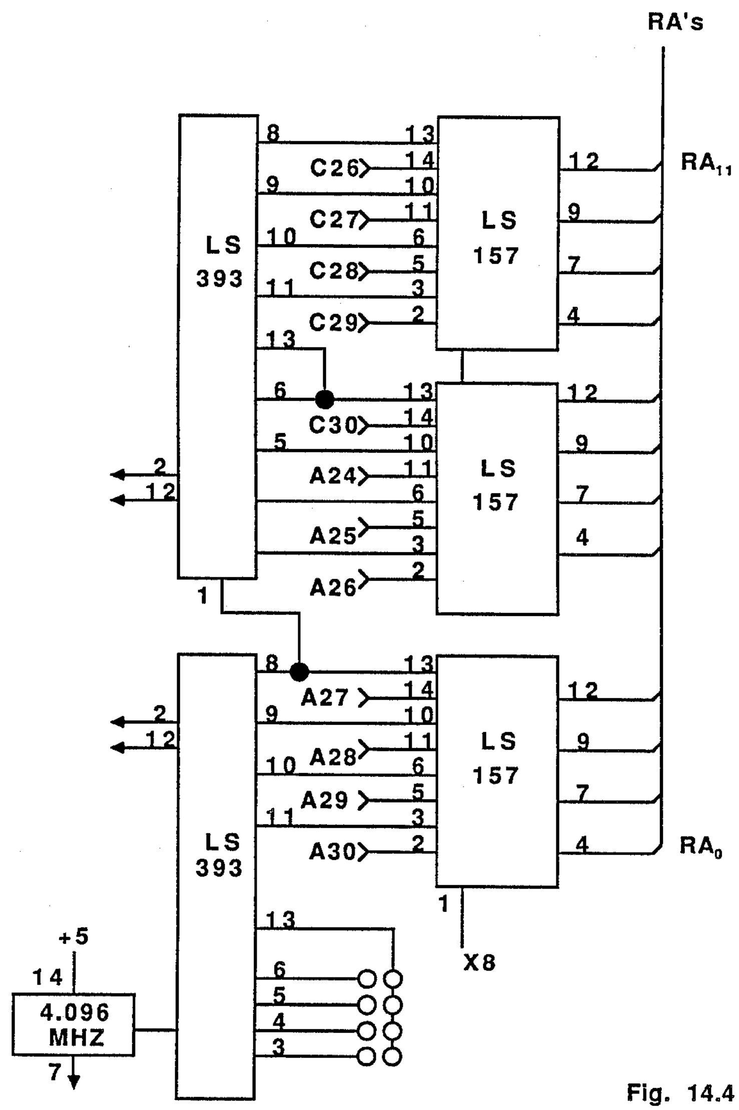
Fig. 14.4

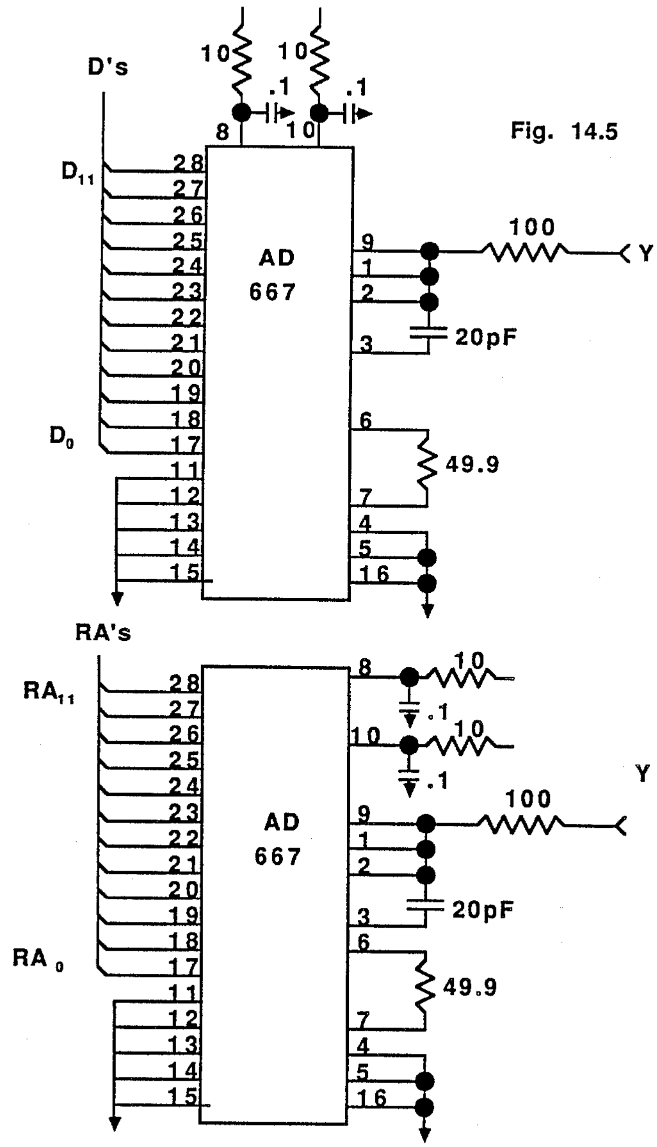
Fig. 14.5

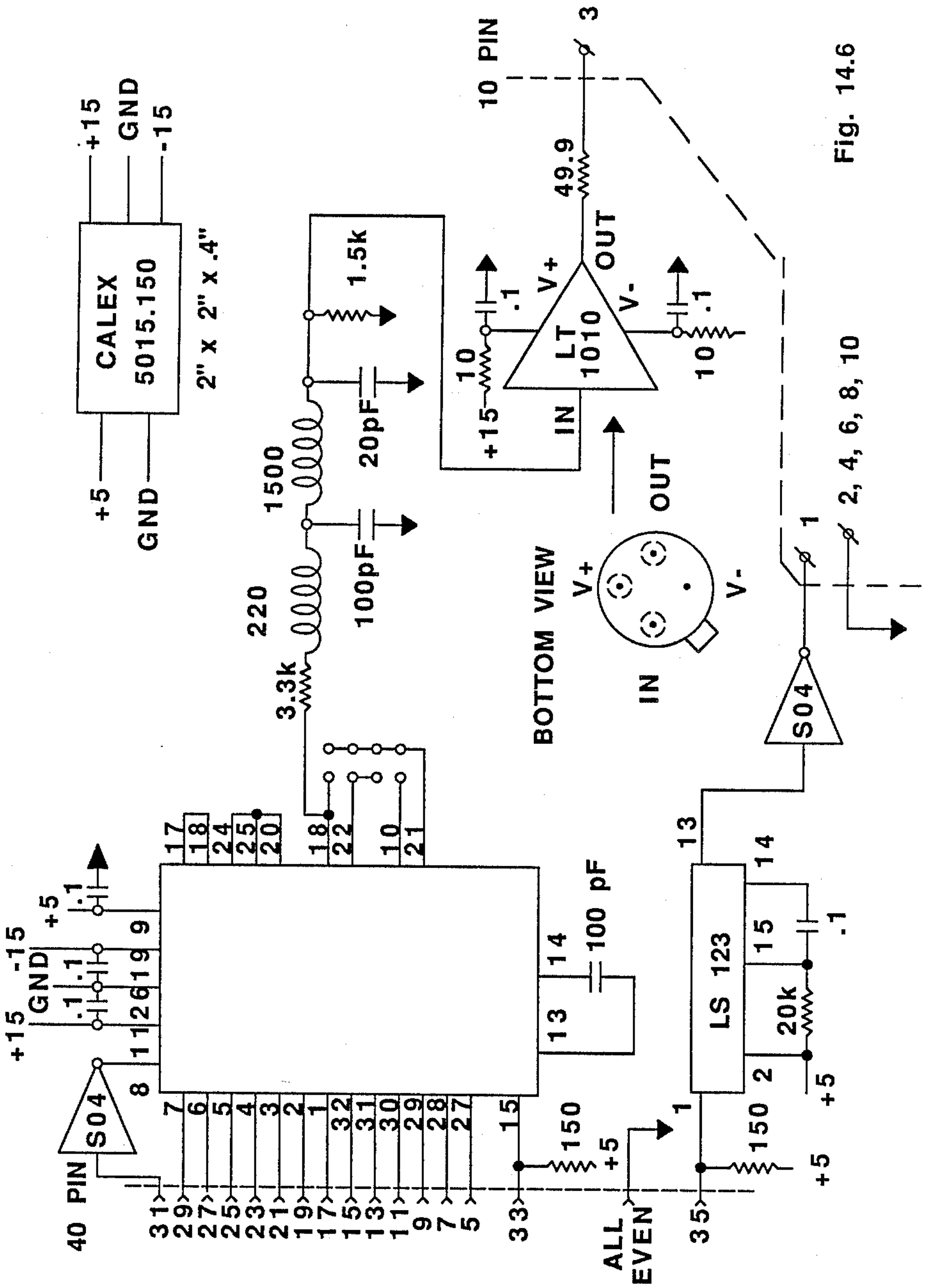
Fig. 14.6

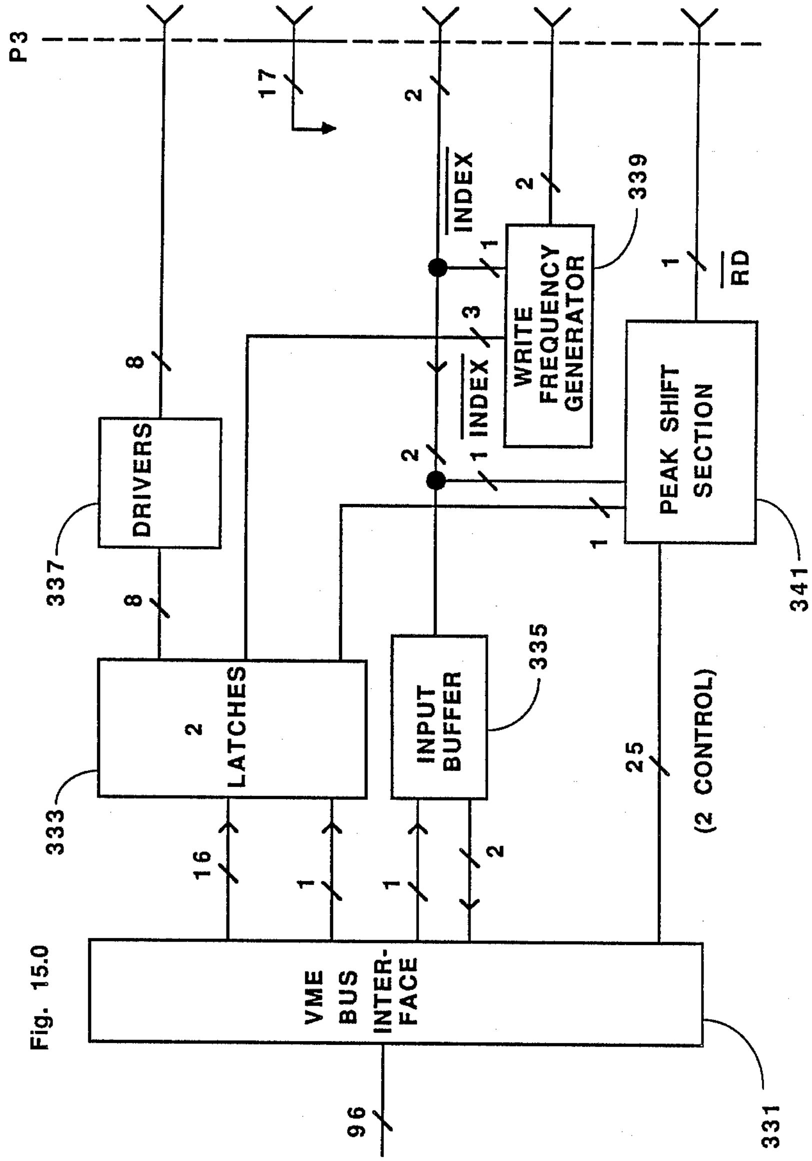
Fig. 15.0

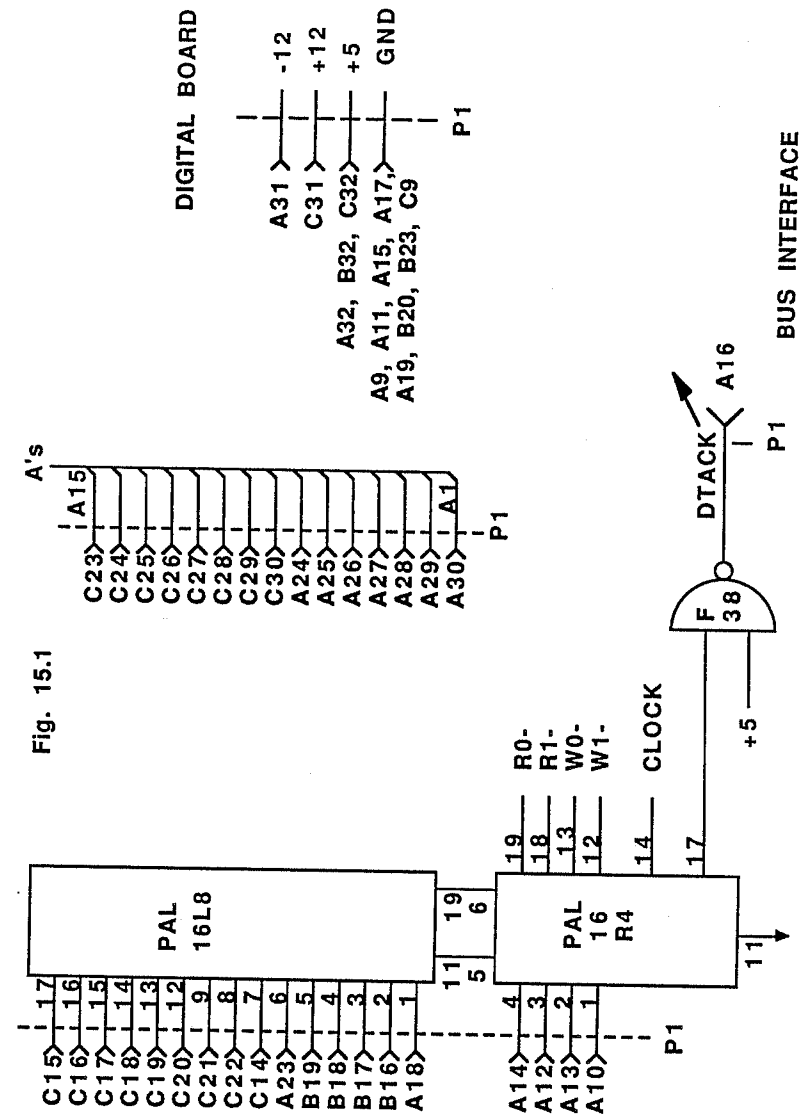
Fig. 15.1

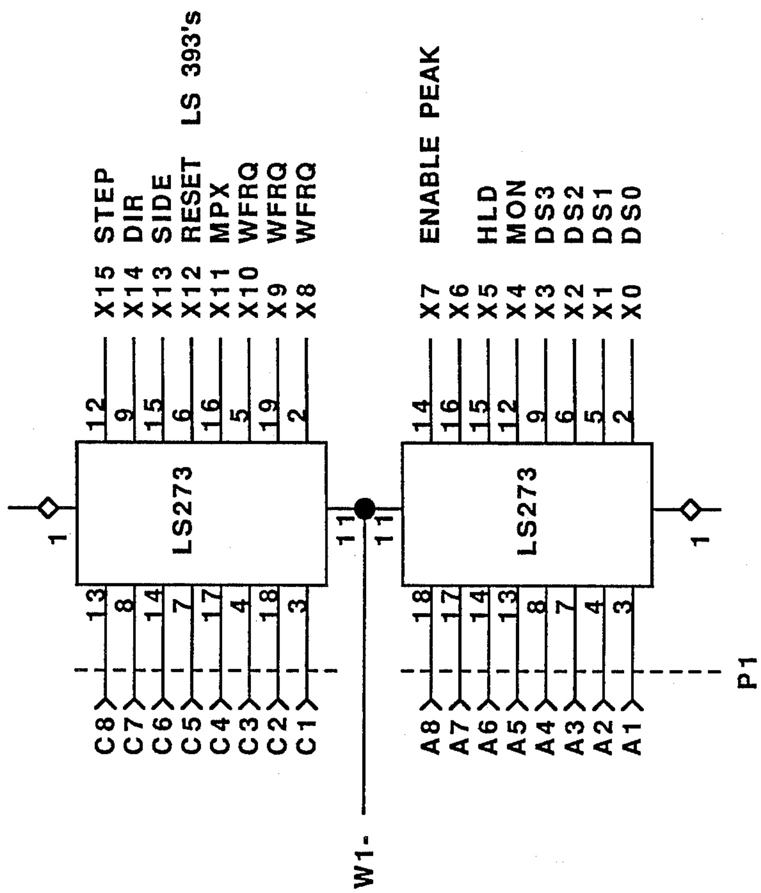
Fig. 15.2 CONTROL SECTION

Fig. 15.3
WRITE FREQUENCY SECTION
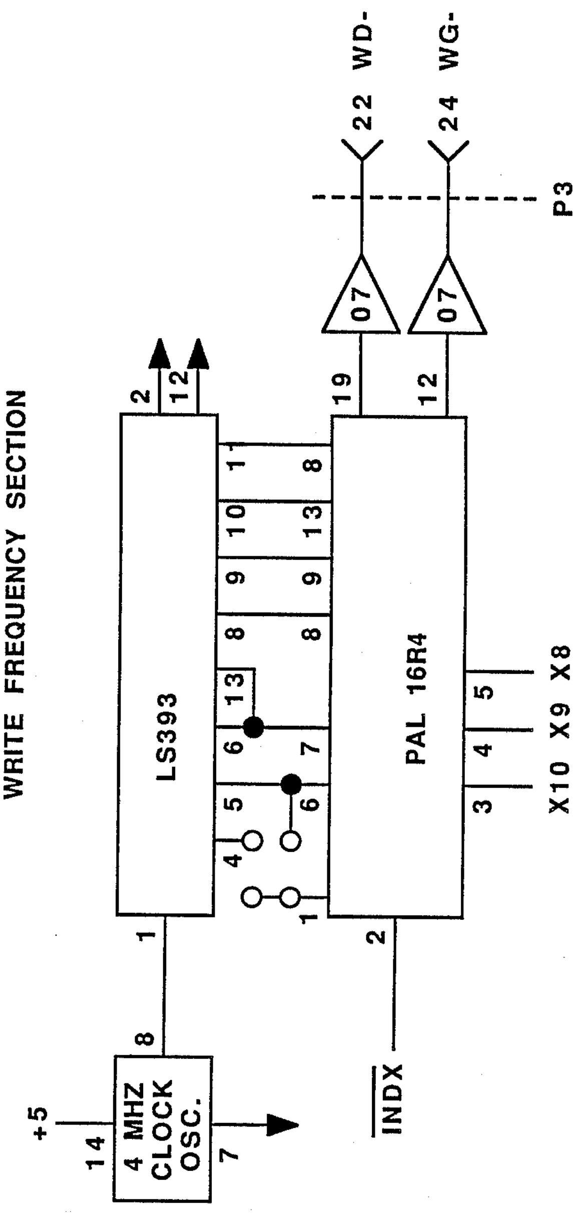

Fig. 15.4
PEAK SHIFT SECTION
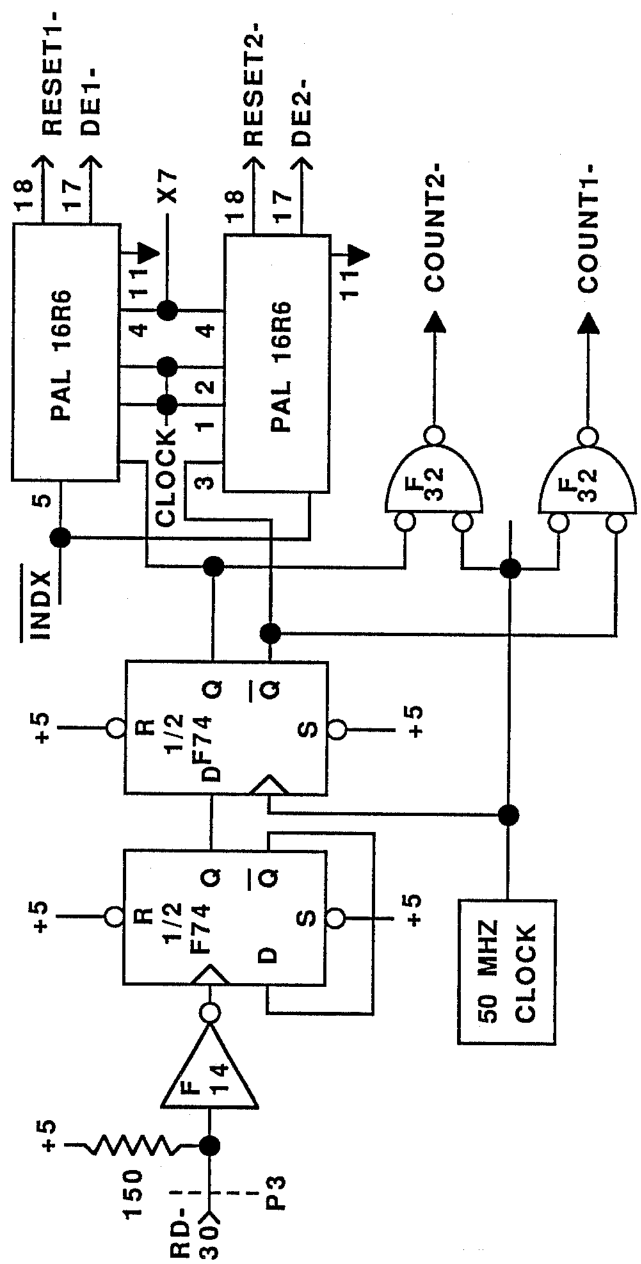

Fig. 15.5 COUNTER SECTION
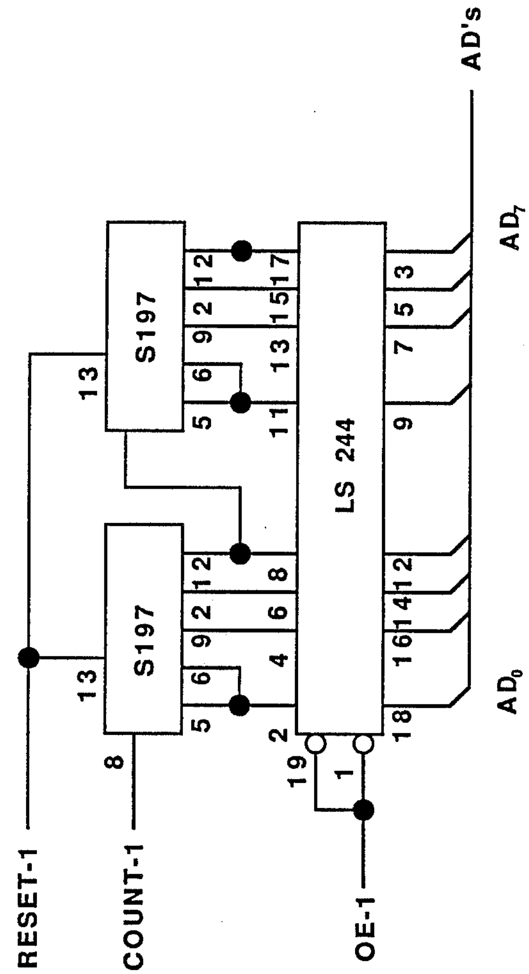

Fig. 15.6 COUNTER SECTION
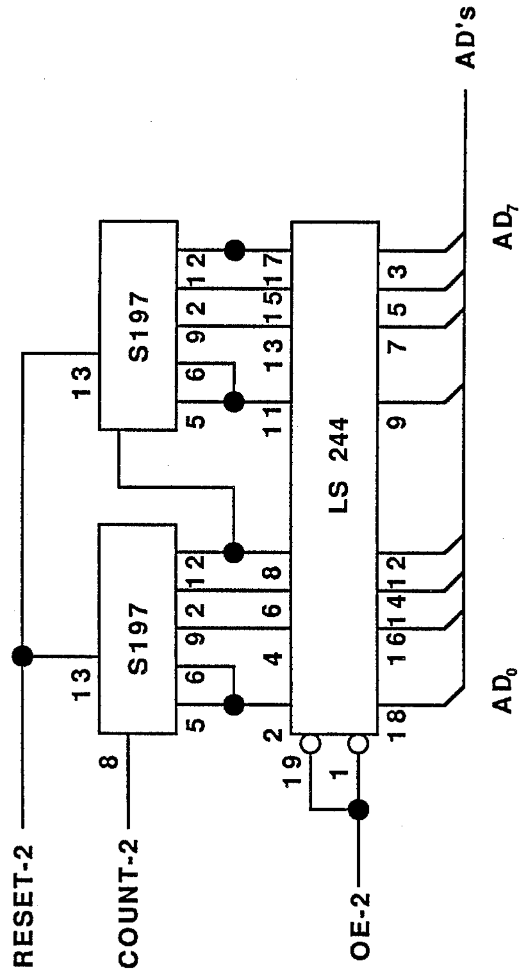

Fig. 15.7
DATA BUFFER SECTION
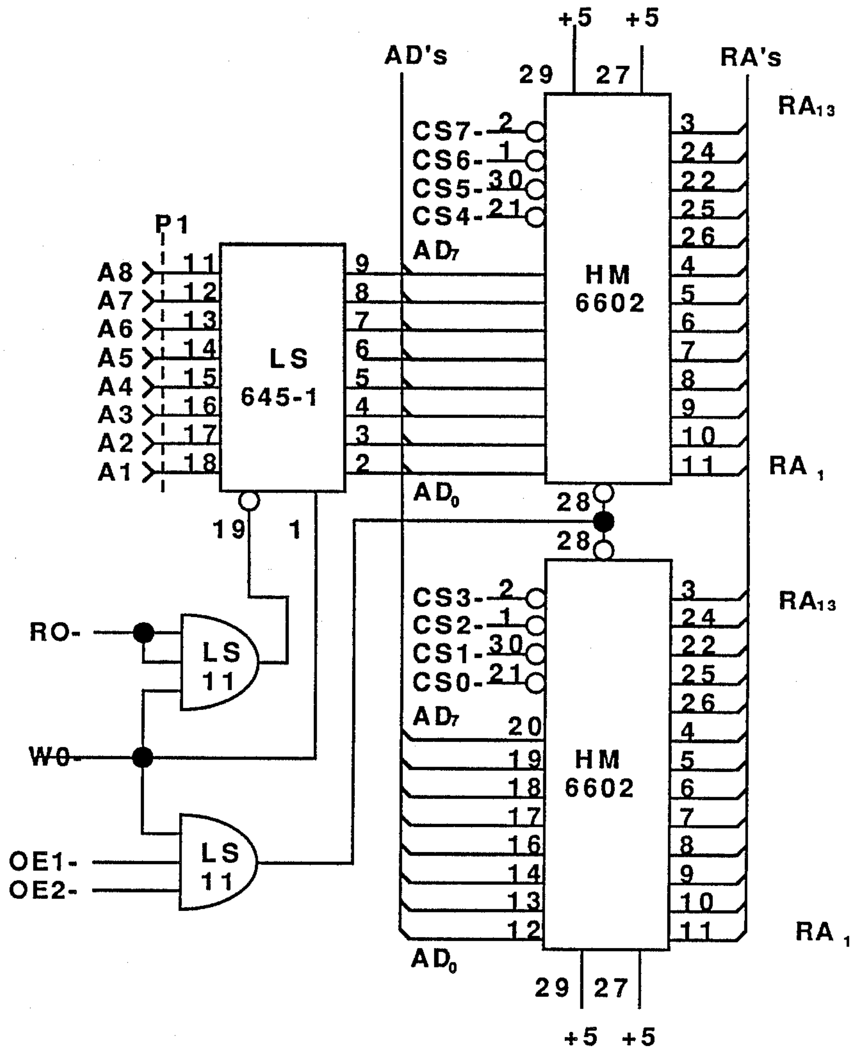

Fig. 15.8
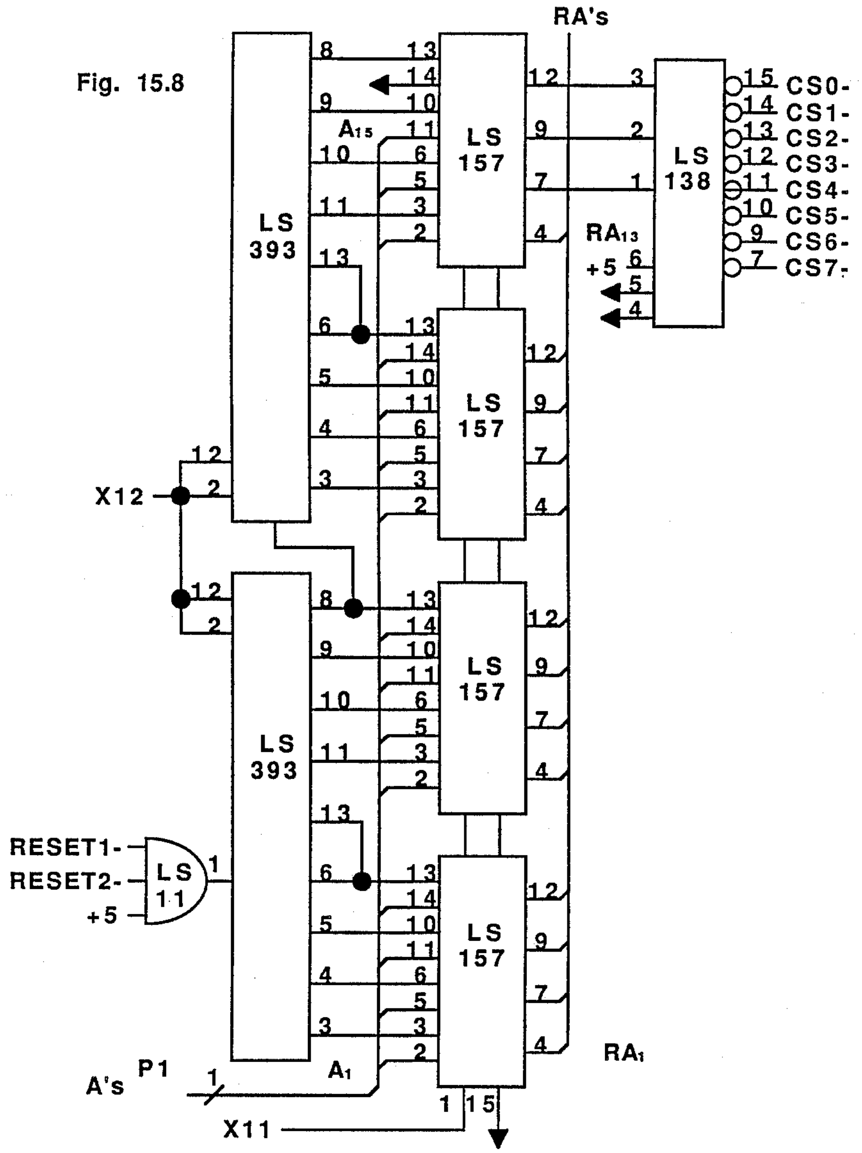

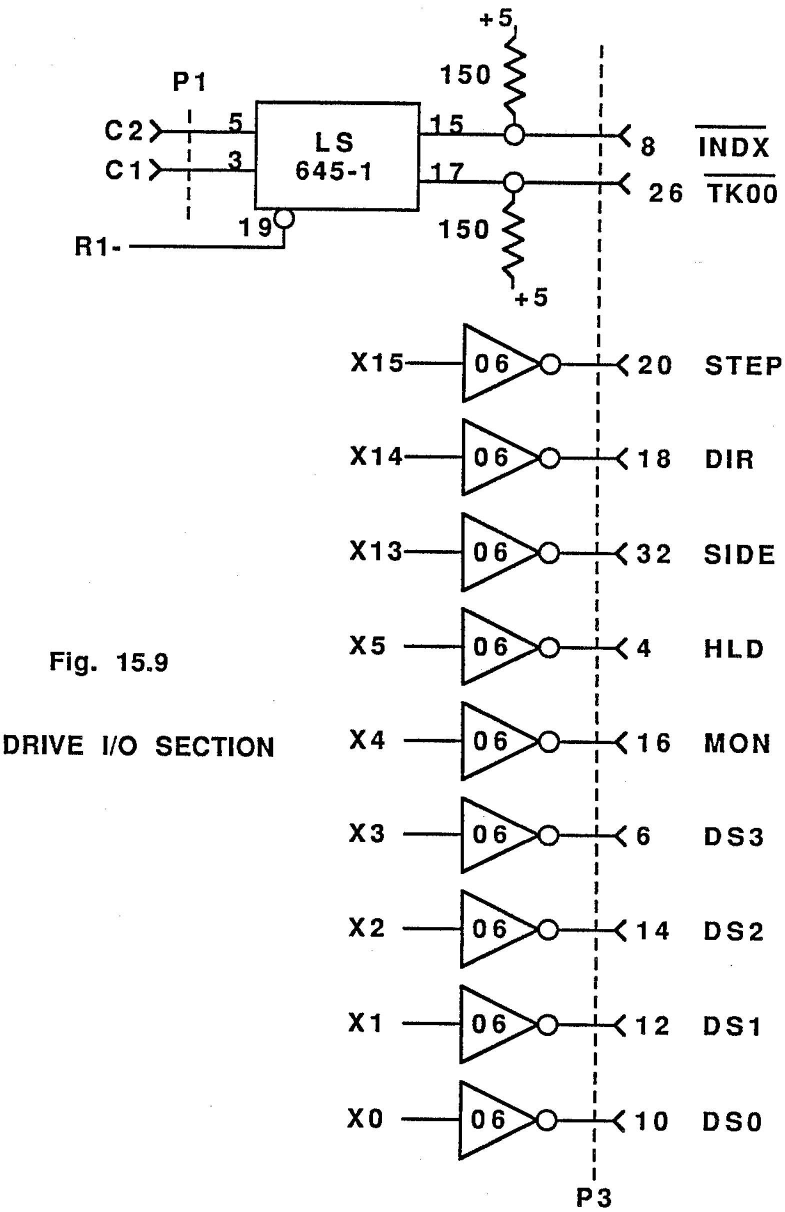
Fig. 15.9
DRIVE I/O SECTION

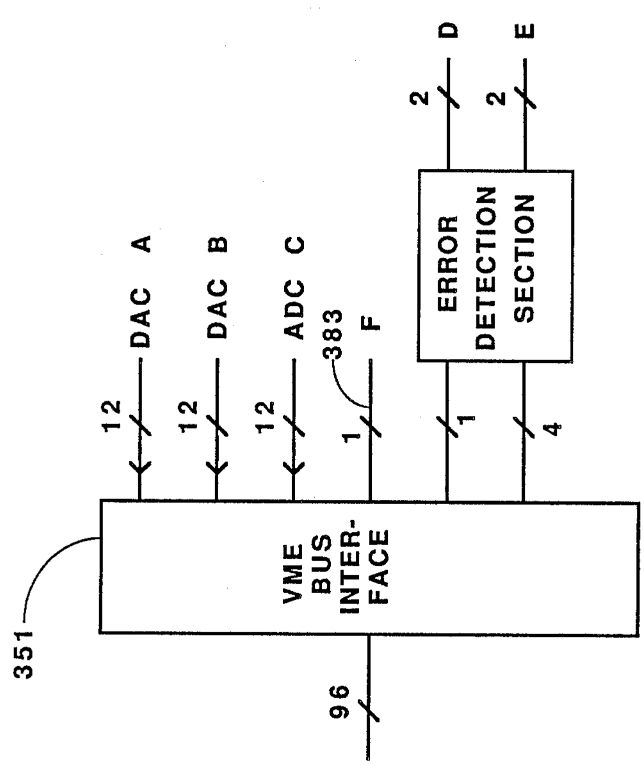
Fig. 16.0A PID ANALOG BOARD

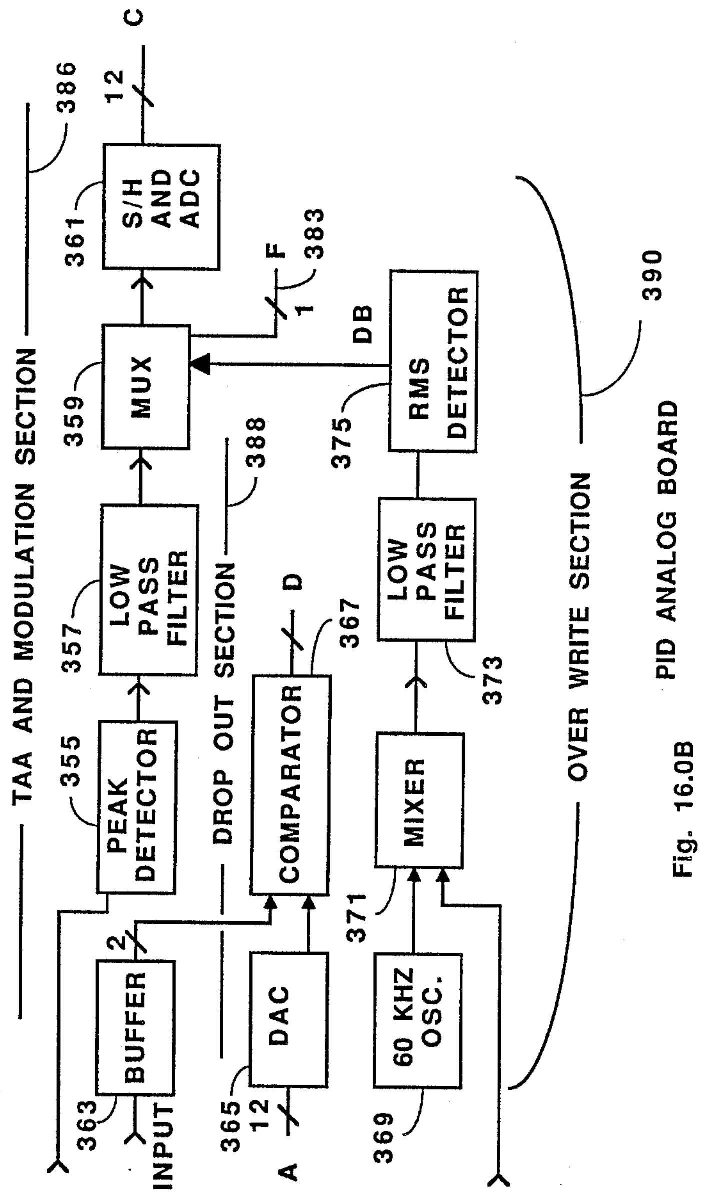
PID ANALOG BOARD
Fig. 16.0B

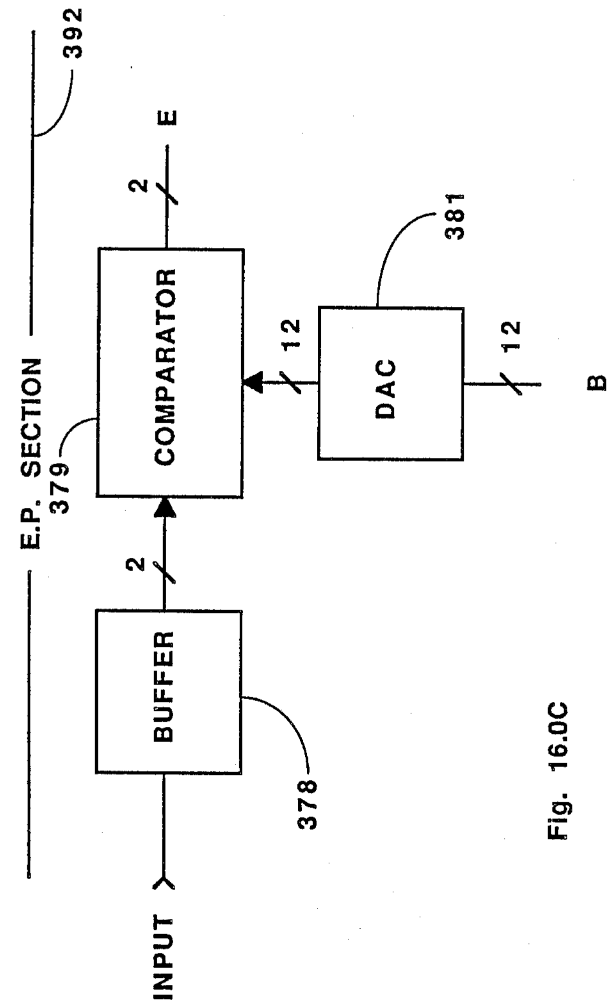
Fig. 16.0C

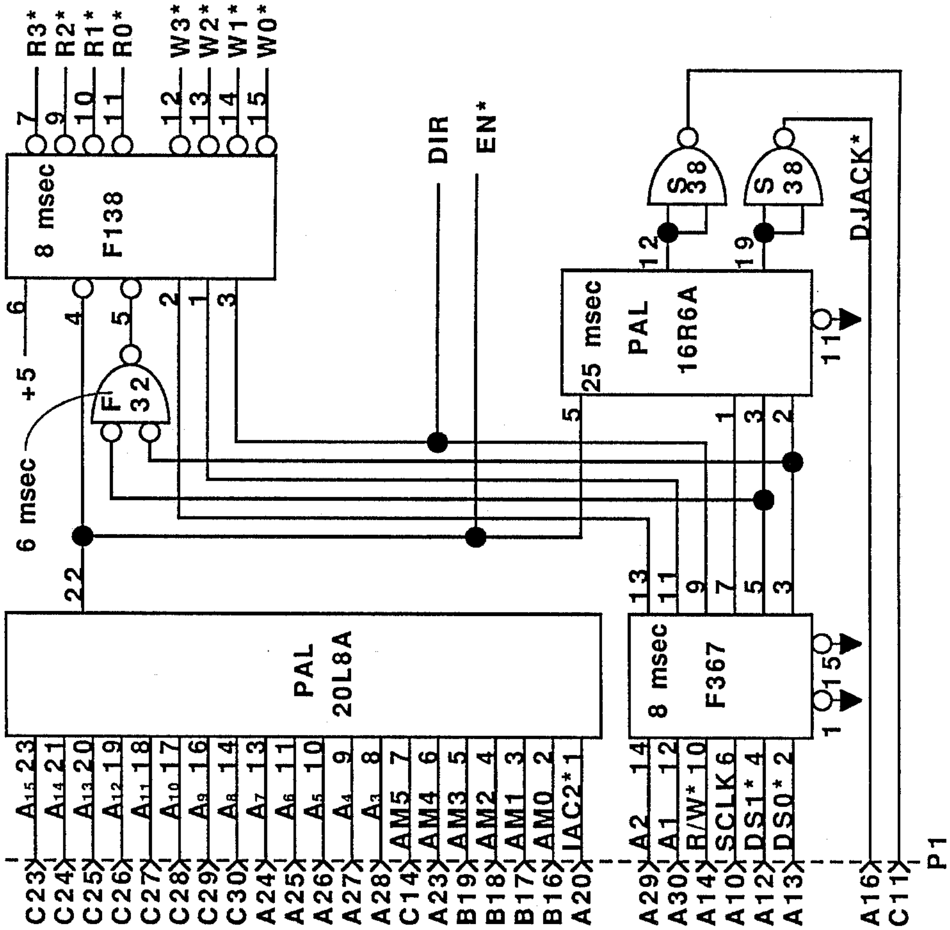
Fig. 16.1

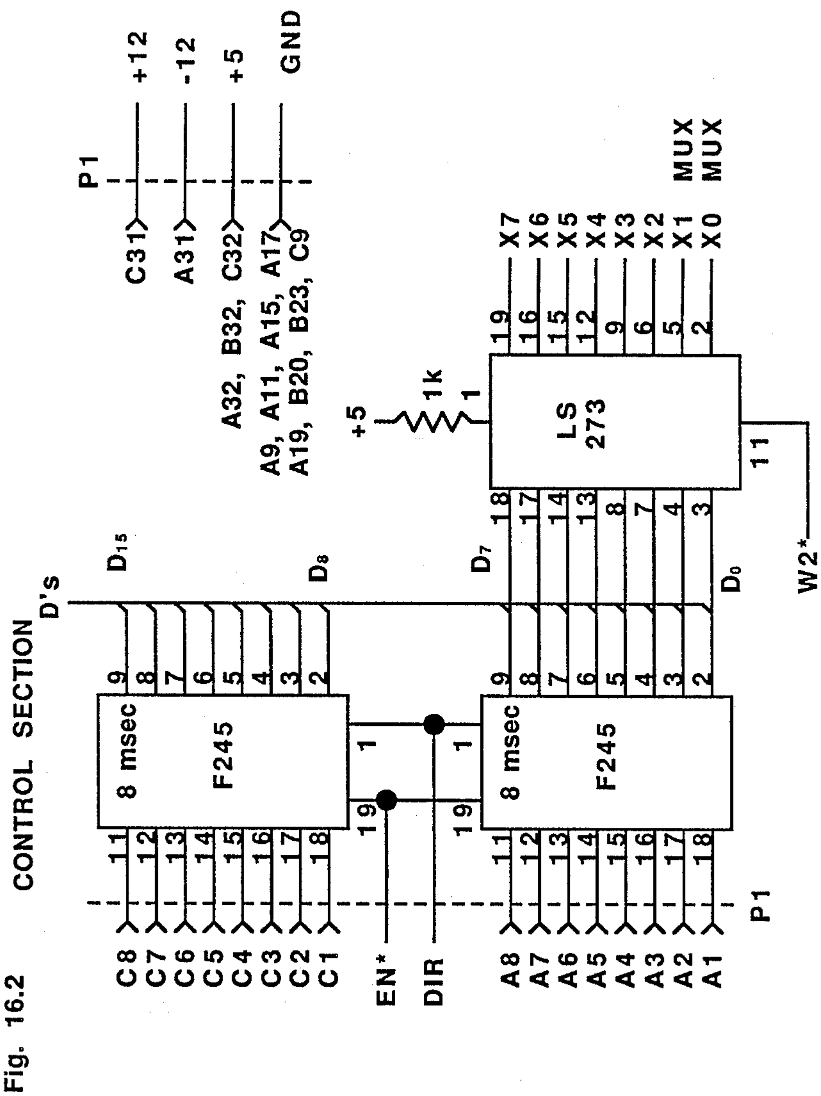
Fig. 16.2

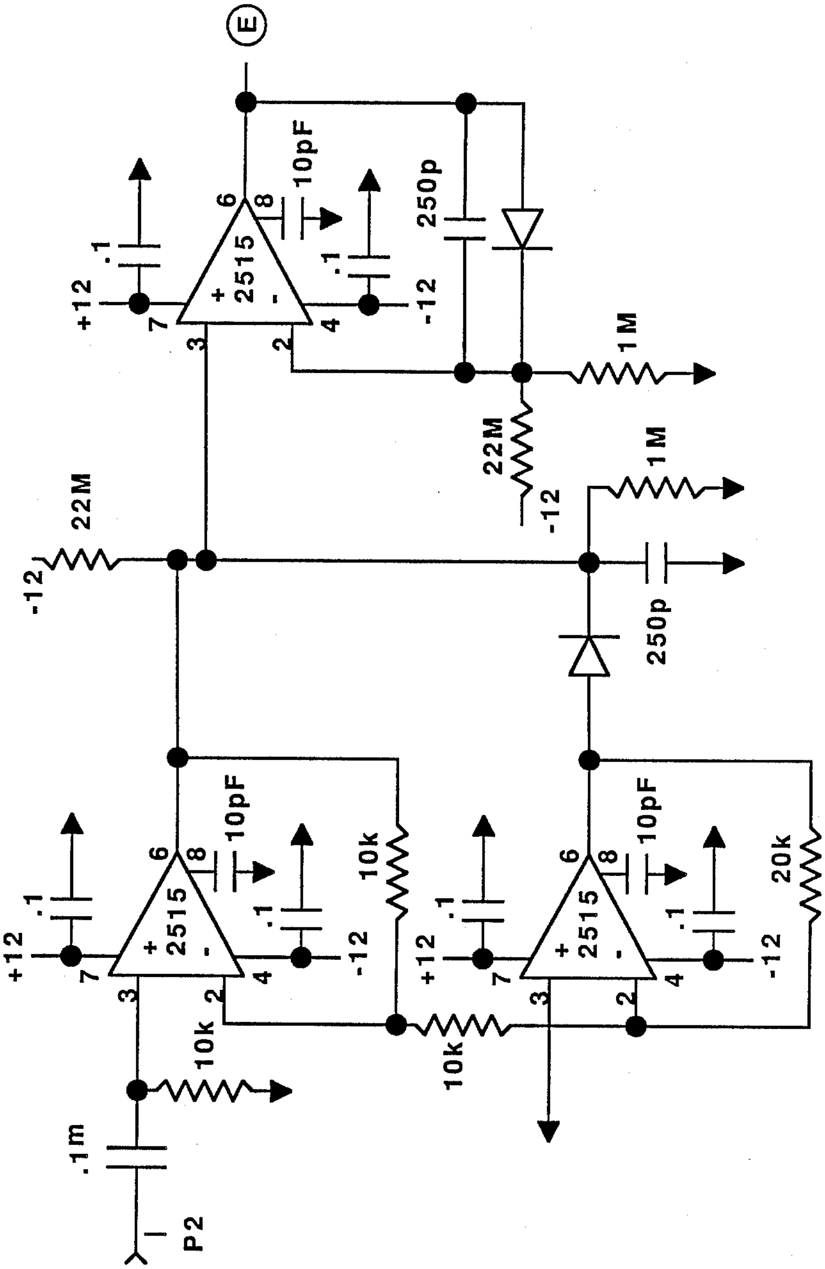
Fig 16.3 PEAK DETECTOR

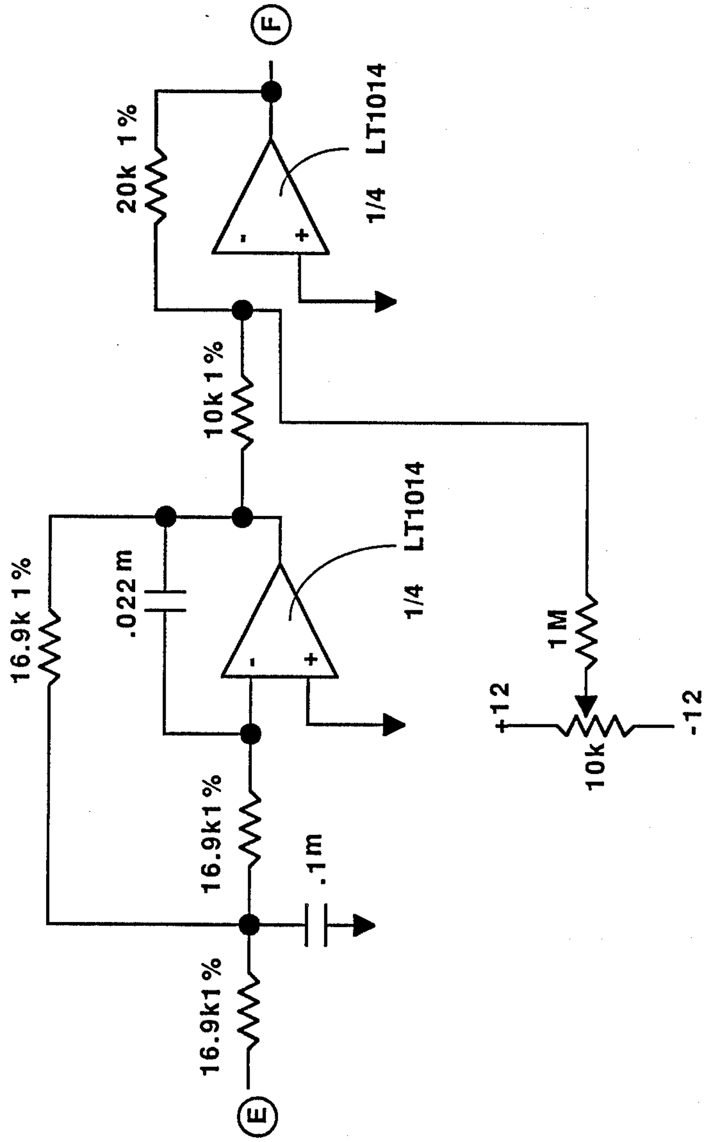
Fig. 16.4 LOW PASS FILTER SECTION

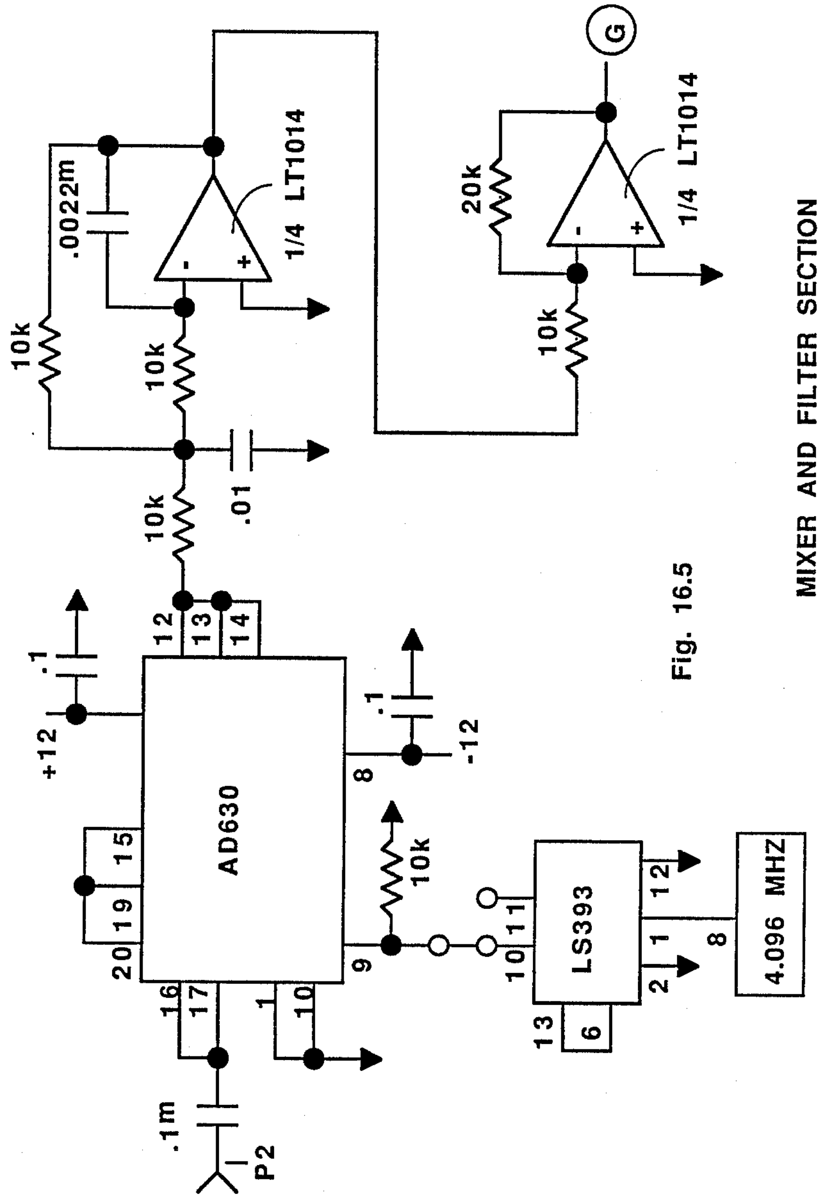
Fig. 16.5
MIXER AND FILTER SECTION

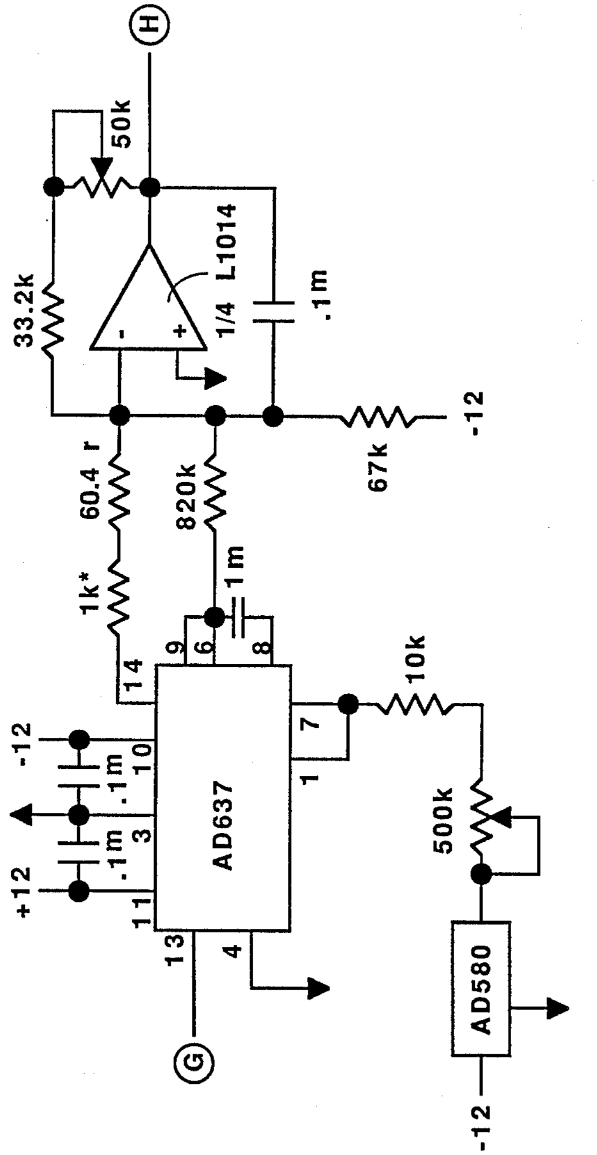
Fig. 16.6
RMS DETECTOR SECTION

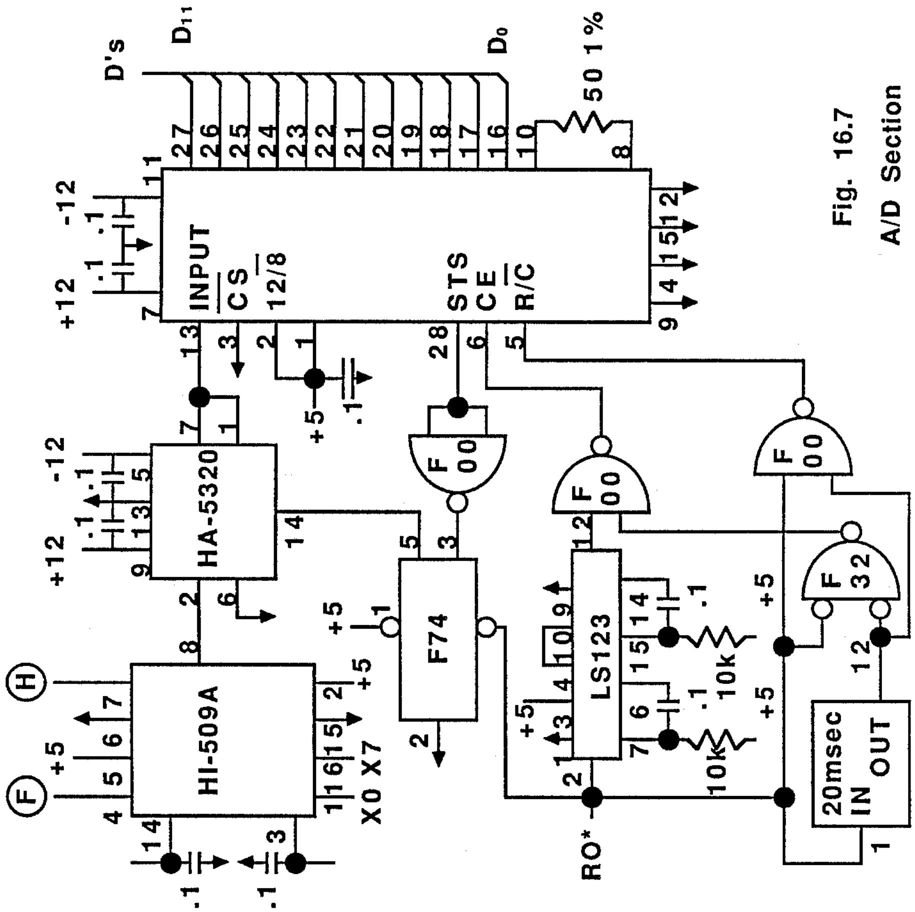
Fig. 16.7
A/D Section

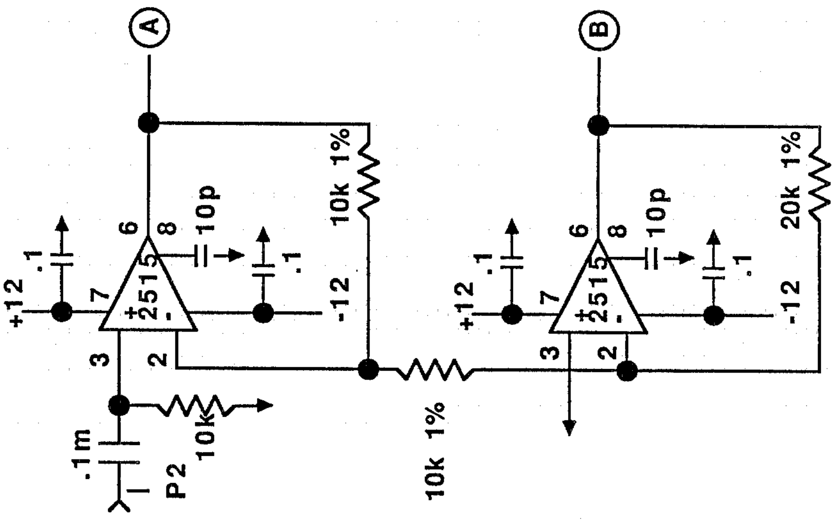
Fig. 16.8
INPUT SECTION

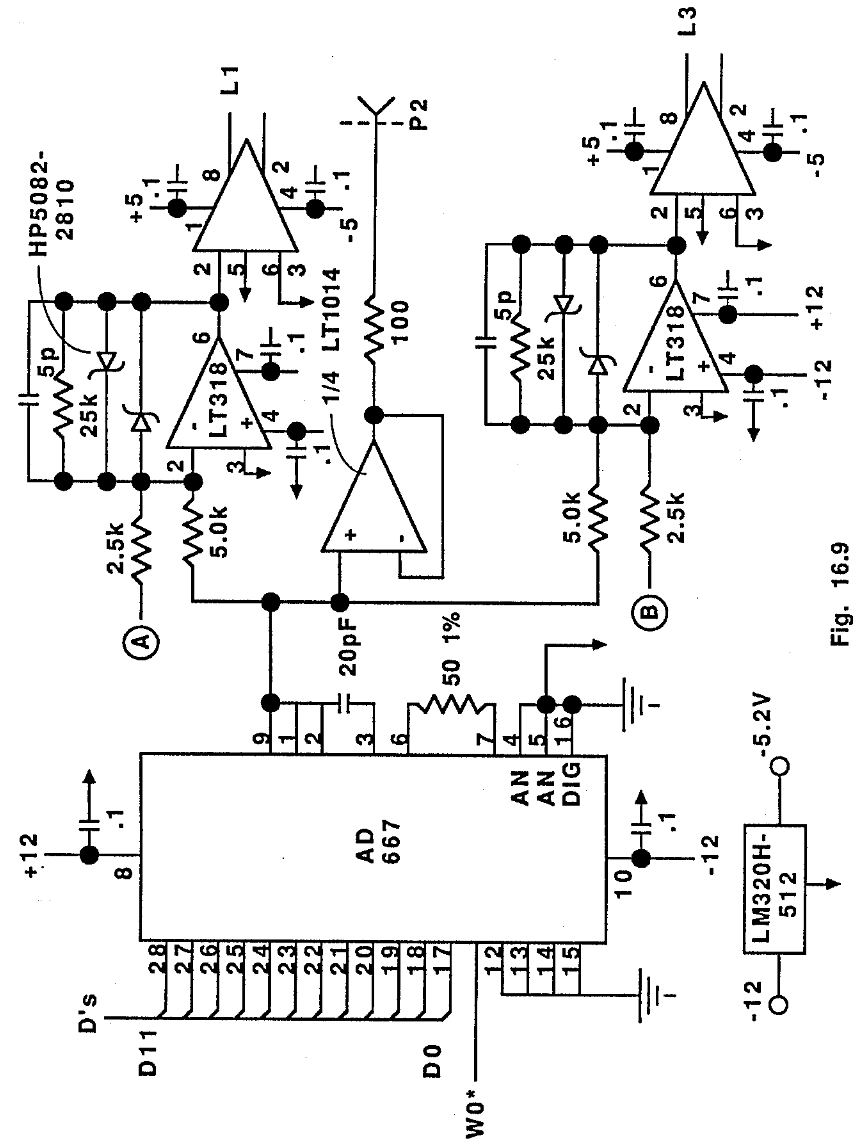
Fig. 16.9

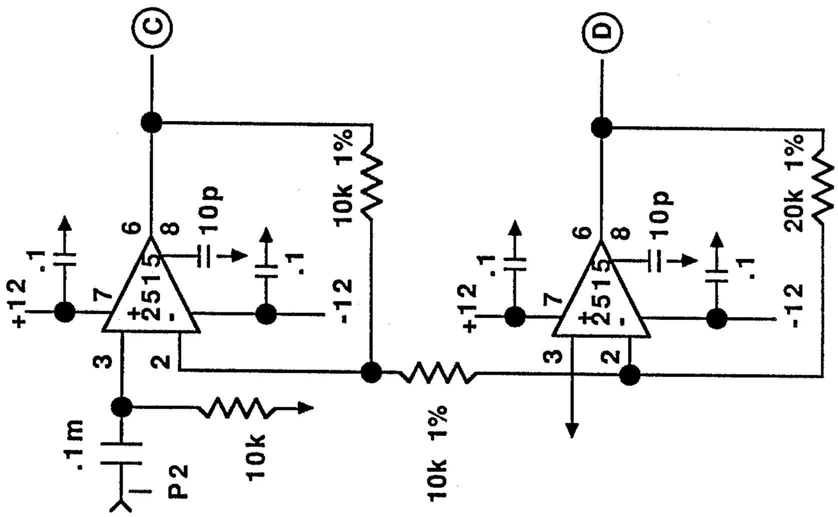
Fig. 16.10
INPUT SECTION

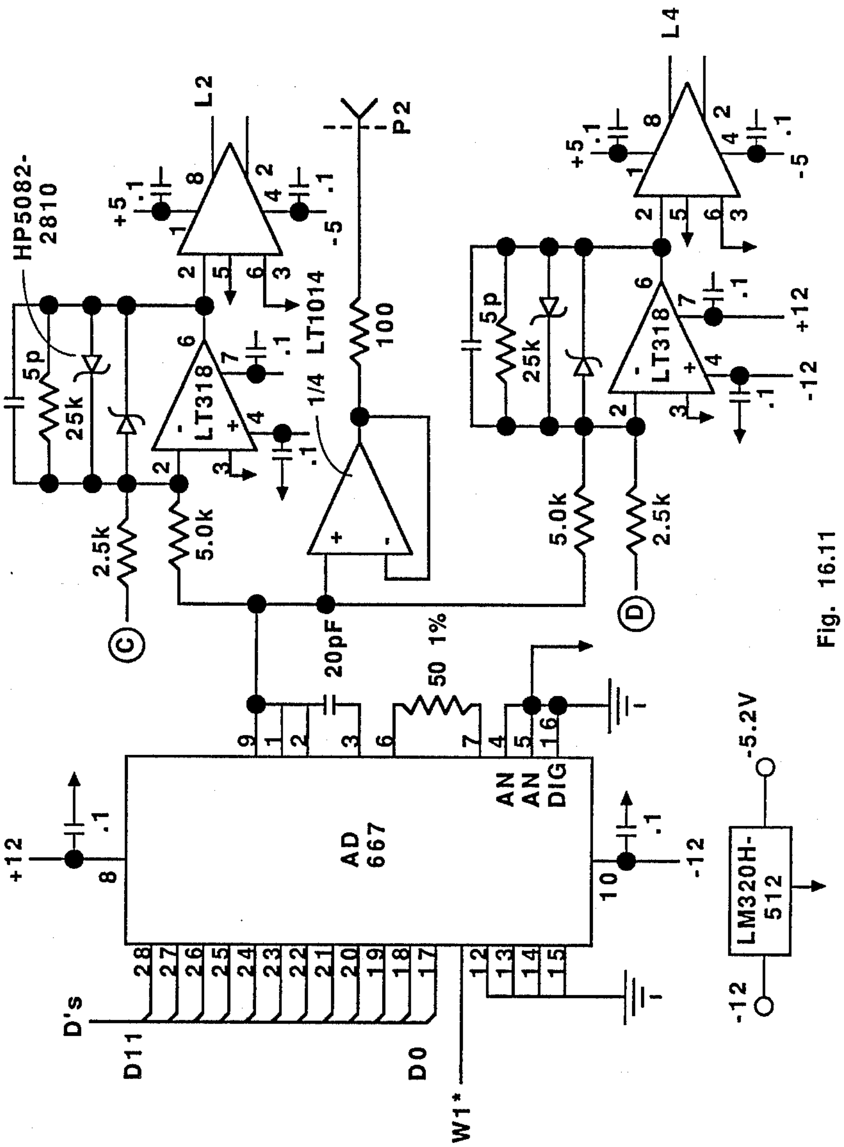
Fig. 16.11

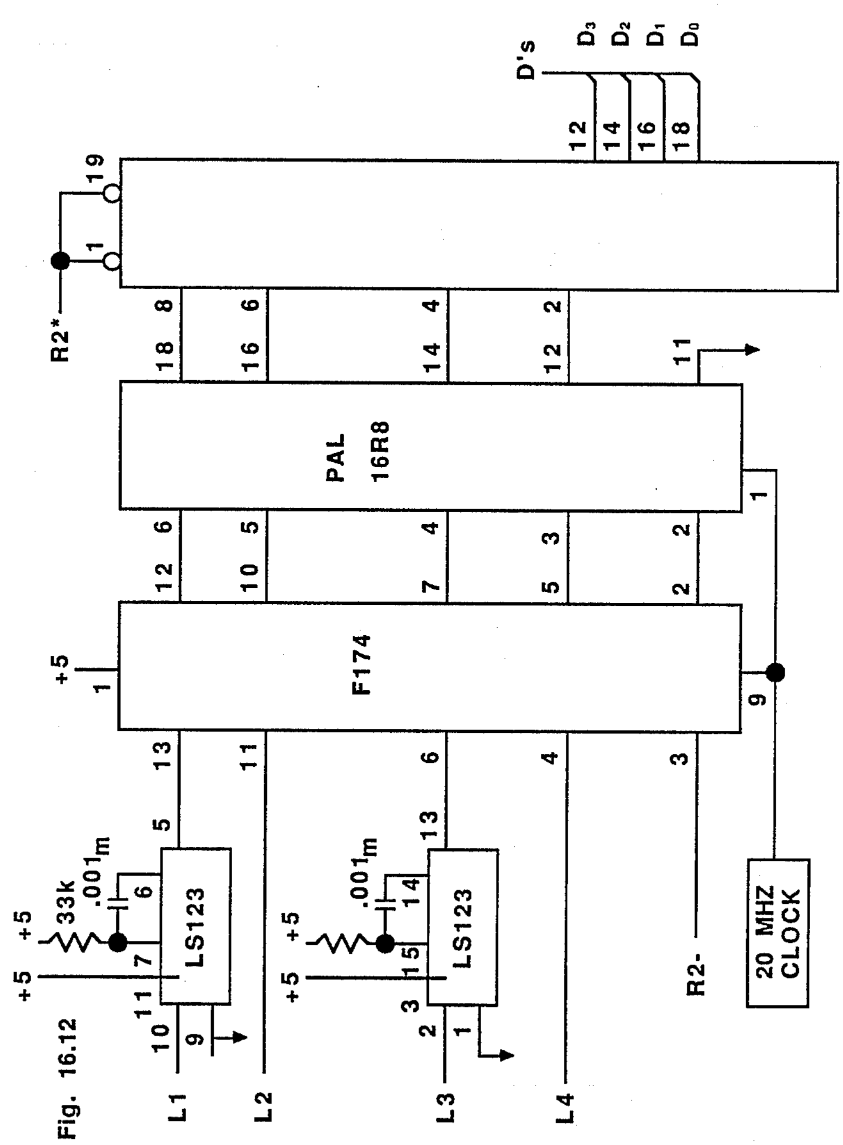
Fig. 16.12

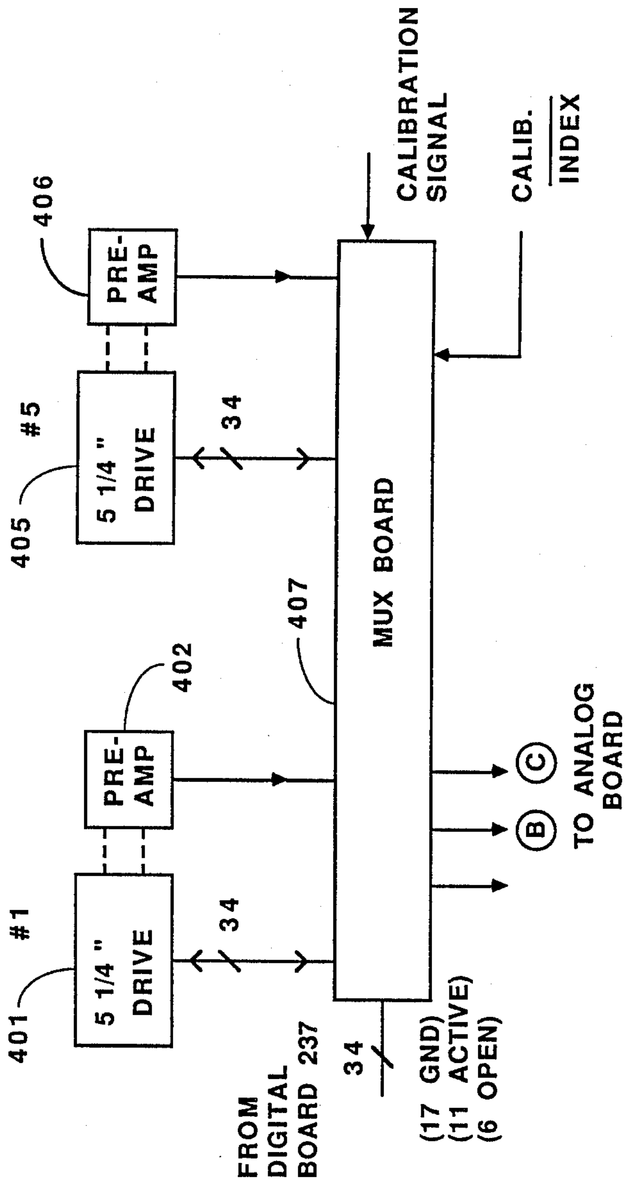
FIG. 17.0
5 DRIVE MODULE

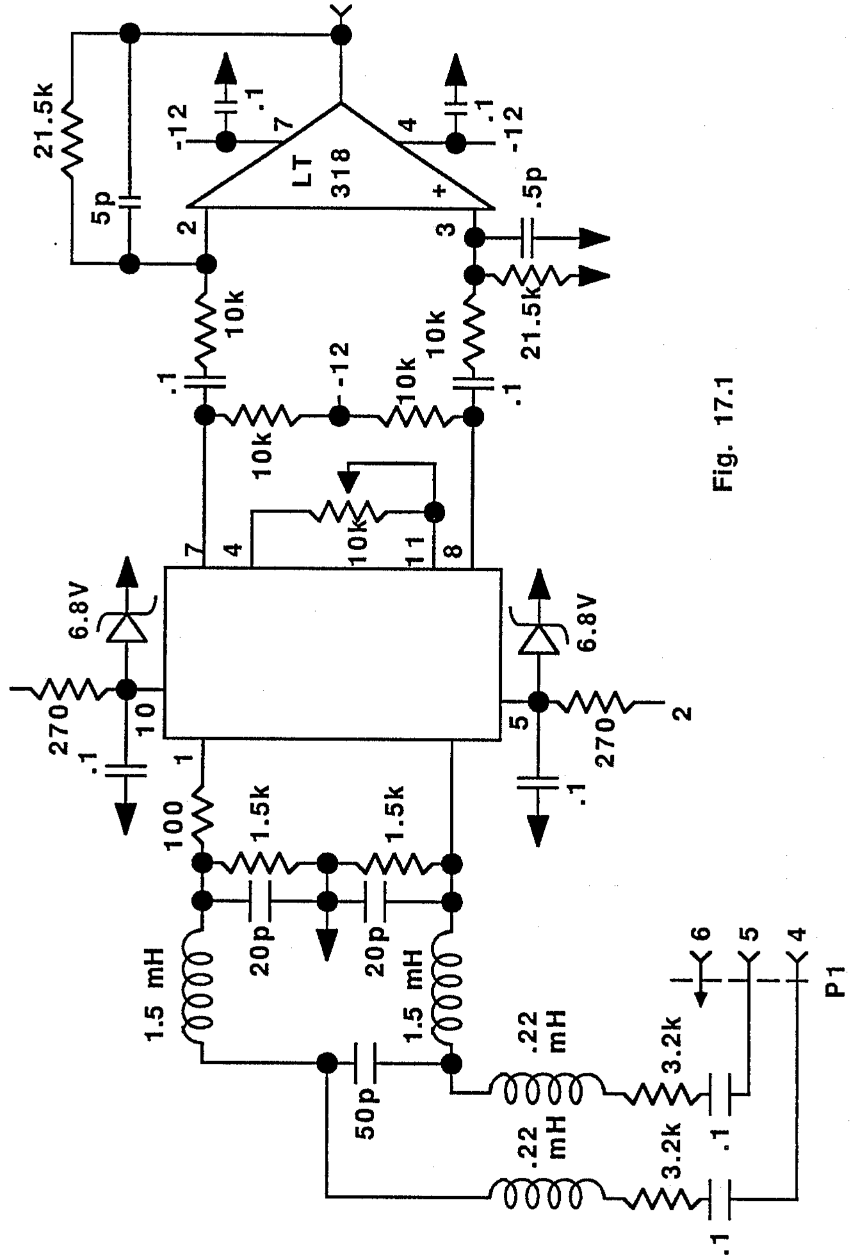
Fig. 17.1

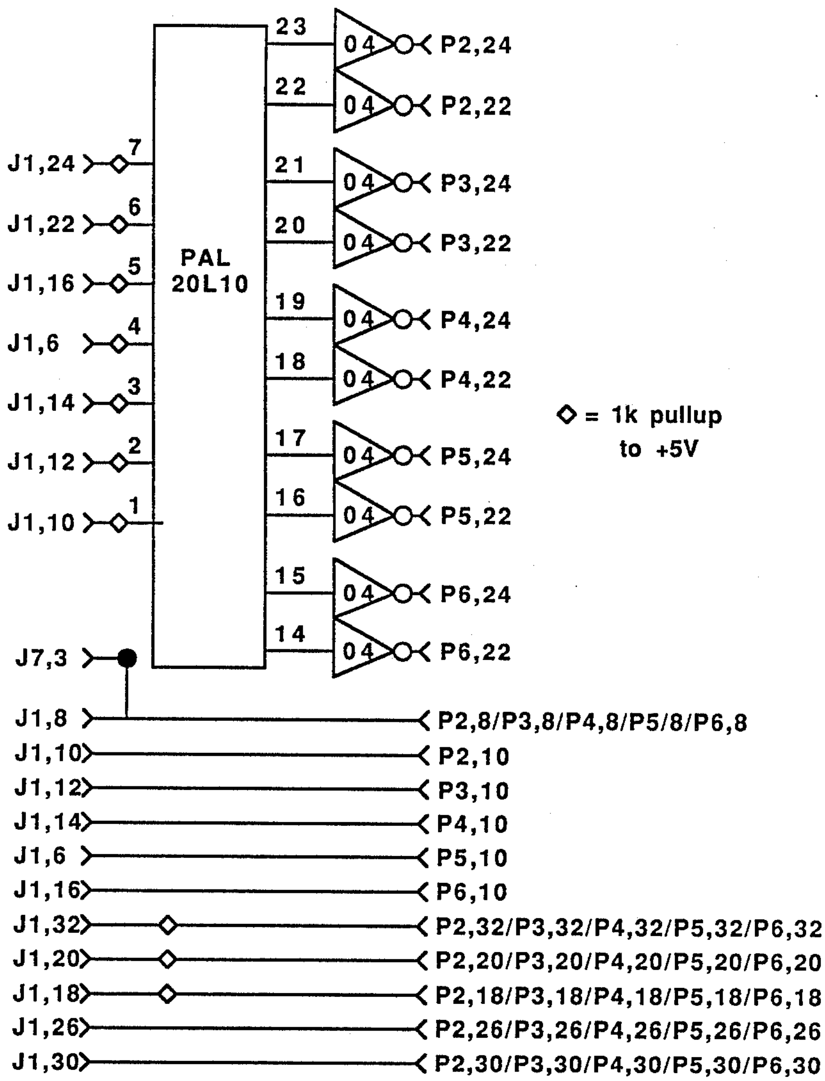
Fig. 17.2 MUX BOARD 407

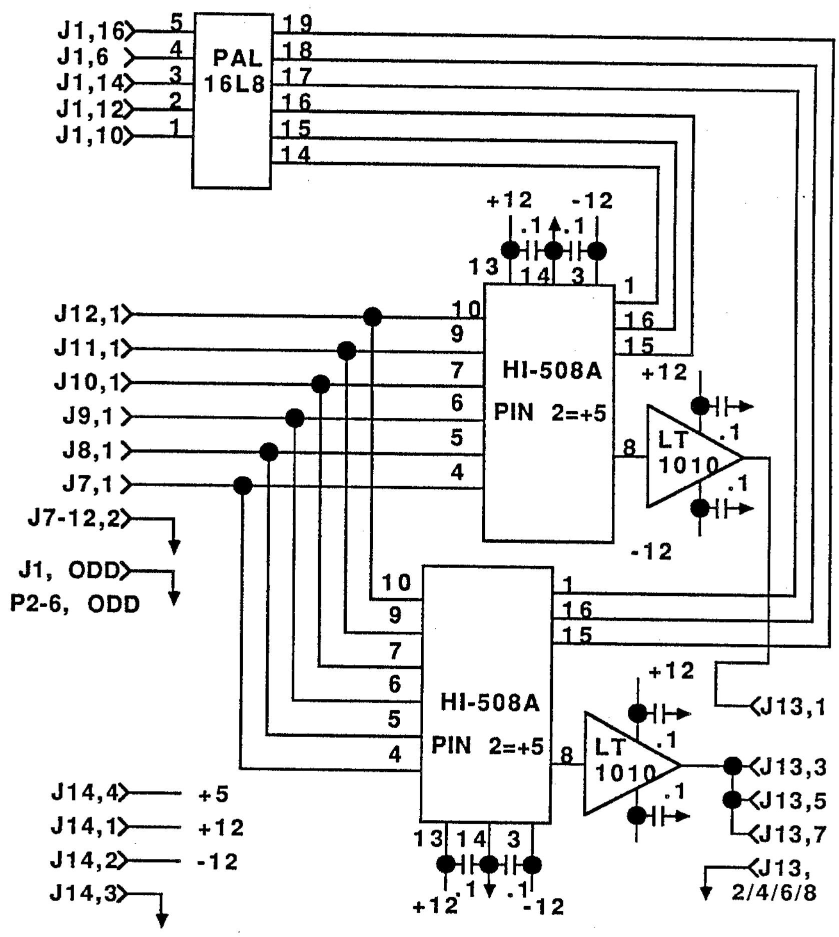
Fig. 17.3 MUX BOARD 407

START-UP SEQUENCE OF A FIVE-DRIVE TEST SYSTEM

DISK CERTIFIER

This invention relates to floppy disk certifier equipment, and particularly, to a disk certifier which minimizes space requirements for large volume disk certification operations.

In the prior art, there are many different brands of disk certifier equipment, each with varying degrees of mechanization with regard to loading and unloading the certifier systems with diskettes. However, none of the prior art systems are capable of completely automated loading and unloading. Either the certifier equipment is loaded in batches by hand, or it is unloaded in batches by hand, or both. Furthermore, due to the physical configuration of the equipment and these manual operations, a typical high volume operation, say 108 million floppy disk certifications per year performing drop out and extra pulse tests on 96 TPI media, requires a very large area, about 40,000 square feet. Maintaining such a large facility adds significantly to the cost of disk certification and ultimately, to the price of the diskettes in the market place.

In the prior art, typical certifiers use an altered two-head drive, where both heads have their own separate electronic systems and can therefore operate independently to speed up the certification process. Standard off-the-shelf drives are not so equipped. Hence, the customary practice is to modify the standard drives by duplicating much of the electronic hardware to achieve this independent operation. As a result, these altered drives typically have two read channels and two write channels, whereas, the off-the-shelf standard drives have only one read channel and one write channel, and a switch for switching between the two heads.

Often these modifications alter the measured response of the heads, leading to unpredictable certification test results. For example, in the measurement of extra pulses, these modifications can change the measured pulse height by as much as 30%. Another problem with present day certification systems is that test sequences and the loading and unloading of the diskettes into the drives, are generally performed sequentially rather than in parallel, thus, significantly adding to the throughput time for certification.

What is needed is a high volume floppy disk certifier with completely automated loading and unloading, and which is configured particularly to optimize the use of space. In addition, it is highly desirable to use existing un-modified drives, in order to control cost and complexity.

SUMMARY OF THE INVENTION

In accordance with preferred embodiments of the invention, provided is a completely automated apparatus for disk certification which has a very high volume per unit area of square footage required. Volumes of 108 million disks per year require only 1200 square feet of facility, about 3% of the space required for prior art certification systems. In addition, the apparatus uses standard unmodified disk drives and is completely integrated with a conveyor and pickup system for automatic loading and unloading of diskettes.

One of the principle features of the invention is a method of sequencing operations on a disk whereby all tracks of disk are written to provide a first test signal. Then all tracks are read after all tracks are written to provide a first read signal. Calculations are performed on the first read signal to obtain a calculated signal and the calculated signal is compared with a known standard. A significant feature of this method is that all tracks are written before all tracks are read, instead of writing a track and then reading that track before proceeding to the next track as in the prior art methods. By writing an entire disk before reading the entire disk, rather than writing and reading on a track by track basis, operations on several disk drives can be sequenced to be performed simultaneously while using the same measurement electronics as would be required for one drive. For example, while one drive is being written at 2F, a second drive is being read after a write at 2F to detect drop outs (i.e. missing bits), a third drive is being erased, a fourth drive is being read after being erased to detect extra pulses (i.e. extra bits), and in a fifth drive a diskette is being exchanged for a new one. By rotating these detection and writing functions from drive to drive via a multiplexor, an entire 5-drive disk certifier unit can be operated with a single analog board. Another significant feature resulting from using a single analog board for five drives is that a significant saving in space is accomplished.

The physical configuration of a certifier according to the invention also contributes to the efficient use of space. Each certifier apparatus is made up of a row of N disk drives arranged side by side such that disks in the drives have a diameter along a line having a component orthogonal to the row, where N is an integer larger than two. Also included is a conveyor which is laid out orthogonal to the row for carrying disks to the row and away from the row. Also, the apparatus has a pickup system for picking up disks from the conveyor means, carrying the disks to the disk drives, inserting the disks into the disk drives, removing the disks from the disk drives, and carrying the disks from the disk drives to the conveyor. In the preferred mode, each certifier system is arranged as two sets of drive certifier modules, each module of which is arranged as two sets of 5-drive units.

Also, the physical arrangement of a plurality of certifiers according to the invention contributes to the efficient use of space for large volume operations. In the preferred configuration, a plurality of certifier units are arranged in a row adjacent each other, the row of units being orthogonal to the row of drives in each unit, such that each unit conveyor abuts a unit conveyor of an adjacent unit with each unit conveyor running in the same direction to form a continuous conveyor from unit to unit. For even larger volume operations, this arrangement is repeated by adding units to a row or by adding more rows, parallel to the first, leaving an aisle between the rows of sufficient width to accommodate a unit for service. In this way the aisle is shared between units again making efficient use of space.

BRIEF DESCRIPTION OF THE DRAWINGS

FIG. 11 is a block diagram of the electronic system for a 10-drive module.

FIGS. 12A–12B are block diagrams of a motion control module and a motion control board respectively.

FIGS. 13.0–13.9 show the schematics of a first calibrator board and parts of a second calibrator board.

FIGS. 14.0–14.6 show the schematics of a display section of the second calibrator board.

FIGS. 15.0–15.9 provides details of a digital board.

FIGS. 16.0A, 16.0B, 16.0C and 16.1–16.12 show an analog board.

FIGS. 17.0–17.3 show the electronic system for a 5-drive unit.

DETAILED DESCRIPTION OF THE INVENTION

Mechanical System

Figure 1:
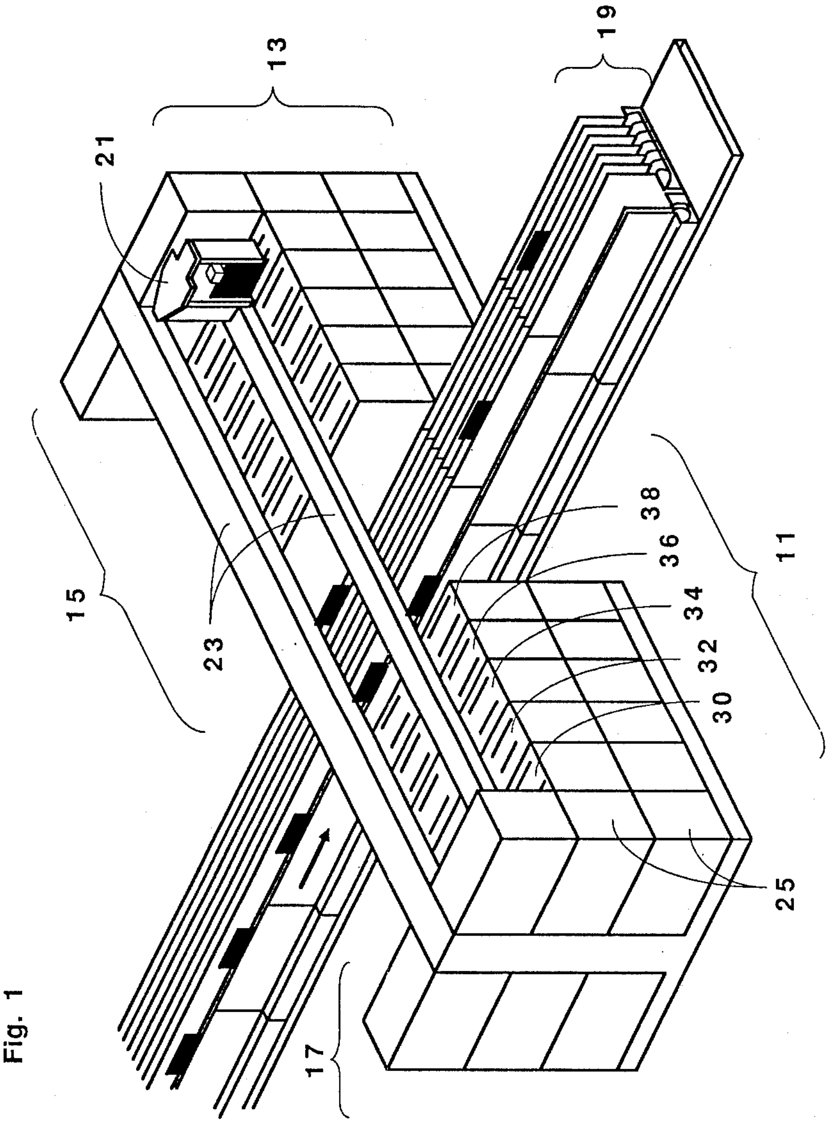
FIG. 1 shows a certifier and conveyor according to a first embodiment of the invention.

In accordance with preferred embodiments of the invention, illustrated in FIG. 1, is a first preferred embodiment for the certifier system which is made up of two sets of identical modules 11 and 13, a central conveyor 19 and a carriage 21. Each of the modules 11, 13, 15 and 17 is made up of five pairs of disk drives 30, 32, 34, 36 and 38, each pair having shared drive electronics to save space. The central conveyor 19 brings diskettes into a region under the carriage 21 for pick up. The carriage then picks up a diskette that has already been certified, moves over slightly to insert the uncertified diskette it has just previously picked up from the conveyor, and places the uncertified diskette into the certifier drive. The carriage then moves to the location of the conveyor and places the certified diskette it has just previously picked up onto the conveyor for automatic delivery to a packing system (not shown). Thus, while one drive of the pair is performing certification operations, the other drive of the pair is waiting to be picked up or loaded. The fact that the measurement electronics is not being used during these waiting periods makes it possible to share the measurement electronics.

Figure 2:
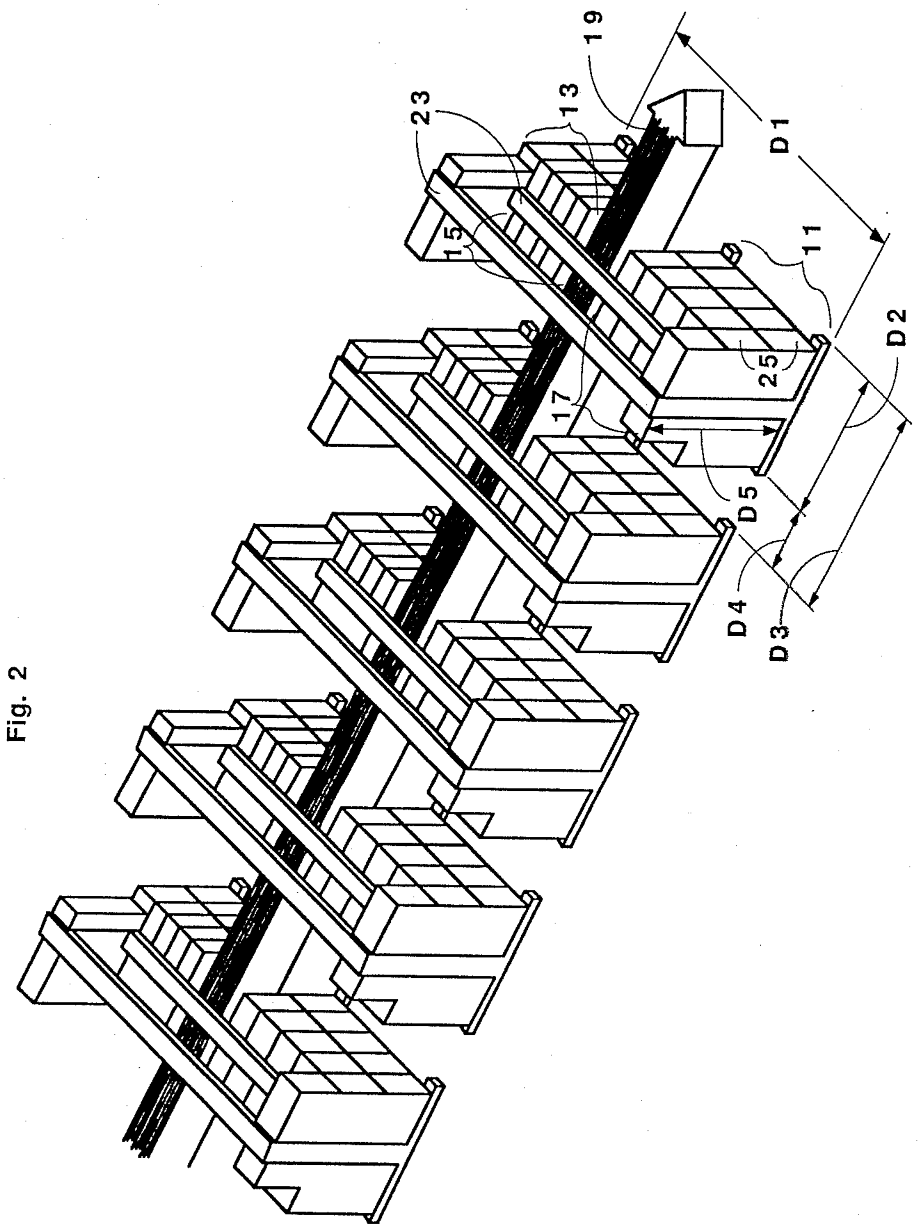
FIG. 2 shows a facility layout according to the first embodiment of the invention.

Shown in FIG. 2 is a layout of a high volume disk certifier operation. In this design, each pair of modules is placed back to back with another pair of modules, e.g. back to back with 11 and 13, are modules 15 and 17 respectively. These sets of four modules are then repeated all along the conveyor. Typical dimensions for the operation are about 7 ft. for D1, the length of the pair of modules 11 and 13, and the control system 25; about 2 ft. for D2, the width of each set of 4 modules; and about 3 ft. for D4, the distance between back to back pairs of modules. The distance of 3 ft. for D4 allows ample room between the sets of modules to remove individual pairs of certifiers for servicing and repairs. With this arrangement, the operation can utilize 200 certifier drive systems in a space of only 270 square feet. Furthermore, since the height D5 of each set of 4 modules is only about 3 feet, another set of 4 modules can be attached above them and still be easily accommodated in a room with an eight foot ceiling. This provides 400 disk certifiers in a space of only 270 square feet, a significant reduction in space requirements over prior art systems.

Figure 3A:
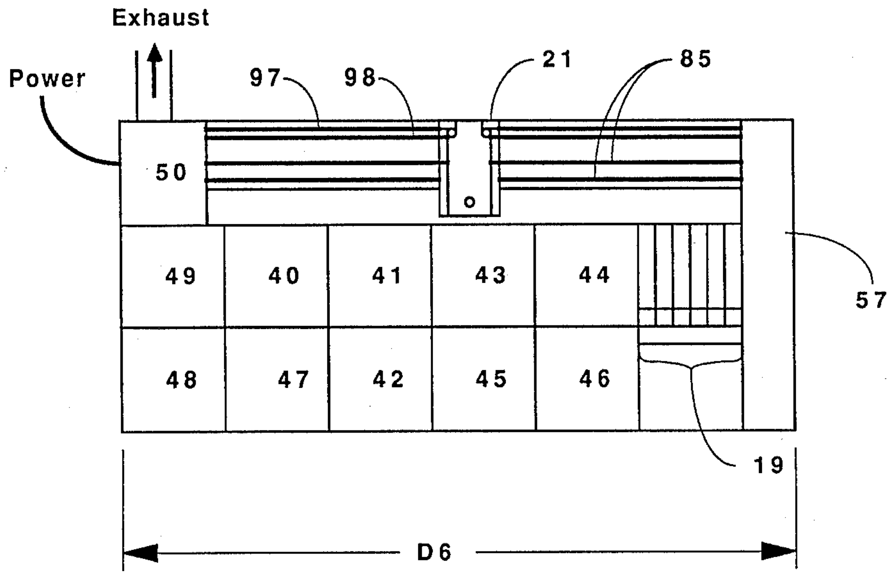
FIG. 3A shows a side view (elevation) of a certifier according to the second embodiment of the invention.

Shown in FIG. 3A is a second preferred embodiment of the invention in which the conveyor system 19 is located on one end rather than in the middle as in the first preferred embodiment. In this embodiment, each module is arranged in units of 5 certifier drives, with 10 drives per module. Each module is adjacent another module rather than on opposite sides of conveyor 19. For example, block 40 and 41 each have 5 drives, making up a first 10 drive module. Block 42 contains the drive control electronics for the first module Similarly, blocks 43 and 44 each have 5 drives, making up a second 10 drive module, and block 45 contains the drive electronics for the second module. Block 46 contains a single power supply for both 10 drive modules, and block 47 contains a single central control module for both 10 drive modules. Block 48 contains the motion control electronics for controlling the motion of the carriage 21 to position it over the drive at the appropriate time, block 50 contains the belt drive system for moving drive belts 85, 97 and 98, which in turn move the carriage 21, and block 49 contains the power supply for the belt drive system. Block 57 contains a tensioning system for keeping belts 85, 97 and 87 taut.

Figure 3B:
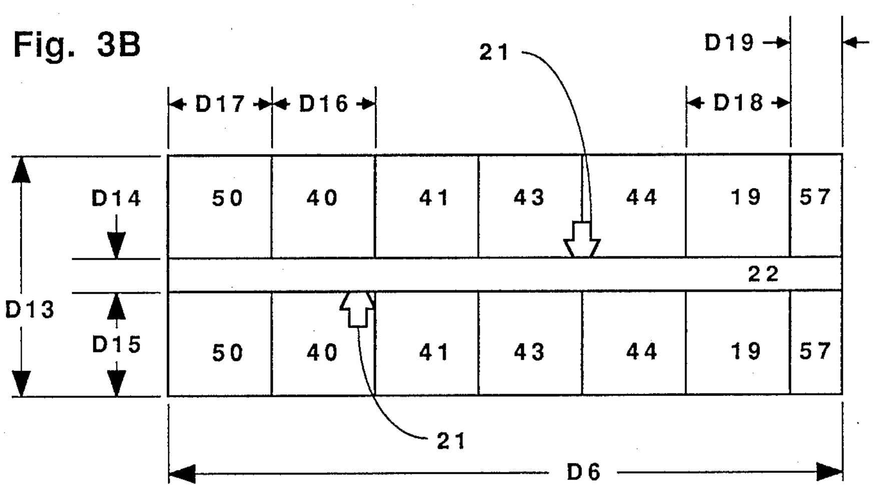
FIG. 3B shows a top view (plan) of a certifier according to the second embodiment of the invention.

Shown in FIG. 3B is a typical layout for a double certifier unit according to the second preferred embodiment which is made up of two units back-to-back, so that one unit is the mirror image of the other. This top view shows the arrangement of the individual disk drives, tensioners, conveyors, and drive belt systems. Together, this back-to-back system has a total of 40 drives, with external dimensions of only 3 ft. in width, D13; and only 6 ft. in length, D6. A steel frame 22, about 3 inches in width D14 from which the elements are suspended runs the full 6 ft. length of this double certifier unit. Each of the 5-unit drives, 40–44 has a width D16 of about 10 inches. The width D17 of block 50 containing the drive belt system is about 15 inches, and the width D18 of the conveyor 19 is about 10 inches. The width D19 of the tension system is about 7 inches.

Figure 3C:
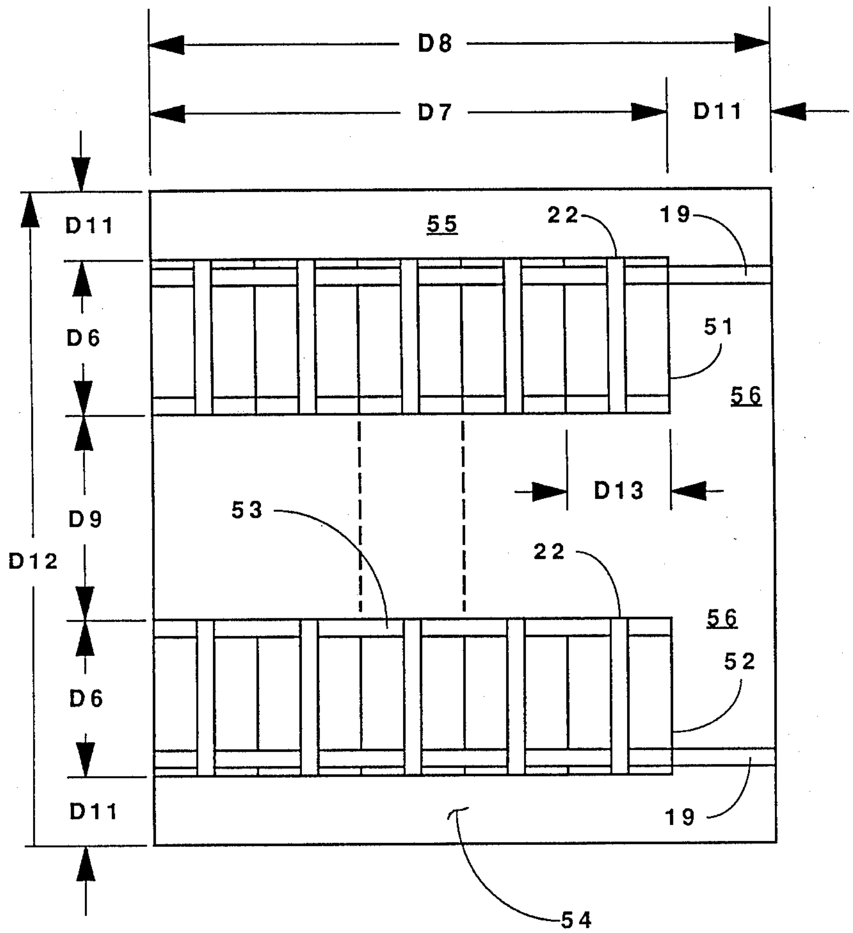
FIG. 3C shows a facility layout using the second embodiment of the invention.

FIG. 3C shows a typical facility layout for a high volume disk certifier operation according to the invention. In this facility, there are 10 double units arranged in two rows 51 and 52, each of which contains 5 double units. Each row is arranged with the double units side by side so that the conveyor 19 runs continuously through the length of the row. An aisle D9 is equal to the length D6 of the double unit, so that an individual unit, such as 53, can be removed into the aisle for repairs etc., as illustrated by the dotted lines, the aisle being shared by each row. Also, narrower aisles 54 and 55 of width D11 of 2.5 ft. are provided adjacent the wall next to each row for access to the conveyors 19. Similarly, an aisle 56 having a width D11 of about 2.5 ft. is provided on one side of each row. The total length of each row D7 is 15 ft., providing a facility width D8 of 17.5 ft. The facility width D12 is 23 ft., so that the total area of the facility is 402.5 square feet. Since each double unit is capable of certifying 3.6 million disks per year, the total facility is capable of certifying 36 million disks per year. For comparison with other certification operations having a throughput of 108 million disks per year in a 40,000 square feet facility, the operation according to the invention can certify 108 million disks per year in a facility only slightly over 1200 square feet, only about 3% of the space required for prior art certification system. One of the most significant reasons for this dramatic reduction in facility requirements is the fact that no product is stored in the machine as in prior art designs, but is instead carried to and away from the certifier by the conveyor system. Additionally, the overall size of each double certifier is significantly reduced in size from the prior art devices because of shared electronics which can be achieved using the certification method of the invention.

Figure 4:
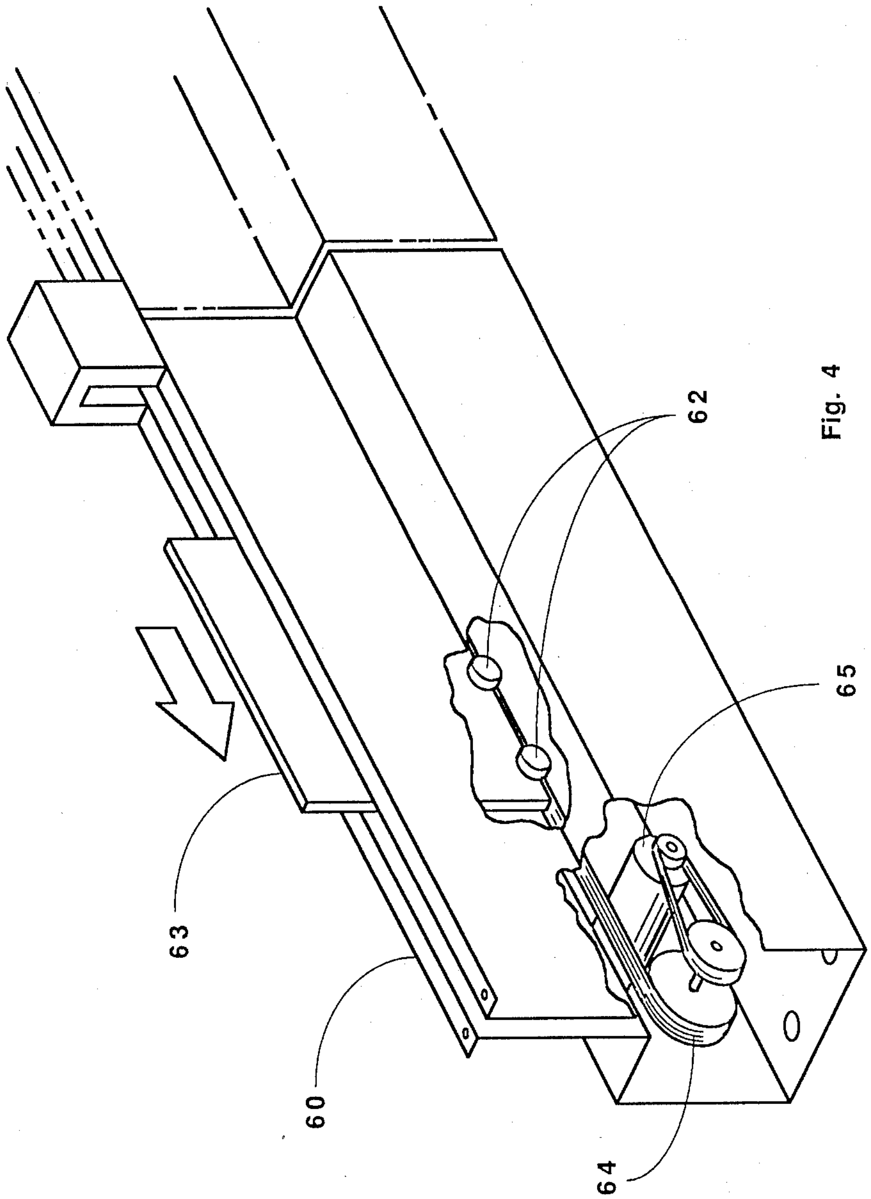
FIG. 4 shows an incoming conveyor module.
Figure 5:
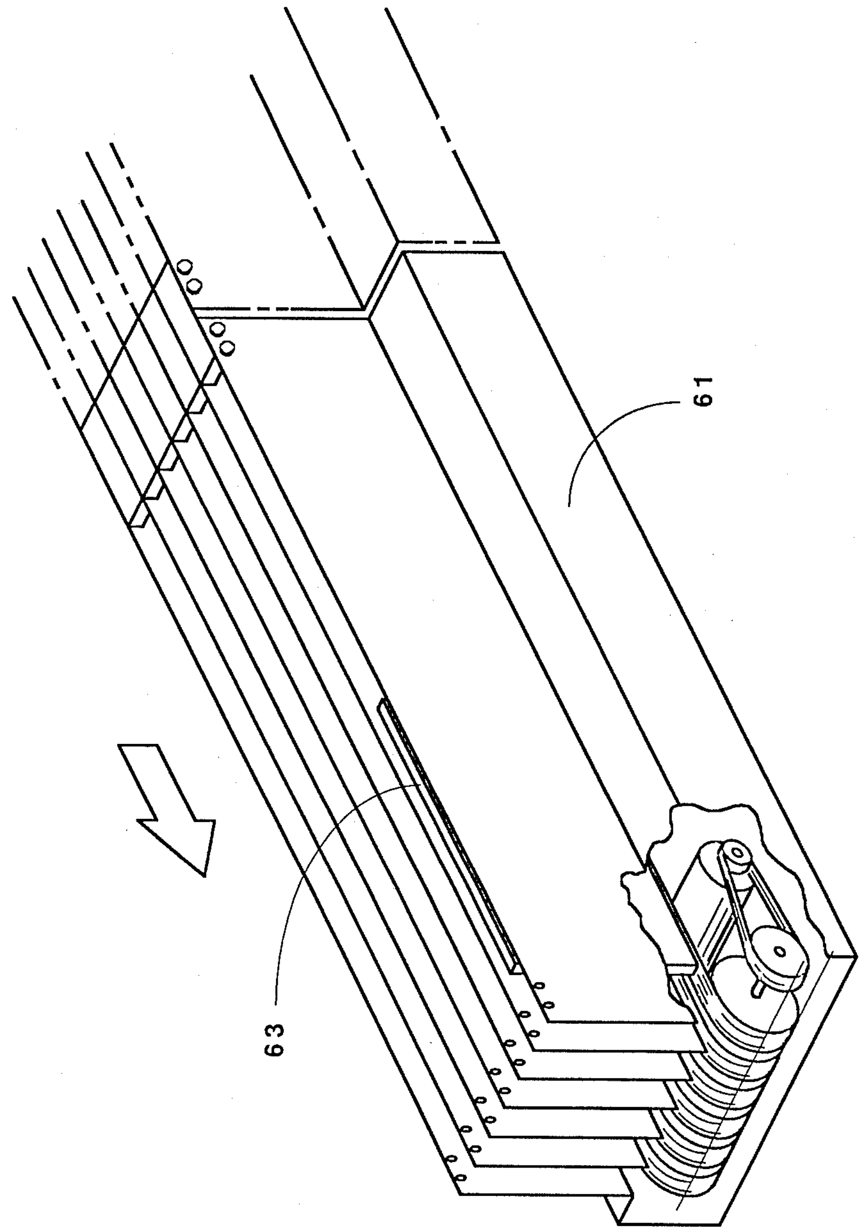
FIG. 5 shows an outgoing conveyor module.

Details of the conveyor system 19 are shown in FIGS. 4 and 5. The conveyor 19 is made up of an incoming conveyor 60 (FIG. 4) and an outgoing conveyor 61 (FIG. 5). In the typical configuration, the incoming conveyor 60 has only one slot, thus making lateral indexing for picking up an incoming diskette by the carriage 21 quite simple. Indexing along the length of the conveyor is provided by a pair of optical sensors 62. Motion of a diskette 63 is provided by a conveyor belt 64 which is driven by a drive motor 65. The outgoing conveyor 61 is provided with six belts, so that depending on what the results of the certification tests are, the tested diskettes may be segregated according to their quality.

Figure 6A:
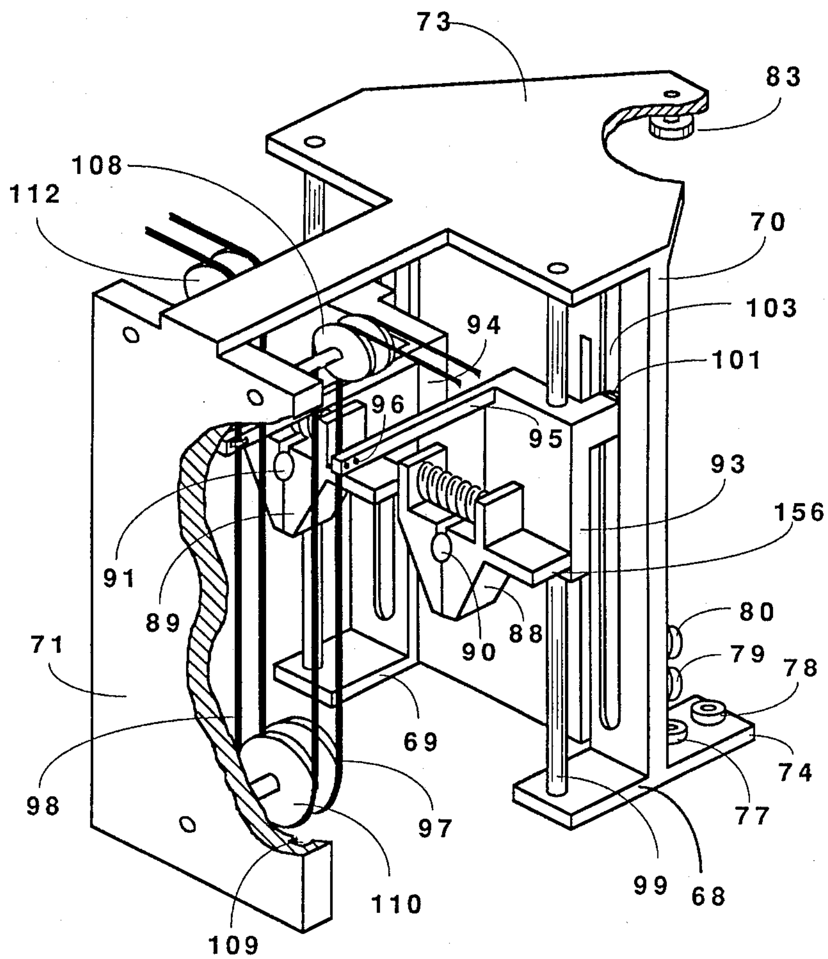
FIGS. 6A–6C show three views of a carriage according to the invention.
Figure 6B:
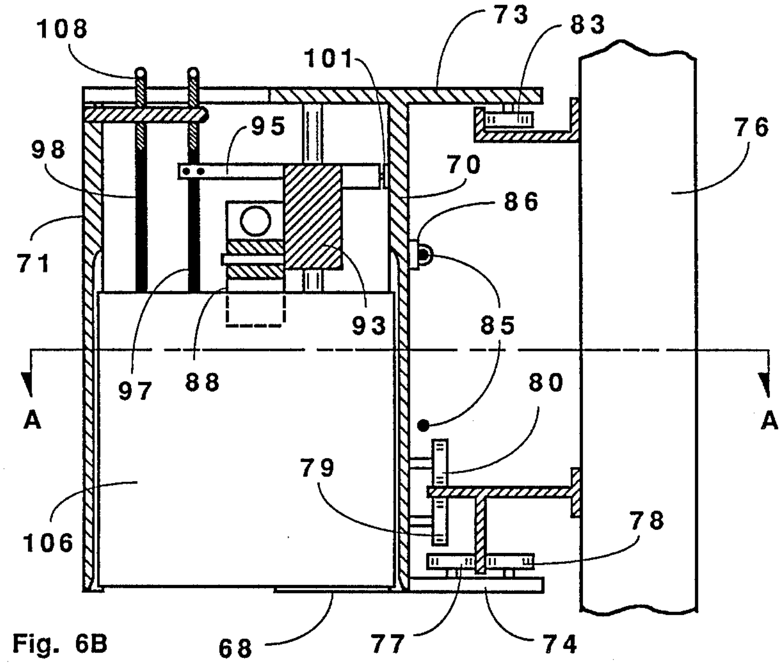
Figure 6C:
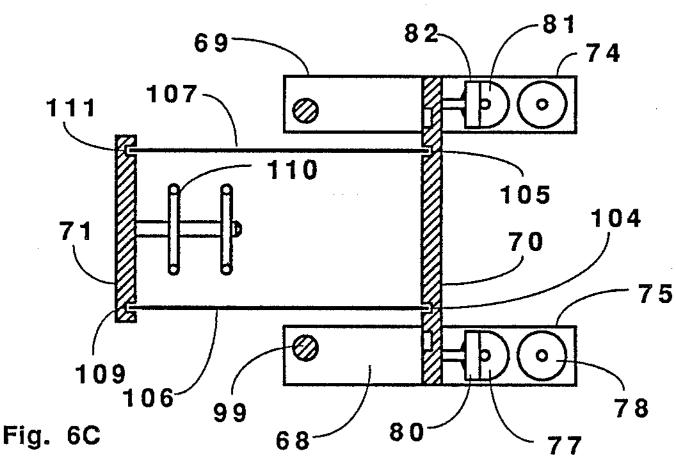

Details of the carriage 21 are illustrated in FIGS. 6A, 6B and 6C. The carriage is made up of a housing, typically aluminum, which has a back plate 70, a front plate 71, a top plate 73, a pair of bottom flanges 74 and 75 attached to the back plate 70 and extending toward a rail 76, and a pair of bottom flanges 68 and 69 attached to back plate 70 and extending away from rail 76. The carriage is held firmly and guided along the rail 76 by guide rollers 78 through 83, which constrain motion in all degrees of freedom except horizontal travel. Motion of the carriage horizontally is effected by means of a horizontal motion belt 85 (See FIG. 3A) which runs parallel to the rail and is attached to back plate 70 at point 86.

The carriage has two spring-loaded grippers 88 and 89 for picking up and inserting diskettes into the drives. The grippers are attached by pins 90 and 91 to gripper blocks 93 and 94 respectively. Each gripper block has an arm, such as 95, which is fixedly attached at a point 96 to a vertical drive belt such as belt 97. Motion of the belt then raises and lowers the gripper along a vertical guide rod such as rod 99 which is attached to the carriage top plate 73 and to a flange such as flange 68. The vertical motion of guide rod 99 is constrained laterally by a gripper guide roller 101, which rolls up and down in a slot 103 in back plate 70. A similar arrangement provided for the other gripper. Also, back plate 70 is provided with two slots 104 and 105 (see FIGS. 6B and 6C), for accommodating the diskettes 106 and 107 when they are held in the up position by the grippers. The front plate 71 also has two guide slots 109 and 111 to accommodate the diskettes.

Figure 7:
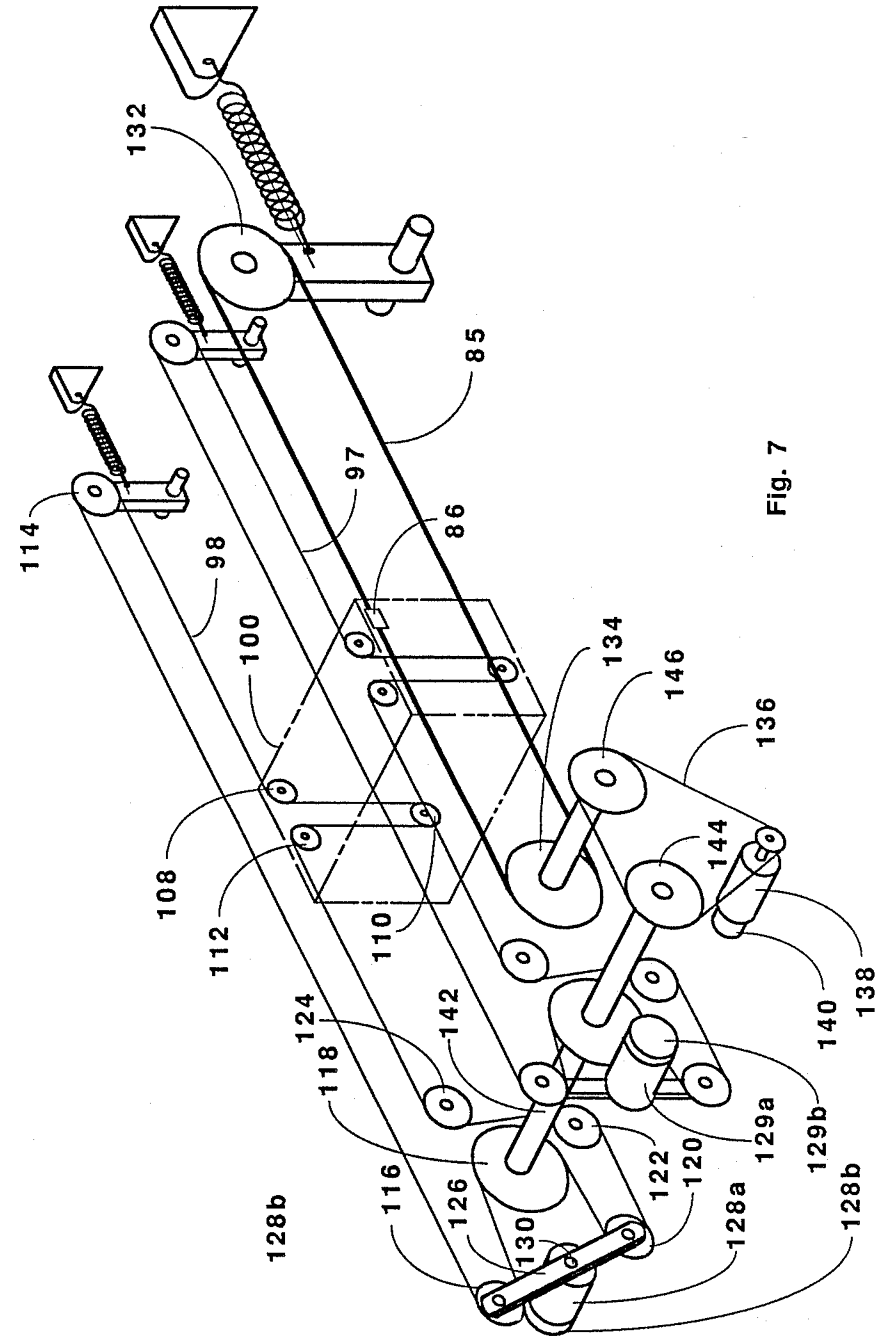
FIG. 7 shows a carriage drive system moving the carriage vertically and horizontally.

As illustrated in FIG. 6A and in more detail in FIG. 7, the grippers are driven up and down by drive belts 97 and 98. (The carriage is represented schematically by the dotted box 100.) Each belt is entrained over three pulleys such as 108, 110 and 112 attached to the carriage. As indicated, belt 98, for example, is also entrained over a spring tensioned return pulley 114, over an idler pulley 116, over a drive sprocket 118, over an idler pulley 120, around an idler pulley 122, over an idler pulley 124 and back to the carriage pulley 112. Idler pulleys 116 and 120 are mounted on a sprocket arm 126 which is driven by a motor 128. As sprocket arm 126 is rotated about its axis 130 by motor 128*a*, belt 98 moves along pulleys 108, 110 and 112 raising or lowering the gripper 88 depending on the direction of motion. In the preferred mode, sprocket arm 128 is chosen to be about 8 inches in length, so that a motion of about ±30° corresponds to a gripper travel of about 6 inches vertically. Drive sprocket 118 is used to maintain the vertical position of gripper 88 while the carriage is being moved by moving the belt 98 the same distance that the carriage is moved by belt 85. The drive system for belt 97 is identical to that for belt 98. FIG. 7 also illustrates the drive system for belt 85. The carriage is attached to the belt 85 at point 86 as indicated earlier, so that as belt 85 moves, so moves the carriage. The belt 85 is entrained over a spring-tensioned return sprocket 132 and over a fixed sprocket 134. The fixed sprocket 134 is driven by a drive belt 136 which is in turn driven by a DC motor 138 having a shaft encoder 140 for determining the position of the carriage. Belt 136 also drives shaft 142 which in turn drives sprocket 118 to keep the grippers in a fixed position vertically during the motion of the carriage. In the preferred mode, to keep the vertical position fixed, sprockets 118 and 134 are equal in diameter typically about 3 inches, and drive sprockets 144 and 146 are also equal in diameter to each other.

Figure 8A:
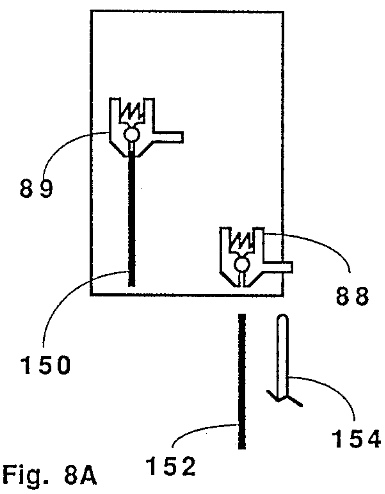
FIGS. 8A–8D show the operation of grippers mounted on the carriage for picking up diskettes.
Figure 8B:
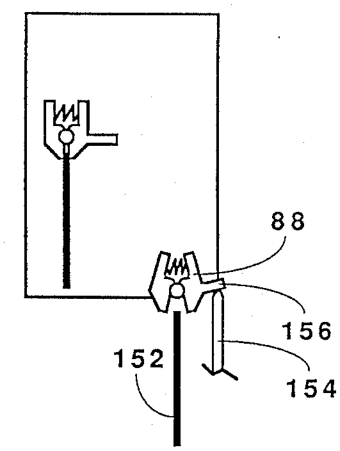
Figure 8C:
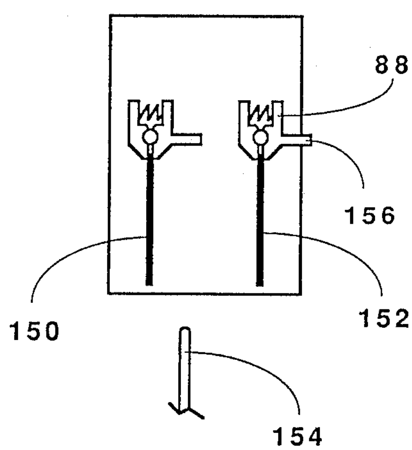
Figure 8D:
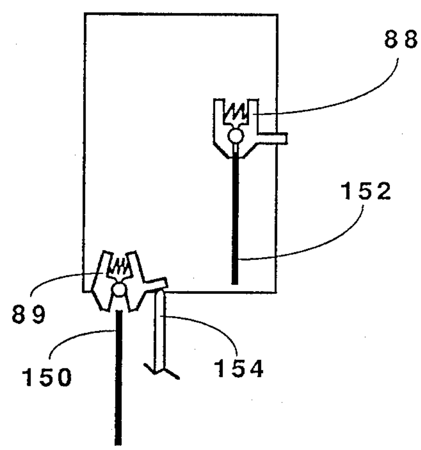

Moving the grippers up and down is not all that is required to insert or remove diskettes from the certifier drives. The grippers must also open and close at appropriate times. FIGS. 8A through 8D illustrate the process used to open and close the grippers. In FIG. 8A, gripper 89 is shown in the up position holding a new uncertified diskette 150. Gripper 88 is in the down position over a diskette 152 which has been recently certified. A gripper actuator rod 154 coupled to the certifier drive is shown in the down position to allow clearance for motion of the carriage. In FIG. 8B, the gripper 88 is lowered and the actuator rod 154 is raised to press on a lever arm 156 attached to gripper 88. This opens the gripper 88 in order to grasp the diskette 152. The actuator rod is then lowered, closing the gripper and the gripper is then raised to the up position as illustrated in FIG. 8C. The carriage is then moved so that gripper 89 is over the certifier drive where diskette 152 was removed. Then the gripper 89 is lowered and the actuator rod 154 is raised, thereby opening the gripper and placing the diskette 150 into the certifier.

Figure 9:
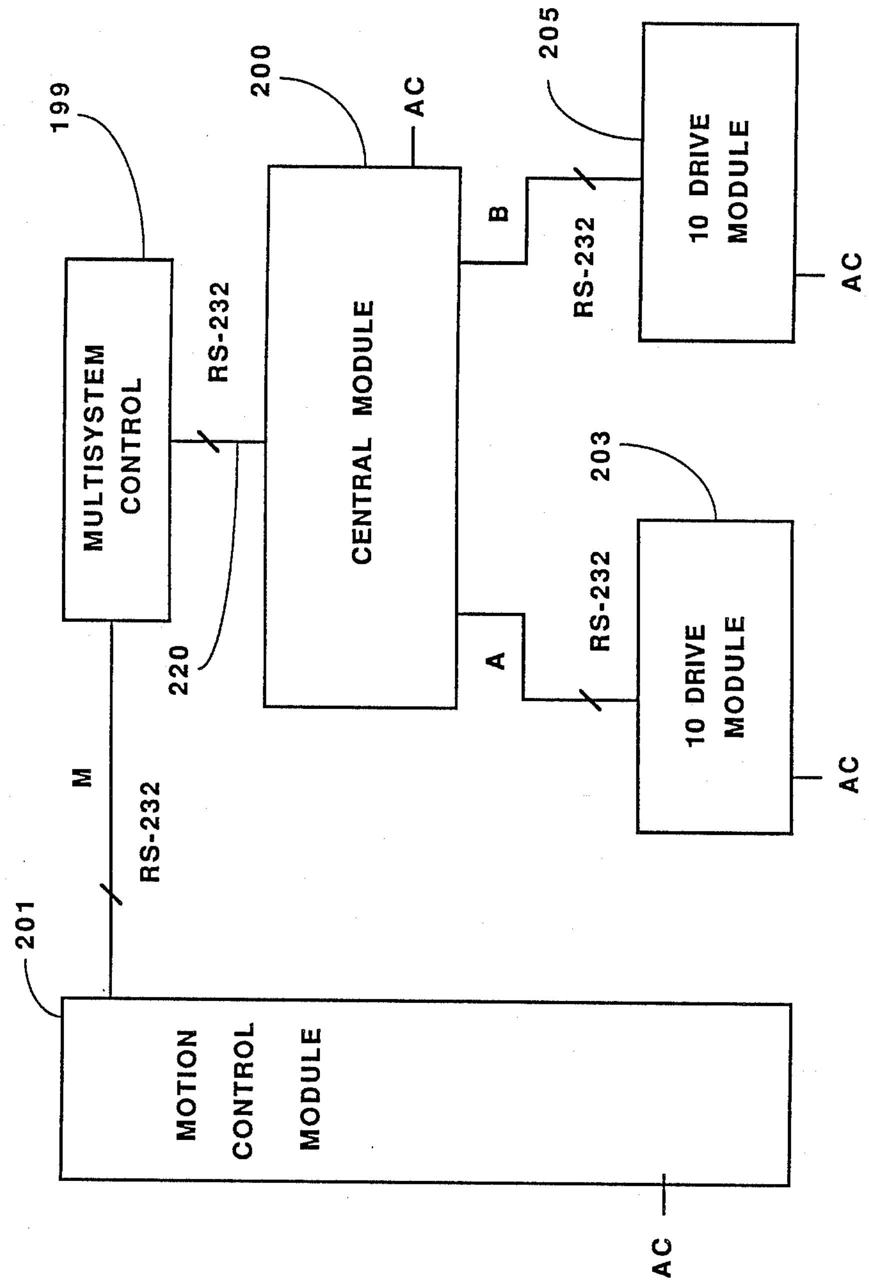
FIG. 9 is a electronic system block diagram for the second embodiment.

Shown in FIG. 9 is a system block diagram illustrating the general electrical configuration adopted for this second preferred embodiment. A central module 200 controls the entire electronics system for the apparatus which operates under the control of a master computer system 199 for multisystem control, e.g. an IBM PC. As indicated earlier, there are essentially three interdependent electromechanical systems which must be controlled. This control is provided through the central module by a motion control module 201 which controls the motions of carriage 21, and two identical ten-drive modules 203 and 205 which perform the certification operations and test procedures. Each of the modules 201, 203 and 205 communicate with the central module through an RS-232 link, typically operating at 9600 baud. Each of the modules 200, 201, 203 and 205 will be discussed in turn.

Figure 10:
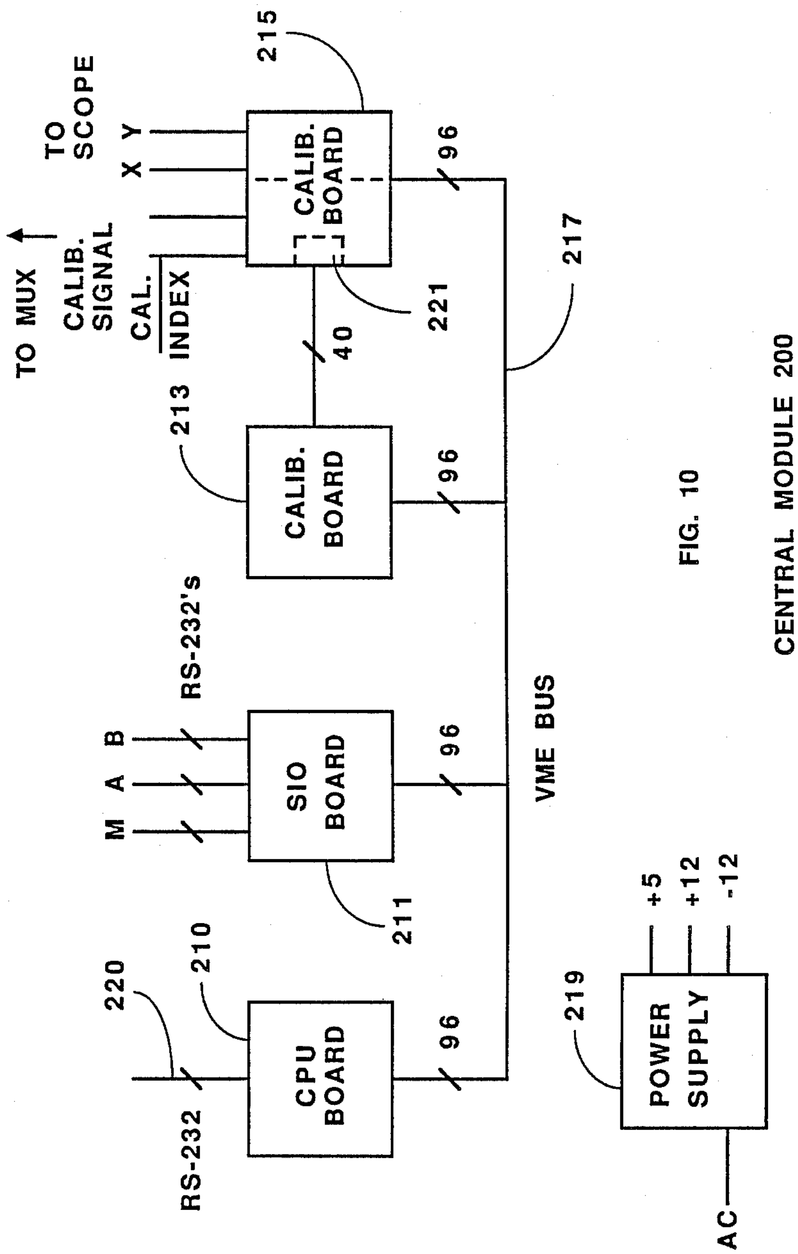
FIG. 10 is a block diagram of a central module for controlling operations of the electronic system.

FIG. 10 is a block diagram of the central module 200. It is made up of a CPU board 210 such as the Plessey CPU-1B, a serial I/O board 211 and a VME bus backplane 217. One link M of serial I/O board 211 connects to a motion control section, which controls all the mechanical handlers of the apparatus. Several 10-drive modules can be connected, limited by the size of the machine, the cycle time of the handler and the typical test time for each module.

If for example the cycle time of the handler is 10 seconds and the typical test time is 20 seconds, then 2 modules could be connected. But if the cycle time could be improved to 5 seconds then a maximum of 4 modules could be connected. The same would be true if the test time had increased to 40 seconds and the cycle time had remained at 10 seconds. If on the other hand the test time is only 10 seconds and the cycle time can not be improved, only one module could be connected. There is also a central power supply 219 for each of the boards 210 through 217. CPU board 210 communicates through an RS-232 link 220 to the master computer system 199 (not shown in FIG. 10) controlling the whole certification operation including the conveyor 19. CPU board 210 also controls the other boards 211, 213 and 215 of the central module 200 via the VME bus. It also communicates through SIO board 211 to other components in the system (see FIG. 9), the SIO board 211 providing three RS-232 asynchronous serial communication links. The calibration board 213 together with a high speed DAC section 221 of calibration board 215 is used to generate and simulate all types of signals required for certification. Calibration board 215 is also used to generate the X and Y deflection signals for an oscilloscope, in order to provide measurement data for diagnostic evaluation of the apparatus.

FIG. 11 shows a block diagram for a typical 10-drive module such as module 203. The module 203 includes two identical 5-drive units 223 and 225, each of which is typically made up of 5 commercially available floppy drives such as a Teac-55 series drive for 5¼ inch drives or such as a Teac-35 series drive for 3½ inch drives. Other sets of drives can be used even if they are not floppy drives such as tape drives or optical drives where a series a measurements and tests are to be performed. Also included, are identical multiplexor boards 227 and 229, one in each 5-drive unit for routing of control signals and analog signals to the appropriate destination. These multiplexor boards will be described in more detail later. Also included in the 10-drive module is a CPU board 231, similar to CPU board 210 of the central module 200, for controlling the 10-drive module and to communicate with the central module. Also provided are two identical analog boards 233 and 235, under control of CPU board 231, for performing the analog-type measurements required to determine track average amplitude, modulation, resolution, overwrite, drop-out levels, and extra pulse levels. A digital board 237 is used to generate the signals necessary to operate the floppy drives in the 5-drive units. These signals include drive select, side select, write data, write gate, step and direction, head load, and motor on. The digital board also performs peak shift measurements associated with the read signals from the disk drives. These signals are provided to the 5-drive units via a 34-conductor cable to both 5-drive units. The digital board 237, the analog boards 233 and 235, and the CPU board 231 are interconnected via a VME bus backplane 239. Also included is a separate power supply 241.

FIGS. 12A and 12B show a block diagram for the motion control module 201. The module includes a CPU board 243, e.g. a Plessy CPU-1B, for controlling the module functions and for communicating with the central module 200. The CPU board 243 is also tied to a motion control board 245 via a VME bus backplane 247. Motion control board 245 is shown in more detail in FIG. 12B which illustrates that the board 245 is made up of three sets of two motion control chips. One of these two chips in each set is chip 249 typically being a DM3000 motion chip available from GALIL for providing control of acceleration, velocity, and position for the motors, for example motor *128a*, which drives gripper 89. The other in the set is chip 251, typically a DM1200 motion chip available from GALIL for providing an encoder interface for encoder *128b* to measure the position of the motor *128a*, and provides an analog output signal to amplifier 253 in response to input control signals from chip 249. Signals from amplifier 235 then control pulse width modulated (PWM) amplifier 255, which in turn drives the motor 128. The other two sets of chips control the signals to motors *129a* and 138, and their respective encoders *129b* and 140. Limit switches 261, 263, and 265 are used to indicate a starting position for drive belts 98, 97, and 85 respectively, and provide this information to the DM3000 motion chips. A power supply 267 provides the power for the entire motion control module 201.

FIG. 13.0 shows a block diagram of calibration board 213, and Section 221 of calibration board 215. The purpose of the calibration board is to provide test signals for periodic calibration of all analog sections within each 5-drive unit. These test signals are provided to the multiplexor boards 407 of each 5-drive unit. A calibration index signal is provided on a calibration index line 310 which has the same timing as a drive index in order to fully simulate a drive signal. Also, a calibration signal is provided on a coaxial cable 309 which is used to simulate the various test procedures performed by the analog boards. For example, a signal can be generated having a known average signal amplitude, which can then be used to test the measurement errors of the analog boards, e.g. 235. Similarly, signals can be generated having other known characteristics such as drop outs, extra bits, or modulation, to provide the desired test signals. As illustrated, input control signals from VME-bus 217 are received by a VME-bus interface 271. Control line 301 sets up the multiplexor 273 to receive information from VME-bus interface 271 via address lines 303. Multiplexor 273 then routes that address information to RAM arrays 277 and 279. Amplitude information is stored in RAM array 277 via data lines 305 and frequency information is stored in RAM array 279 via data lines 307. Then control line 301 is toggled so that the address information for the two RAM arrays 277 and 279 is now being received from counter 275. For each address of the RAM array 279, a frequency value is input to adder 285. Adder 285 together with latch 287 and clock 291 provide a phase value to EPROM 289. EPROM 289 is a look-up table for 4096 values which provides a 12 bit input to multiplier 283. Also, EPROM 289 provides two signals to PAL 281 in order to increment counter 275 each time one cycle of a nine wave has been completed. Also, one bit of the frequency value output from RAM array 279 is input to PAL 281 to generate a reset signal for counter 275 each time a full sequence has been completed. Coincident with the reset signal, an output signal is provided by PAL 281 to an index driver 299, which simulates an index signal of disk drive. For each value output from the counter, RAM array 279 provides an amplitude value to multiplier 283 to modulate the sine signal generated by the EPROM 289. The output signals from the multiplier 283 are input to DAC 293 which is a high speed de-glitched digital to analog converter for providing an analog output signal. Since that analog output signal is discrete (in time) a low pass filter 295 is used to provide a continuous sine signal, i.e. without steps. Buffer 297 provides a low inpedance, high current, signal, in order to drive a coaxial cable 309 connected to the 5-drive units 223 and 225.

FIGS. 13.1–13.9 show the details associated with the block diagram 13.0. The details of VME-bus interface 271 is shown in FIGS. 13.1, 13.2 and 13.3. The details of multiplexor 273 and counter 275 is shown in FIG. 13.4. The details of RAM array 277 is shown in FIG. 13.5, and the details of RAM array 279 is shown in FIG. 13.6. The adder 285 and latch 287 are shown in FIG. 13.7, and the EPROM 289 is shown in FIG. 13.8. FIG. 13.9 corresponds to multiplier 283. PAL 281 and clock 291 are also illustrated in FIG. 13.1.

Section 221 of calibration board 215 which is functionally related to the calibration board 213, includes DAC 293, low pass filter 295, buffer 297 and index driver 299, which are physically located on the calibration board 215, and are all illustrated in FIG. 14.6.

Calibration board 215 is also made up of a display section which is illustrated in detail in FIGS. 14.0–14.5. FIG. 14.0 provides a block diagram of the structure. VME-bus interface 311 is illustrated in detail in FIGS. 14.1 and 14.2, 14.2 showing a database transceiver associated with the display section. FIG. 14.3 corresponds to a data buffer 313 for storing amplitude information, and FIG. 14.4 shows a counter 315 and address multiplexor 317 for providing address lines for the data buffer 313. FIG. 14.5 illustrates two identical DAC's 319 and 321 for providing the display X-Y signals. Clock 323 is also illustrated in FIG. 14.4.

The digital board 237 (see FIG. 11) is shown in block diagram form in FIG. 15.0. As illustrated, the digital board is made up of a VME-bus interface 331 which provides the selected information to be stored in latches 333. This stored information is then available to the drivers 337, write frequency generator 339, and peak-shift section 341. The drivers 337 provide the signals for drive select, side select, step and direction, head load and motor on. The write-frequency generator 339 provides the necessary signals for all frequencies required for the certifier tests. The peak-shift section 341 measures the time between two read-pulses and stores all counter values in a RAM for later data processing.

FIG. 15.1 shows the details of VME-bus 331. FIG. 15.2 illustrates latches 333, and FIG. 15.3 shows the write-frequency generator 339. The peak-shift section is illustrated in FIGS. 15.4–15.8, and the drivers 337 and input buffer 335 are illustrated in FIG. 15.9.

Shown in FIG. 16.0A, B and C is a block diagram of the analog board 233 (and 235). The analog board includes a VME-bus interface 351 and a track average amplitude (TAA) and modulation sections 386, a drop-out section 388, an overwrite section 390 and an extra pulse section 392. In TAA and modulation section 386, the incoming signal from a 5-drive unit, say 223, is routed to a peak-detector 355, the output signal of which is proportional to the peak amplitudes of the signal under test. That output signal is passed through a low pass filter 357 providing a 5 millisecond integration time as required by ANSI standards. That signal is then input to a multiplexor 359 which is controlled through the VME-bus interface by line 383. The output signal from the multiplexor 359 is then routed to a sample and hold circuit and ADC 361. In the overwrite section 390, input signals from the 5-drive unit 223 are received by an analog mixer 371, where the signal is mixed with a 64 KHz signal from an oscillator 369. If, for example, the incoming signal is at a frequency of 62.5 KHz, the ANSI standard, then the output signal from an adjacent low pass filter 373 (with a bandwidth of 3 KHz) will be at a frequency of 1.5 KHz, i.e. the difference signal, whereas the sum signal has been rejected by the low pass filter. The output signal from low pass filter 373 is then routed to an RMS detector 375 which provides a logarithmic output signal to multiplexor 359 so that its value can be digitized in sample and hold circuit and ADC 361 for input to CPU board 231. During the overwrite test, the first signal provided from the 5-drive unit has a frequency of 62.5 KHz (the 1F signal). This is followed by a 2F signal, i.e. at 125 KHz. Since both the difference and sum signals from mixer 371 are outside the bandwidth of the low pass filter 373 (125+64, 125−64) the signal measured by the RMS detector 375 is the residual 1F signal at 62.5 KHz. In the drop-out section 388, two input signals are provided by the analog buffer amplifier 363 to the drop-out comparator 367, one in phase, one out of phase. A reference signal is provided by DAC 365, which is compared in comparator 367 to determine if the positive half or the negative half of the signal from the buffer amplifier 363 is below the reference signal from the DAC 365. The signal from the comparator 367 then is input to an error detection section 353 which latches the signal if an error occurs. The extra pulse section 392 includes a buffer amplifier 377, a comparator 379 and a DAC 381, and operates nearly identically with drop-out section 388, except that the comparator is used to determine if an input signal is above a reference level provided by DAC 381.

Details of the VME-bus interface are illustrated in FIGS. 16.1 and 16.2. The peak-detector 355 is shown in FIG. 16.3, low pass filter 357 in FIG. 16.4. The oscillator 369, mixer 371, and low pass filter 373 are shown in FIG. 16.5. The RMS detector is illustrated in FIG. 16.6. The multiplexor 359, and the sample and hold and ADC 361 are illustrated in FIG. 16.7. The buffer amplifier 363 is shown in FIG. 16.8, and the DAC 365 and comparator 367 are shown in FIG. 16.9. FIG. 16.10 shows buffer amplifier 377, and FIG. 16.11 shows comparator 379 and 381. The error detector section 353 is shown in FIG. 16.12.

A block diagram of a 5-drive unit, say unit 223, is shown in FIG. 17.0. The unit has 5 disk drives, 401 through 405, and corresponding preamplifiers 402 through 406. A multiplexor board 407 routes signals from the digital board 237 to the appropriate disk drive when the drive select lines to all disk drives are inactive. Then the calibration signal on line 309 is routed to all sections of the analog board for testing. Signals from the preamplifiers 402 through 406 are routed by multiplexor board 407 to the analog board 233 or 235 for the certification test measurements. Calibration signals and calibration index signals from calibration board 215 are routed by multiplexor board 407 to the analog boards 233 and 235.

FIG. 17.1 is a detailed schematic of one of the preamplifiers 402 through 406. FIGS. 17.2 and 17.3 show details of the multiplexor board 407.

Control Concept

Under the ANSI standards for disk certification, specific tests are required, for example, average signal amplitude (TAA), resolution, overwrite, modulation, missing bit (hereinafter drop out), and extra bit (hereinafter extra pulse). As a practical matter, the tests for missing bits and extra bits are made over the entire active surface of the disk, whereas, the other measurements are made only on the inner or outer track, and hence take much less time to perform. Therefore, in the ensuing discussion, these latter tests will be ignored with regard to matters concerning machine throughput and multiplexing.

Figure 18:
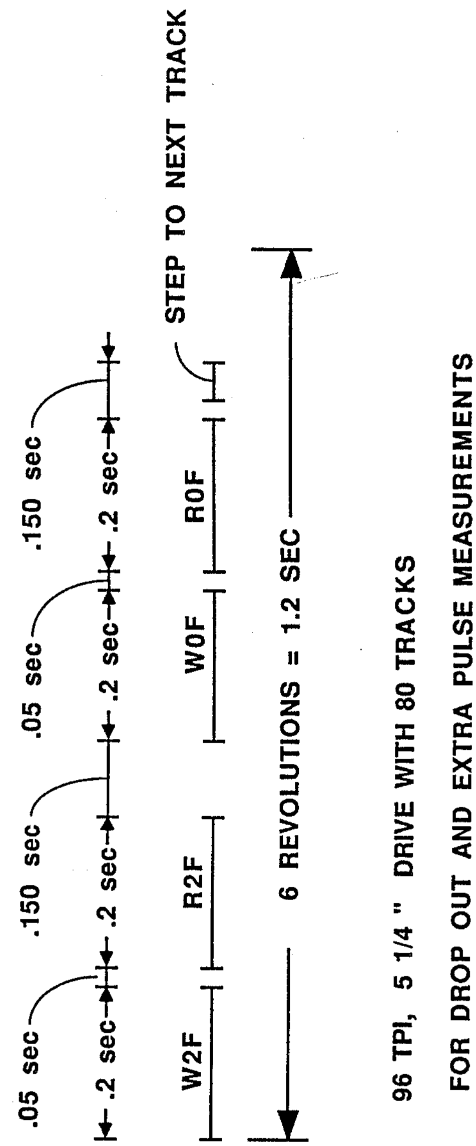
FIG. 18 shows a timing sequence for typical prior art certifiers.

Shown in FIG. 18 is a time sequence of events showing the typical times in the prior art required for drop out and extra pulse measurements. As illustrated, these tests are performed by first writing on the disk at a frequency 2F (250,000 ftps.), the measurement being designated as W2F, and requiring 200 ms to perform. The drive is then switched to the read mode and allowed to settle for 50 ms before the disk is read. Reading of the disk is performed in 200 ms, that time being shown in FIG. 18 as R2F. The calculations of TAA, drop out, and modulation then are performed within about 5 ms of the end of the read operation. The system then waits for the next index, 150 ms after the end of the read operation, and then performs an erase operation WOF, for 200 ms for the track under test. The system is then switched to the read mode, and allowed to settle for 50 ms before the read operation, ROF, is performed to determine if any extra pulses were present. The time required for ROF is 200 ms. If no errors occurred on that track, the system steps to the next track and waits for an index, the total time between ROF and the beginning of the next track being 150 ms. Thus, an entire test procedure requires a total of 1.2 seconds per track, or six revolutions at 300 RPM. On an 80 track disk, the total certification procedure then requires 96 seconds. Allowing for the other tests to be performed the total test time is approximately 100 seconds.

Using this prior art approach for certification measurements is very inefficient in the use of the hardware and drive electronics. Generally, in the prior art the hardware required for W2F, R2F, WOF, and ROF, is all independent and hence when one function is being performed, the remainder of the hardware is idle. Similarly, the CPU only sees substantial use during the R2F operation.

Figure 19:
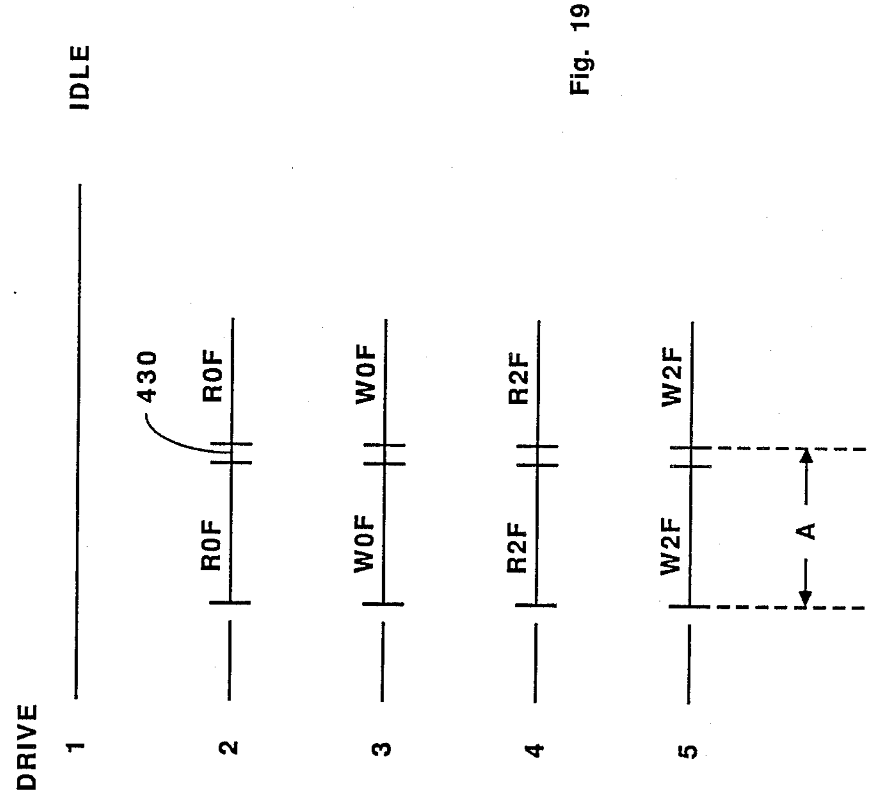
FIG. 19 shows operations of a 5-drive unit according to the invention during a time interval.

In the method of the invention, instead of performing sequential operations of W2F, R2F, WOF, and ROF, on each track before proceeding to the next track, the entire disk is first written at 2F, track by track, then it is read, track by track, R2F, and the TAA information for each track is stored. The entire disk is then erased, WOF, and then the entire disk is read, ROF, to identify extra pulses. This is illustrated schematically in FIG. 19 for the 5-drive unit of the invention, the figure representing the configuration of each drive in the unit during a 210 ms time frame A. During that time frame, drive 1 is idle, ready for exchange of diskettes. Drive 2 is performing a read function after erase, ROF, for a 200 ms time period for a particular track, and executing a step 430 of 10 ms, for a total time of 210 ms. Drive 3 is performing an erase function, WOF, and executing a step to the next track. Drive 4 is performing a read function after a write at the frequency 2F, followed by a step to the next track; and drive 5 is performing a write function at the frequency 2F followed by a step to the next track. Note that all four active drives step simultaneously.

Figure 20:
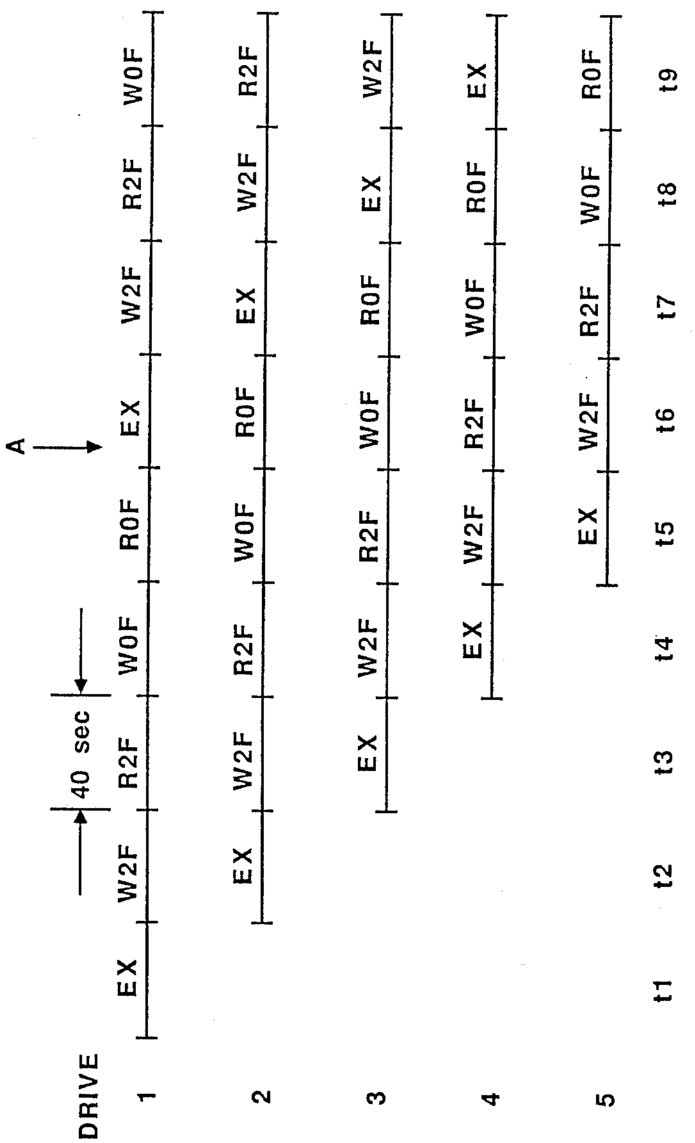
FIG. 20 shows a start up sequence for a 5-drive unit according to the invention.

FIG. 20 illustrates the overall concept of the process of the invention for the 5-drive unit, beginning from the initial loading of the first disk drive, drive 1. During the first time period t1, drive 1 is loaded with a first diskette D(1,1). During the second time period, t2, the drive 1 writes the entire first disk at a frequency 2F, and drive 2 is loaded with its first diskette D(2,1). During the third time period, the drive 1 reads the entire disk D(1,1), the drive 2 writes the entire disk D(2,1) at 2F, and drive 3 is loaded with a diskette D(3,1). During the fourth time period t4, the D(1,1) is erased, D(2,1) is read, D(3,1) is written at 2F, and drive 4 is loaded with a diskette D(4,1). During time t5, D(1,1) is read for extra pulses, D(2,1) is erased, D(3,1) is read for drop outs, D(4,1) is written at 2F, and drive 5 is loaded with a diskette D(5,1). During the next period t6, D(1,1) is removed from drive 1 and a new diskette D(1,2) is loaded into drive 1. Also, D(2,1) is read for extra pulses, D(3,1) is erased, D(4,1) is read for drop outs, and D(5,1) is written at 2F. As illustrated this process is then repeated as often as desired using 210 ms as the time per track, for each of the functions W2F, R2F, WOF, and ROF. The minimum cycle time is 210 ms times the number of tracks, 160, or 33.6 seconds for any one of these functions for the entire disk when using an unmodified double-sided drive. Allowing for the additional measurements, TAA, modulation, resolution, and overwrite measurements, a total cycle time for each function can be conservatively set for 40 seconds, i.e. t1-t9 are each 40 seconds long. Hence, the total time for certification of a disk is 200 seconds. In this arrangement, the actual electronic hardware required for 5 drives is less than that needed for systems using modified double-sided drives. For example, the 5-drive unit requires only one analog board, one CPU board, a multiplexor board, and one digital board, whereas a modified double-sided drive as used in the prior art requires one equivalent CPU board, one equivalent digital board, and two equivalent analog boards. The cost of the prior art double-sided single drive system and the cost of the 5-drive unit of the present invention are substantially equal, so that the cost per diskette using the apparatus of the invention is reduced by 60%. That cost reduction is further improved as the system is scaled up to the 10-drive module since the 10-drive module requires only one CUP board, one digital board, two multiplexor boards, 2 analog boards, and 10 unmodified drives. This saves using one CPU and one digital board. Furthermore, as the system is scaled up even further still, only one CPU is required to handle the entire system depending on the processing speed of the CPU.

Software

As described earlier, the central module 200 provides the necessary command functions to implement the automatic control required to operate the system by means of the CPU board 210, hereinafter the host computer. In addition, each 10-drive module includes a CPU board 231, hereinafter the certifier slave CPU's, for control of each individual certifier disk drive. The software necessary to accomplish these control functions is described below in pseudo code. However, for simplicity, the software is described first in terms of only one 5-drive unit. Then the changes necessary to implement the software for a 10-drive module is described.

```
Host (Central Module)
(1)      Check communication links with slave CPUs.
Comment: Slave CPU's are the CPU's in each
         5-drive unit.
(2)      Check communication link with motion CPU.
            set BUSYFLG = 0
(3)      Wait for user input to start process if
         (command = START)
            Yes: set STOPFLG = 0, goto 4
            No: goto 3)
(4)      Send start command to slave CPU's
(5)      Check for requests from slave CPU's if
         (command = LOAD)
            Yes: goto 8)
(6)      Check for user input if (command = STOP)
            Yes: set STOPFLG = 1
(7)      Check for motion complete if (command = DONE)
            Yes: set BUSYFLG = 0
            No: goto 5)
(8)      if (BUSYFLG = 0)
            Yes: Send LOAD command to motion CPU
            set BUSYFLG = 1
            if (STOPFLG = 1)
               Send STOP command to slave CPU
            if (STOPFLG = 0)
               Send CONTINUE command to slave
            No: goto 5)
(9)      if (BUSYFLG = 1)
               Send PAUSE command to slave CPU
(10)     Check for motion complete
         if (command = DONE)
            Yes: set BUSYFLG = 0
                 goto 8)
            No:  goto 10)
CERTIFIER SLAVES
(1)      Home each drive and check good status.
(2)      Wait for command from Host
         if (command = CHECK)
            Send OK command to host
Comment: CHECK causes communication links to be
         checked. See Step 1, HOST program.
         if (command = START)
            Yes: goto 3)
            No: goto 2)
(3)      set SEQ# = EXC# = STOPFLG = 0
Comment: Step 3 is an initialization step. SEQ#
         is the number of diskettes being
         processed in the module. EXC# is the
         drive position where a disk exchange
         must take place. STOPFLG gets set when a
         stop command is received from the HOST,
         and the process of clearing out all the
         diskettes from the module begins.
(4)      set SIDE = DIRECTION = 0
         set TRKMAX = 160
         set TRK =1
Comment: SIDE and DIRECTION correspond to the
         side of the disk being certified and the
         direction to be taken by the magnetic
         transducer in the certifier drive when
         stepping from track to track. TRKMAX is
         the number of tracks to be certified.
         TRK is the track number.
(5)      Request host to load drive = EXC#
         that is:
            Send LOAD command to host
            if (SEQ# > = 5)
               Send EXC#, SORT#(EXC#) to host
            if (STOPFLG = 0)
               Send EXC# to host
            Send end of command (EOC) to host
Comment: if SEQ# is greater than or equal to 5,
         the certifier is not in the start up
         mode, so the HOST CPU needs information
         regarding which drive to unload, which
         drive to load, and pass/fail information
         on the unloaded diskette so that it can
         be sorted into the proper slot of the
         conveyor.
```

-continued

```
(5)      Receive host response (command)
         if (command = CONTINUE)
            Yes: goto 7)
         if (command = PAUSE)
            Yes: goto 6)
         if (command = STOP)
            Yes: STOPFLG = 1
            STOPCOUNTER = 0
            goto 7)
            No: goto 6)
(7)      EXC# = SEQ# mod 5
         R0F# = (SEQ# + 1) mod 5
         W0F# = (SEQ# + 2) mod 5
         R2F# = (SEQ# + 3) mod 5
         W2F# = (SEQ# + 4) mod 5
         DRVREG = DRVTBL (EXC#)
Comment: Step 7 sets function values for all 5
         drives. These values designate which
         drive is to perform the particular
         function described, e.g. ROF# designates
         the drive number performing the read
         after erase step.
```

The drive register DRVREG is set according to a drive table as a function of the exchange number, DRVTBL(EXC#). That table is reproduced below. The left half of the table indicates the bit pattern. The right half shows the function associated with each drive.

| | Drive Selects | | | | | Function | | | | |
|---|---|---|---|---|---|---|---|---|---|---|
| EXC# | 1 | 2 | 3 | 4 | 5 | 0 | 1 | 2 | 3 | 4 |
| 0 | 0 | 1 | 1 | 1 | 1 | EX | R0F | W0F | R2F | W2F |
| 1 | 1 | 0 | 1 | 1 | 1 | W2F | EX | R0F | W0F | R2F |
| 2 | 1 | 1 | 0 | 1 | 1 | R2F | W2F | EX | R0F | W0F |
| 3 | 1 | 1 | 1 | 0 | 1 | W0F | R2F | W2F | EX | R0F |
| 4 | 1 | 1 | 1 | 1 | 0 | R0F | W0F | R2F | W2F | EX |

```
(7a)     TAA(R2F#,0) = 3200
         CALL TRACK(1)
         CALL TRKCALC(1)
         TAA(R2F#,0) = TAA (R2F#,1)
Comment: Step 7a sets up values for track 1
7b       MODERR#(R2F#) = MODTRK#(R2F#) = 0
         DOTRK#(R2F#) = EPTRK#(R0F#) = 0
Comment: Step 7b resets errors. DOTRK#(R2F#) is
         the last track number for that
         particular read number where a drop out
         error has occurred. EPTRK#(R0F#) is the
         last track number for that particular
         read number where an extra pulse has
         occurred. Similarly, MODTRK#(R2F#) is
         the last track where a modulation error
         has occurred for that read number, and
         MODERR(R2F#) is the value of the
         modulation error for that read number
         and track.
(7c)     TRK# =1
         Trkloop:
            CALL TRACK(TRK#)
            if(TRK# < TRKMAX)
            CALL STEP(TRK#)
            CALL TRKCALC(TRK#)
            TRK# = TRK# + 1
            if(TRK# (= TRKMAX), goto Trkloop:
Comment: Step 7c processes all tracks of the disk
(7d)     if((MODTRK#(R0F#) +DOTRK#(R0F#) +EPTRK#
         (R0F#))0)
            set: SORT#(R0F#) = 1 /* Pass */
         if ((MODTRK# (R0F#) + DOTRK#(R0F#) + EPTRK#
         (R0F#)) <> 0)
            set: SORT#(R0F#) = 2 /* Fail */
Comment: Step 7d sorts the disk into good or
         failed.
(8)      SEQ# = SEQ# +1
         if (STOPFLG = 1)
         set: STOPCOUNTER = STOPCOUNTER +1
         if (STOPCOUNTER < 5)
            goto 4)
         if (STOPCOUNTER = 5)
         Send STOP command to host
            goto 2)
Comment: Step 8 processes the next disk.
```

-continued

TRACK ROUTINE

```
TRACK(TRK#)
STAA = MAX = DOF = EPF = 0 /* Initialize track
values */
DOL = TAA(R2F#,TRK#-1) * LIMDO /* set drop-out
comparator */
EPL = TAA(R0F#,TRK#) * LIMEP /* set extra pulse
comparator */
COUNT = 2048 /* Sample counter set at maximum */
CTRLREG = 3 /* Start write 2F */
Comment:  CTRLREG corresponds to setting a control
          register, setting a 0 is stop writing,
          setting a 1 is an erase, setting a 2 is
          a write 1F, setting a 3 is a write 2F,
          and a 4 is to write a special peak shift
          pattern.
Adc:
     ADCVAL = adc /* read ADC */
Comment:  adc is the value of the output signal
          from A to D converter 361.
     STAA = STAA + ADCVAL /* increment cumulative
     taa */
     if(ADCVAL > MAX)
     set: MAX = ADC
Doep:
     DOEPVAL = doep /* read error latch */
Comment:  doep is the value of the signal at the
          output terminals of the error latch
          contained in the error detection section
          353 and includes 2 bits corresponding to
          the extra bit signal and 2 bits
          corresponding to the drop out signal.
     if(DOEPVAL <> 0)
     Yes:  if ((DOEPVAL AND 3) <> 0)
           set: DOF = 1
           if ((DOEPVAL and 12) <> 0)
           set: EPF = 1
Comment:  AND in Doep is a logical and to pick off
          the two bits corresponding to dropout
          or extra bit signals. D0F and EPF are
          local flags used only in the TRKCALC
          routine.
DELAY(x)  /* programmed delay for 97.7
          microseconds */
Comment:  x must be set according to processor
          speed such that the total loop time
          through Adc and Doep will be equal to
          200 ms/2048.
COUNT = COUNT - 1
if(COUNT > (0))
Yes: goto adc:
No: CRTLREG = 0 /* Stop write */
RETURN
```

TRKCALC ROUTINE

```
TRKCALC(TRK#)
COUNT =2048
TAA(R2F#, TRK#) = STAA / COUNT
MOD(R2F#, TRK#) = 100 * (MAX - TAA) / TAA
if(MOD(R2F#, TRK#) > MODLIM)
     Yes:  MODERR#(R2F#) = MOD(R2F, TRK#)
           MODTRK#(R2F#) = TRK#
DOFLG(R2F#, TRK#) = DOF
if(D0F = 1)
     Yes:  DOTRK#(R2F#) = TRK#
EPFLG(R2F#, TRK#) = EPF
if(EPF = 1)
     Yes:  EPTRK#(R0F#) = TRK#
RETURN
```

STEP ROUTINE

```
STEP(TRK#)
if(TRK# > TRKMAX/2)
     Yes:  SIDE = 1
           DIRECTION = 1
Comment:   up to TRKMAX/2 the drive operates in one
           direction on the first side and after
           TRKMAX/2 in the other direction on the
           other side.
if(TRK# <> (TRKMAX/2 + 1))
     Yes:  Issue step command
RETURN
```

Changes for two 5-drive units

The following changes must be made to the software to accommodate two drive units.

TRKCALC ROUTINE

```
TRKCALC(TRK#)
COUNT = 2048
TAA(1,R2F#,TRK#) = STAA(1)/COUNT
MOD(1,R2F#,TRK#) = 100 + (MAX(1)-TAA)/TAA
if(MOD(1,R2F#,TRK#)> MODLIM)
          set:  MODERR#(1,R2F#)= MOD(1,R2F#,TRK#)
                MODTRK#(1,R2F#) = TRK#
DOFLG(1,R2F#,TRK#) = D0F(1)
if(DOF(1) = 1)
          set:  DOTRK#(1,R2F#) = TRK#
EPFLG(1,R0F#,TRK#) = EPF(1)
if(EPF(1) = 1)
          set:  EPTRK#(1,R2F#) = TRK#
same for UNIT #2
RETURN
```

TRACK ROUTINE

```
TRACK(TRK#)
STAA(1) = MAX(1) = DOF(1) = EPF(1) = 0
STAA(2) = MAX(2) = D0F(2) = EPF(2) = 0
DOL(1) = TAA (1, R2F#,TRK# -1) * LIMDO
DOL(2) = TAA (2, R2F#,TRK# -1) * LIMDO
EPL(1) = TAA (1,R0F#,TRK#) * LIMEP
EPL(2) = TAA (2,R0F#,TRK#) * LIMEP
COUNT = 2048
CTRLREG = 3
ADC LOOP:
     ADCVAL(1) = adc(1)
     STAA(1) = STAA(1) + ADCVAL(1)
     if(ADCVAL(1) > MAX(1))
     set: MAX(1) = ADCVAL(1)
     ADCVAL(2) = adc(2)
     STAA(2) = STAA(2) + ADCVAL(2)
     if(ADCVAL(2) > MAX(2))
     set: MAX(2) = ADCVAL(2)
     DOEPVAL(1)= doep(1)
     if(DOEPVAL(1) <> 0)
     Yes:  if(DOEPVAL(1) and 3 <> 0)
           Yes: DOF(1) = 1
           if(DOEPVAL(1) and 12 <> 0)
           Yes: EPF(1) = 1
     DOEPVAL(2) = doep(2)
     if(DOEPVAL(2) <> 0)
     Yes:  if(DOEPVAL(2) and 3 <> 0)
           Yes: DOF(2) = 1
           if(DOEPVAL(2) and 12 <> 0)
           Yes: EPF(2) = 1
     DELAY (x)
     COUNT = COUNT - 1
     IF (COUNT > 0)
     Yes: goto adc loop:
     CTRLREG = 0
RETURN
Comment:   If two (or more) 5-drive units are
           controlled from the same CPU and digital
           board the following changes will occur:
           All active drives will step together.
           All tables and values have now 2 or more
           dimensions.
           In the track routine, ADC and DOEP will
           be done for each 5-drive unit in
           sequence. DELAY (x) will be readjusted
           so that the time remains at 200 ms/2048 =
           97.66 microsec. The number of 5-drive
           units that can be run by a single CPU is
           a function of the processing speed of
           the CPU.
```

CERTIFIER SLAVES

```
           Changes are also needed in the certifier
           slave routine.
For example, step (5) becomes:
Send load command to HOST
if(SEQ# > 5)
Yes: Send  1,EXC#,SORT#(1,EXC#)
           2,EXC#,SORT#(2,EXC#)
if(STOPFLG = 0)
Yes: Send  1,EXC#
           2,EXC#
```

-continued

```
Send end of command (EOC)
Also, step (7a) becomes:
TAA(1,R2F#,0) = 3200
TAA(2,R2F#,0) = 3200
      TAA(1,R2F#,0) = TAA(1,R2F#,1)
      TAA(2,R2F#,0) = TAA(2,R2F#,1)
Also, step (7b) becomes:
MODERR#(1,R2F#) = MODTRK#(1,R2F#) = 0
MODERR#(2,R2F#) = MODTRK#(2,R2F#) = 0
DOTRK#(1,R2F#) = EPTRK#(1,R2F#) = 0
DOTRK#(*2,R2F#) = EPTRK#(2,R2F#) = 0
Also, step (7d) becomes:
if((MODTRK#(1,R0F#)+DOTRK#(1,R0F#)+
EPTRK#(1,R0F#))
= 0
set: SORT#(1,R0F#) = 1
if((MODTRK#(2,R0F#)+DOTRK#(2,R0F#)+
EPTRK#(2,R0F#))
= 0
set: SORT#(2,R0F#) = 1
if((MODTRK#(1,R0F#)+DOTRK#(1,R0F#)+
EPTRK#(1,R0F))
= 0
set: SORT#(1,R0F#) = 2
if((MODTRK#(2,R0F#)+DOTRK#(2,R0F#)+
EPTRK#(2,R0F#))
= 0
set: SORT#(2,R0F#) = 2
```

Those skilled in the art will understand that the method of the invention can be extended to other combinations of tests sometimes required for certification. For example, if only drop out tests were to be performed, the certifier system would be organized in groups of 3-drive units, so that at any one time, the operations of the various drives of the 3-drive unit would be to write at 2F in one drive, read at 2F in a second drive, and exchange in a third drive, each such read and write operation being performed for the entire disk, as in the second preferred embodiment, rather than one track at a time as in the prior art. Similarly, if certification required track by track tests of peak shift, then the certifier would be expanded to 7-drive units, the two additional drives corresponding to the additional functions of writing at 3F and reading at 3F, 3F being the DB6D data pattern in hexadecimal notation.

Also, those skilled in the art will understand that the principles of the method can be applied to duplication systems, since the duplication operation can also be done by writing the entire disk and then verifying for the entire disk, rather than writing a track and verifying that track before writing the next track as is presently done in the art. Due to the fact that three operations are required, write, read, and exchange, a duplication system according to the method of the invention would be organized in 3-drive units. Using substantially the same electronics as for a standard duplication system, the method of the invention will provide approximately twice the throughput.

What is claimed is:

1. A method of performing a sequence of operations on magnetic disks having plurality of tracks in an apparatus having at least 5 disk drives, comprising the steps of:

during a first time interval t1, inserting a first disk into a first drive;

during a second time interval t2 following t1, writing a 2F signal onto all tracks of said first disk, and inserting a second disk into a second disk drive;

during a third time interval t3 following t2, reading all tracks of said first disk to provide a first disk read 2F signal, writing a 2F signal onto all tracks of said second disk, and inserting a third disk into a third drive;

during a fourth time interval t4 following t3, erasing all tracks on said first disk, reading all tracks of said second disk to provide a second disk read 2F signal, writing a 2F signal onto all tracks of said third disk, and inserting a fourth disk into a fourth drive; and during a fifth time interval t5 following t4, reading said first disk to provide a first disk read 0F signal, erasing all tracks of said second disk, reading all tracks of said third disk to provide a third disk read 2F signal, writing a 2F signal onto said fourth disk, and inserting a fifth disk into a fifth drive.

2. The method of claim 1 comprising the step during a sixth time interval t6 following t5 of exchanging said first disk for a sixth disk, reading all tracks of said second disk to provide a second disk read 0F signal, erasing all tracks of said third disk, reading all tracks of said fourth disk to provide a fourth disk read 2F signal, and writing a 2F signal into said fifth disk; and testing for drop out and extra pulses on said first disk.

3. The method of claim 2 further comprising the steps of:

during a seventh time interval t7 following t6, writing a 2F signal on all tracks of said sixth disk, exchanging said second disk for a seventh disk in said second drive, reading all tracks of said third disk to provide a read 0F signal, erasing said fourth disk, and reading said fifth disk to provide a read 2F signal; and testing for drop out and extra pulses on said second disk.

4. An apparatus for performing analog operations on at least 5 disk drives comprising:

drop out detection means, hereinafter DO detection means, for detecting missing bits in a first recorded signal, said DO detection means having a DO signal input line for receiving said first recorded signal;

track average amplitude and modulation means, hereinafter TAA/MOD means, for measuring average signal amplitude and modulation of said first recorded signal, said TAA/MOD means having a TAA/MOD signal input line for receiving said first recorded signal;

extra pulse detection means, hereinafter EP detection means, for detecting extra bits in a second signal resulting after said first recorded signal has been erased, said EP detection means having an EP signal input line for receiving said second signal;

write 2F and write gate generator means, hereinafter W2F/OF generator means, for providing write frequency signals and a write gate signal, said W2F/0F generator having a W2F output signal line for providing a write 2F signal and having a write gate output signal line for providing a write gate signal, multiplexor means for providing a write zero F signal, said multiplexor means having a W0F output signal line for providing said write zero F signal;

said multiplexor means also for coupling said disk drives to said DO signal input line, to said TAA/MOD signal input line, to said EP signal input line, to said W2F output signal line, to said gate output signal line, and to said W0F output signal line according to the following schedule:

during a time interval t1, coupling a first drive to said EP signal input line, coupling a second drive to said gate output signal line and to said WOF output signal line, coupling a third drive to said TAA/-MOD input signal line and to said DO signal input line and coupling a fourth drive to said W2F output signal line and to said gate output signal line;

during a time interval t2 after t1, coupling said second drive to said EP signal input line, coupling said third drive to said W0F output signal line and to said gate output signal line coupling said fourth drive to said TAA/MOD input signal line and to said DO signal input line, and coupling a fifth drive to said W2F output signal line and to said gate output signal line;

during a time interval t3 after t2, coupling said first drive to said W2F output signal line and to said gate output signal line, coupling said third drive to said EP signal input line, coupling said fourth drive to said W0F output signal line and to said gate output signal line, and coupling said fifth drive to said TAA/MOD signal input line and to said DO signal input line;

during a time interval t4 after t3, coupling said first drive to said TAA/MOD signal input and to said DO signal input line coupling said second drive to said W2F output signal line and to said gate output signal line, coupling said fourth drive to said EP signal input line, and coupling said fifth drive to said W0F signal output line and to said gate output signal line;

during a time interval t5 after t4, coupling said first drive to said W0F output signal line and to said gate output signal line, coupling said second drive to said TAA/MOD signal input line and to said DO signal input line, coupling said third drive to said W2F output signal line and to said gate output signal line, and coupling said fifth drive to said EP input signal line;

computer means for controlling said multiplexor and for causing said multiplexor to repeat said schedule N times, where N is an integer greater than zero.

* * * * *